United States Patent
Nakai et al.

(10) Patent No.: US 9,496,439 B2
(45) Date of Patent: Nov. 15, 2016

(54) POLYESTER FILM, BACK SHEET FOR SOLAR CELL, AND SOLAR CELL MODULE

(71) Applicant: FUJIFILM Corporation, Tokyo (JP)

(72) Inventors: Shinichi Nakai, Shizuoka (JP); Shin Ozawa, Shizuoka (JP); Maki Mifune, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 277 days.

(21) Appl. No.: 14/498,202

(22) Filed: Sep. 26, 2014

(65) Prior Publication Data

US 2015/0013766 A1 Jan. 15, 2015

Related U.S. Application Data

(63) Continuation of application No. PCT/JP2013/059690, filed on Mar. 29, 2013.

(30) Foreign Application Priority Data

Mar. 29, 2012 (JP) ................................. 2012-077648
Sep. 24, 2012 (JP) ................................. 2012-209848
Mar. 25, 2013 (JP) ................................. 2013-062701

(51) Int. Cl.
*B32B 27/06* (2006.01)
*B32B 27/08* (2006.01)
(Continued)

(52) U.S. Cl.
CPC .......... *H01L 31/0487* (2013.01); *B32B 27/06* (2013.01); *B32B 27/08* (2013.01); *B32B 27/18* (2013.01); *B32B 27/20* (2013.01); *B32B 27/32* (2013.01); *B32B 27/36* (2013.01); *C08G 63/12* (2013.01); *C08G 63/137* (2013.01);
(Continued)

(58) Field of Classification Search
None
See application file for complete search history.

(56) References Cited

U.S. PATENT DOCUMENTS

2011/0224385 A1\* 9/2011 Shoji .................... C07D 273/08
525/437
2012/0302676 A1\* 11/2012 Oya .......................... C08J 5/18
524/89

FOREIGN PATENT DOCUMENTS

| JP | 2000-071405 A | 3/2000 |
| JP | 2000-302892 A | 10/2000 |

(Continued)

OTHER PUBLICATIONS

International Search Report issued in PCT/JP2013/059690 on May 21, 2013.
(Continued)

*Primary Examiner* — Vivian Chen
(74) *Attorney, Agent, or Firm* — Jean C. Edwards, Esq.; Edwards Neils LLC

(57) ABSTRACT

The invention provides a polyester film including: a polyester substrate; and a layered portion that is disposed on at least one surface of the polyester substrate and has an elastic modulus of from 5 MPa to 800 MPa, a ratio of a peak intensity at 988 $cm^{-1}$ that is observed by subjecting a surface of the polyester substrate to infrared spectroscopy to a peak intensity at 1410 $cm^{-1}$ that is observed by subjecting a surface of the polyester substrate to infrared spectroscopy satisfying the following Inequality (I):

0.010≤(peak intensity at 988 $cm^{-1}$)/(peak intensity at 1410 $cm^{-1}$)≤0.040   (I).

16 Claims, 6 Drawing Sheets

(51) Int. Cl.

| | | |
|---|---|---|
| *B32B 27/18* | (2006.01) | |
| *B32B 27/20* | (2006.01) | |
| *B32B 27/32* | (2006.01) | |
| *B32B 27/36* | (2006.01) | |
| *C08G 63/12* | (2006.01) | |
| *C08G 63/137* | (2006.01) | |
| *C08G 63/16* | (2006.01) | |
| *C08G 63/199* | (2006.01) | |
| *C08L 67/02* | (2006.01) | |
| *C08K 3/04* | (2006.01) | |
| *C08K 3/22* | (2006.01) | |
| *C08K 5/29* | (2006.01) | |
| *C08K 5/34* | (2006.01) | |
| *C08K 5/3442* | (2006.01) | |
| *C09D 123/00* | (2006.01) | |
| *H01L 31/048* | (2014.01) | |
| *H01L 31/049* | (2014.01) | |
| *C08K 5/00* | (2006.01) | |
| *C08K 3/00* | (2006.01) | |

(52) U.S. Cl.
 CPC ........... *C08G 63/16* (2013.01); *C08G 63/199* (2013.01); *C08K 3/0033* (2013.01); *C08K 3/04* (2013.01); *C08K 5/005* (2013.01); *C08K 5/29* (2013.01); *C08K 5/34* (2013.01); *C08K 5/3442* (2013.01); *C08L 67/02* (2013.01); *C09D 123/00* (2013.01); *H01L 31/048* (2013.01); *H01L 31/049* (2014.12); *B32B 2255/00* (2013.01); *B32B 2255/26* (2013.01); *B32B 2307/50* (2013.01); *B32B 2367/00* (2013.01); *B32B 2457/00* (2013.01); *B32B 2457/12* (2013.01); *C08K 2003/2241* (2013.01); *Y02E 10/50* (2013.01); *Y10T 428/31786* (2015.04); *Y10T 428/31797* (2015.04)

(56) References Cited

FOREIGN PATENT DOCUMENTS

| JP | 2002-160721 A | * | 6/2002 |
|---|---|---|---|
| JP | 2006-182815 A | * | 7/2006 |
| JP | 2007-216504 A | * | 8/2007 |
| JP | 4217935 B | | 2/2009 |
| JP | 2011-139036 A | | 7/2011 |

OTHER PUBLICATIONS

Written Opinion issued in PCT/JP2013/059690 on May 21, 2013.

* cited by examiner

POLYESTER FILM, BACK SHEET FOR SOLAR CELL, AND SOLAR CELL MODULE

CROSS-REFERENCE TO RELATED APPLICATIONS

This application is a continuation application of International Application No. PCT/JP/2013/059690, filed Mar. 29, 2013, the disclosure of which is incorporated herein by reference in its entirety, and which was published under PCT Article 21(2) in Japanese. Further, this application is based on and claims priority under 35 USC 119 from Japanese Patent Application No. 2012-77648 filed on Mar. 29, 2012, Japanese Patent Application No. 2012-209848 filed on Sep. 24, 2012, and Japanese Patent Application No. 2013-62701 filed on Mar. 25, 2013, the disclosures of all of which are incorporated by reference herein in their entirety.

TECHNICAL FIELD

The present invention relates to a polyester film, a back sheet for a solar cell, and a solar cell module.

BACKGROUND ART

Polyester is used for various purposes such as electric insulation, an optical application, and the like. In recent years, particularly, attention has been paid in respect of application of polyester for electric insulation to solar cells in a form of a back sheet for solar cells (hereinafter, it may be simply referred to as a "back sheet") and the like.

Generally, a solar cell module is used in an environment such as an outdoor environment in which the module is continuously exposed to rain and wind. Accordingly, durability of polyester having a back sheet is one of the important issues.

In order to obtain the durability of polyester in a humid and hot environment, it is important to avoid intrusion of moisture into a substrate at a side of a solar cell that is caused when an encapsulant adjacent to a back sheet is separated from the back sheet or when layers inside a back sheet having a layered structure are separated from each other.

It has been disclosed a technique in which a urethane resin containing constituent components including an aliphatic polycarbonate polyol is used for a coating layer of a back sheet, and the absorbance of the constituents is regulated so as to improve the adhesiveness between the encapsulant and the back sheet (for example, see Japanese Patent Application Laid-Open (JP-A) No. 2011-139036).

It has been disclosed a technique in which an inorganic oxide-deposited film is formed in advance as a pre-treated surface layer on a surface of a substrate film by a CVD method, a PVD method, or the like, so as to improve the adhesiveness between the substrate film and the deposited film and/or a laminate film (for example, see Japanese Patent No. 4217935).

It has been disclosed an attempt at ameliorating the dimensional stability of a polyester film based on the infrared spectroscopic characteristics of polyester (for example, see JP-A No. 2000-071405 and JP-A No. 2000-302892).

SUMMARY OF INVENTION

Technical Problem

In the methods described in the patent documents, the failure caused by separation of a back sheet from a layer adjacent to the back sheet still occurs in a solar cell module, hence the durability is insufficient.

The invention has been made in consideration of the above circumstance, and may provide a polyester film that exhibits excellent durability in a humid and hot environment, a back sheet, and a solar cell module that maintains stable power generation performance for a long period of time.

Solution to Problem

The invention provides the following.

<1> A polyester film, comprising:
a polyester substrate; and
a layered portion that is disposed on at least one surface of the polyester substrate and has an elastic modulus of from 5 MPa to 800 MPa,
a ratio of a peak intensity at 988 $cm^{-1}$ that is observed by subjecting a surface of the polyester substrate to infrared spectroscopy, to a peak intensity at 1410 $cm^{-1}$ that is observed by subjecting a surface of the polyester substrate to infrared spectroscopy, satisfying the following Inequality (I):

$$0.010 \leq \text{(peak intensity at 988 } cm^{-1}\text{)/(peak intensity at 1410 } cm^{-1}\text{)} \leq 0.040 \quad \text{(I)}.$$

<2> The polyester film according to <1>, wherein a haze of a region ranging from a surface of the polyester substrate to a point at a distance of 10 μm in the thickness direction of the polyester substrate is 0.5% or less, and a haze of an entire thickness of the polyester substrate is from 1.5% to 6%.

<3> The polyester film according to <1> or <2>, wherein an intrinsic viscosity of the polyester substrate is from 0.65 dL/g to 1.05 dL/g.

<4> The polyester film according to any one of <1> to <3>, wherein an intrinsic viscosity of the polyester substrate is from 0.65 dL/g to 0.85 dL/g.

<5> The polyester film according to any one of <1> to <4>, wherein the layered portion contains a binder that has an elastic modulus of from 5 MPa to 320 MPa.

<6> The polyester film according to any one of <1> to <5>, wherein the layered portion includes a layer containing an olefin-based binder.

<7> The polyester film according to any one of <1> to <6>, wherein the layered portion contains a colored layer containing a coloring pigment.

<8> The polyester film according to <7>, wherein a volume fraction of the coloring pigment relative to a total volume of the layered portion is 50% by volume or less.

<9> The polyester film according to <7> or <8>, wherein the coloring pigment is titanium oxide.

<10> The polyester film according to <7> or <8>, wherein the coloring pigment is a carbon black.

<11> The polyester film according to any one of <1> to <10>, wherein the thickness of the layered portion is 30 μm or less.

<12> A method of producing the polyester film according to any one of <1> to <11>, wherein the layered portion is formed by coating the surface of the polyester substrate with a composition comprising components that form the layered portion.

<13> The polyester film according to any one of <1> to <12>, wherein the polyester substrate is formed of a composition that comprises:
a polyester raw material that has an intrinsic viscosity of from 0.50 dL/g to 0.90 dL/g; and a compound that comprises one carbodiimide group and has a cyclic structure in which a first nitrogen and a second nitrogen of the carbodiimide group are bonded to each other through a bonding group, in an amount of from 0.05% by mass to 20% by mass with respect to a mass of the polyester raw material.

<14> The polyester film according to any one of <1> to <13>, wherein the polyester substrate has a layer comprising a cyclohexanedimethanol-based polyester that comprises, in an amount of 0.1 mol % to 20 mol % or in an amount of 80 mol % to 100 mol % with respect to a total amount of a diol component of the cyclohexanedimethanol-based polyester, a structure derived from 1,4-cyclohexanedimethanol.

<15> A back sheet for a solar cell, the back sheet comprising the polyester film according to any one of <1> to <14>.

<16> A solar cell module, comprising:

a front board that is transparent and at which sunlight is incident;

a cell structure portion that is disposed at one side of the front board and comprises a solar cell element and an encapsulant that encapsulates the solar cell element; and the back sheet for a solar cell according to <15>, which is disposed at a side of the cell structure portion opposite to the side at which the front board is positioned, and which contacts the encapsulant.

Advantageous Effects of Invention

The invention can provide a polyester film that exhibits excellent durability in a humid and hot environment, a back sheet for a solar cell, and a solar cell module that maintains stable power generation performance for a long period of time.

DESCRIPTION OF EMBODIMENTS

Figure 1:
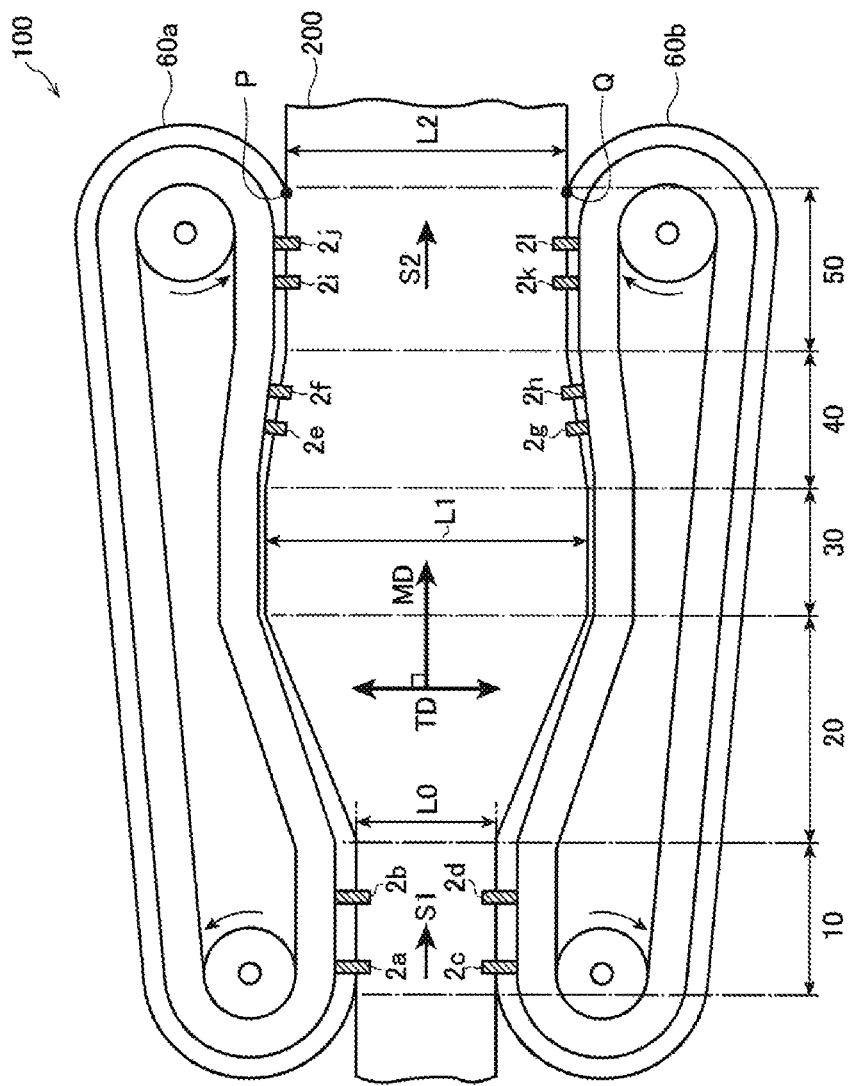
FIG. 1 is a top view of a biaxial stretching machine.

In the present specification, when an amount of a certain component in a composition is described and the composition contains plural substances corresponding to the component, the amount means a total amount of the plural substances contained in the composition, unless otherwise specified.

The term "step" means not only an independent step but also a step that is not clearly distinguished from other steps but fulfills a function desired to the step.

In the present specification, a range of numerical values represents a range that includes a numerical value described as a lower limit of the range as a minimum value and a numerical value described as an upper limit of the range as a maximum value.

<Polyester Film>

The polyester film as a first embodiment of the invention includes: a polyester substrate in which a ratio of a peak intensity at 988 cm$^{-1}$ and a peak intensity at 1410 cm$^{-1}$ which are observed by subjecting a surface of the polyester substrate to infrared spectroscopy satisfies Inequality (I); and a layered portion which is disposed on at least one surface of the polyester substrate and has an elastic modulus of from 5 MPa to 800 MPa.

$$0.010 \leq \text{(peak intensity at 988 cm}^{-1}\text{)/(peak intensity at 1410 cm}^{-1}\text{)} \leq 0.040 \quad \text{(I)}$$

Hereinafter, the "(peak intensity at 988 cm$^{-1}$)/(peak intensity at 1410 cm$^{-1}$)" will also be described as a "specific IR intensity ratio".

In the present specification, unless otherwise specified, the "elastic modulus" refers to the tensile modulus specified by JIS K7113.

The polyester film as an embodiment of the invention is a layered body having at least a polyester substrate and a layered portion adjacent to the polyester substrate. The polyester film is used as, for example, a film material for solar cells, such as a back sheet.

Generally, the back sheet and an encapsulant that encapsulates solar cell elements are used in a state where the back sheet and the encapsulant are stuck to each other (that is, in a state where the back sheet and the encapsulant come into contact with each other). As the encapsulant, an ethylene-vinyl acetate resin (EVA) is mainly used. The encapsulant containing EVA as a main component is also called an EVA encapsulant.

As a result of investigating separation interface that is formed when the encapsulant is separated from the polyester film contained in the back sheet, it was found that the separation occurs between the encapsulant and the polyester film (that is, between the encapsulant and the surface of the layered portion) or between the polyester substrate and the layered portion, and in addition to this, breaking of the uppermost surface of the polyester substrate causes the separation in some cases.

In other words, it was found that suppression of separation trouble of the solar cell module cannot be sufficiently achieved by only improving the adhesiveness between the encapsulant and the polyester film and/or the adhesiveness between the polyester substrate and the layered portion inside the polyester film, and imparting, to the surface of the polyester substrate, resistance against separative influence is also important to achieve the suppression.

By configuring the polyester film as above, it is possible to suppress the separation trouble even in a humid and hot environment (for example, 120° C. and 100% RH).

The reason is assumed to be as below though it is unclear.

In order to suppress the separation trouble of the polyester film containing at least the polyester substrate and the layered portion, it is important to make the surface of the polyester substrate not easily separated from the adjacent layer or to make the surface of the polyester substrate not easily broken.

By regulating the orientation state of polyester molecules in the surface of the polyester substrate and regulating the elastic modulus (hardness or softness) of the layered portion, the separation and breaking can be avoided.

The specific IR intensity ratio indicates the orientation state of polyester molecules in the uppermost surface of the polyester substrate (when the surface of the polyester substrate is regarded as a starting point (0 µm), the uppermost surface includes an area from the surface to a point at a distance of 2.3 µm in the depth direction (thickness direction of the substrate that includes the inside of the polyester substrate)). The small specific IR intensity ratio means that the polyester molecules are orientated well in the longitudinal direction and in the direction orthogonal to the longitudinal direction, that is, the polyester molecules are orientated in a form of a layer.

Since the polyester molecules are orientated in the form of a layer, permeation of water molecules into the polyester can be suppressed, and accordingly, the polyester substrate does not easily deteriorate because hydrolysis does not easily occur even in a humid and hot environment. However, if the polyester molecules are orientated in the form of a layer to an excessive degree, the surface of the polyester substrate may become weak.

Herein, it is considered that the setting of the specific IR intensity ratio to 0.010 to 0.040 may suppress permeation of water molecules into the polyester, whereby hydrolysis is suppressed, and may orientate the polyester molecules in the form of a layer to such a degree that does not make the polyester substrate brittle, and accordingly, separation does not easily occur on the surface of the polyester substrate.

Not only the strength of the surface of the polyester substrate but also the adhesiveness between the polyester substrate and the layered portion strongly influence the separation trouble of the polyester film.

If the layered portion is too soft or too hard, the adhesiveness between the polyester substrate and the layered portion is not obtained. If the layered portion is too flexible, the layered portion may be separated from the polyester substrate, and/or separation may occur between the encapsulant and the layered portion when the layered portion is adjacent and stuck to the encapsulant. If the layered portion is too hard, stress concentration may occur in the polyester substrate, which may make the layered portion easily broken or easily separated from the polyester substrate.

It is considered that since the surface of the polyester substrate does not easily cause separation as described above, and the layered portion has flexibility to some extent, the polyester film hardly causes the separation trouble even in a humid and hot environment, and accordingly, durability of the polyester film becomes excellent.

It is considered that it is possible to obtain a back sheet for a solar cell that exhibits excellent durability even in a humid and hot environment by using such a polyester film for the back sheet for a solar cell.

It is considered that if such a back sheet for a solar cell is used for a solar cell module, the power generation performance is stably maintained for a long period of time even when the solar cell module is placed in an environment in which the module is irradiated with direct sunlight and exposed to rain, since the solar cell module is protected with the back sheet that exhibits excellent durability even in a humid and hot environment.

Hereinafter, the polyester substrate and the layered portion included in the polyester film will be described in detail.

[Polyester Substrate]

The specific IR intensity ratio of the polyester substrate, that is, a ratio of a peak intensity at 988 $cm^{-1}$ and a peak intensity at 1410 $cm^{-1}$ [(peak intensity at 988 $cm^{-1}$)/(peak intensity at 1410 $cm^{-1}$)] which are observed by subjecting a surface of the polyester substrate to infrared spectroscopy, satisfies Inequality (I).

$$0.010 \leq \text{specific IR intensity ratio} \leq 0.040 \quad (I)$$

That is, the polyester film has a polyester substrate, the specific IR intensity ratio of which is 0.010 to 0.040.

Since the specific IR intensity ratio of the polyester substrate is 0.010 or higher, it is possible to avoid phenomenon such as breaking of the surface of the polyester substrate or separation of a layer adjacent to the polyester substrate from the polyester substrate, which is caused when the polyester molecules of the surface of the polyester substrate are orientated in the form of layer to an excessive degree. Moreover, since the specific IR intensity ratio is 0.040 or lower, it is possible to avoid phenomenon such as breaking of the surface of the polyester substrate or separation of a layer adjacent to the polyester film from the polyester film that results from accelerated deterioration of polyester substrate in a humid and hot environment, which is caused when orientation state of the polyester molecules is insufficient.

The specific IR intensity ratio can be measured by subjecting the surface of the polyester substrate to infrared spectroscopy (IR). For the surface measurement, it is preferable to use an attenuated total reflection (ATR) method.

Specifically, the specific IR intensity ratio may be measured as below.

An infrared absorption spectrum of the polyester substrate is obtained using an infrared spectrophotometer FT-IR FTS7000 (trade name, manufactured by Digital Laboratory, Inc.) and a Ge ATR prism. From the obtained infrared absorption spectrum, a peak intensity (absorption intensity) at 988 $cm^{-1}$ and a peak intensity (absorption intensity) at 1410 $cm^{-1}$ are determined, and a ratio between the peak intensities is calculated.

At 988 $cm^{-1}$ in the infrared absorption spectrum of the polyester substrate, a peak (absorption) resulting from a folding structure of a bent polyester molecule is observed. The more the folding structure of the polyester molecules contained in the polyester substrate, the further the peak intensity (absorption intensity) at 988 $cm^{-1}$ is increased.

When the polyester substrate is a biaxially stretched polyester film that is obtained by performing biaxial stretching in which molten polyester is stretched vertically and horizontally and then relaxed, the larger the number of orientated polyester molecules becomes, the smaller the number of the folding structure becomes, and the peak intensity at 988 $cm^{-1}$ of the infrared absorption spectrum tends to decrease.

Moreover, the more the polyester molecules are relaxed, the larger the number of the folding structure becomes, and the peak intensity tends to increase.

Accordingly, it is possible to obtain a polyester substrate having a desired specific intensity ratio by subjecting a polyester substrate to melt-extrusion by using an extruder, and then subjecting the film to stretching and relaxing in the process of biaxial stretching.

The peak intensity at 1410 $cm^{-1}$ in the infrared absorption spectrum of the polyester substrate is a peak intensity selected for measurement normalization.

The specific IR intensity ratio is preferably from 0.012 to 0.035 and more preferably from 0.013 to 0.030.

The polyester substrate that the polyester film has is not particularly limited as long as the polyester substrate has the above-described physical properties, and it is possible to use various polyester substrates. It is preferable that the polyester substrate is of a linear saturated polyester that is synthesized from aromatic dibasic acid or ester-forming derivatives thereof and diol or ester-forming derivatives thereof.

Examples of the linear saturated polyester include polyethylene terephthalate (PET), polyethylene isophthalate, polybutylene terephthalate, poly(1,4-cyclohexylenedimethyleneterephthalate), polyethylene-2,6-naphthalate, and the like.

Among these, polyethylene terephthalate is particularly preferable from the viewpoint of the balance between the dynamic physical properties and cost.

The polyester may be a homopolymer or a copolymer.

The polyester may further contain other resins such as polyimide. Moreover, the polyester-containing substrate may be composed of a single layer or may have a structure in which plural layers having different compositions are layered on one another.

In the polyester film, it is preferable that a haze of 10 μm of the surface layer of the polyester substrate be 0.5% or less, and a haze of an entire thickness of the polyester film be from 1.5% to 6%. Herein, the "haze of 10 μm of the surface layer of the polyester substrate be 0.5% or less" means that the polyester substrate has a distribution of haze observed in the thickness direction of the polyester substrate, and a region ranging from a surface of the polyester substrate to a point at a distance of 10 μm in the thickness direction is substantially transparent (that is, when the surface of the polyester substrate is regarded as a starting point (0 μm), a 0 μm-to-10 μm area which ranges from the surface to the point at a distance of 10 μm in the depth direction (thickness direction of the substrate) is substantially transparent). Moreover, the "haze of an entire thickness of the polyester film" means the haze that is measured by causing a flux of incident light to be transmitted from one surface of the polyester film to the other surface of the opposite side in the depth direction (thickness direction of the film). The haze of the polyester film indicates the size or amount of polyester crystals contained in the polyester film. The lower the haze of the polyester film is, the smaller the crystal size is, and the smaller the amount of the crystals. The higher the haze of the polyester film is, the more the polyester molecules are highly oriented, or large-sized crystals are more easily generated. Consequently, if the haze of the polyester film is high, when the encapsulant is separated from the polyester film, the polyester substrate is broken depending on the orientation state of the polyester, the presence of the large-sized crystals, and the like, whereby the layered portion is easily separated from the polyester substrate.

If the haze of the area from the surface of the polyester substrate to a point at a distance of 10 μm in the thickness direction is set to 0.5% or less, the separation that causes the breaking of the uppermost surface of the polyester substrate is suppressed. Moreover, if the haze of the entire thickness of the polyester film is from 1.5% to 6%, deterioration of the polyester film in a humid and hot environment (for example, 120° C. and 100% RH) is suppressed, whereby it is possible to make the separation trouble not easily occur.

The haze of the surface layer of the polyester substrate and the haze of the polyester film can be regulated by the melting temperature in the extruder, IV of raw materials, the temperature of a casting drum that cools and solidifying a molten material ejected from the extruder, or the cooling air temperature. For example, if the extrusion temperature in the extruder is regulated to be low, the haze tends to increase, and if the extrusion temperature is regulated to be high, the haze tends to decrease.

In the invention, the haze of the surface layer of the polyester substrate and the haze of the polyester film are measured using HZ-1 manufactured by Suga Test Instruments Co., Ltd. A sample of the surface layer of the polyester substrate is obtained by sampling a layer, which has an area from the surface of the polyester substrate to a point at a distance of 10 μm in the thickness direction, by using a microtome RM2165 manufactured by Leica Mycrosystems. After the sampling, the haze is measured.

In the polyester film, the haze of the 10 μm of the surface layer of the polyester substrate is preferably 0.3% or less, and the haze of an entire thickness of the polyester film is preferably from 2.5% to 4%.

The acid value of the polyester contained in the polyester substrate, that is, the concentration (Acid Value: AV) [equivalent weight/ton] of terminal carboxy groups of polyester is preferably 50 [equivalent weight/ton] or less, more preferably 35 [equivalent weight/ton] or less, and even more preferably 20 [equivalent weight/ton] or less. In the present specification, the [equivalent weight/ton] indicates molar equivalent per 1 ton.

If the concentration of the terminal carboxy groups is 50 [equivalent weight/ton] or less, the polyester is not easily hydrolyzed, and it is possible to inhibit the strength of the polyester substrate from deteriorating over time in a humid and hot environment. The concentration of the terminal carboxy groups is desirably 2 [equivalent weight/ton] or more, from the viewpoint of maintaining the adhesiveness between the polyester substrate and the layer adjacent to the polyester substrate.

The intrinsic viscosity (IV) dL/g of the polyester contained in the polyester substrate is preferably from 0.65 dL/g to 1.05 dL/g, more preferably from 0.65 dL/g to 0.90 dL/g, and even more preferably from 0.65 dL/g to 0.85 dL/g.

Specifically, when the polyester contained in the polyester substrate only has general structural units, if IV of the polyester used is set to from 0.65 dL/g to 0.85 dL/g, breaking of the surface of the polyester substrate or separation of the layered portion from the polyester substrate can be prevented. Moreover, for example, when the polyester contains a 1,4-cyclohexanedimethanol-derived structure as a diol component, IV of the polyester falls within a wider range, that is, a range of from 0.65 dL/g to 1.05 dL/g, and the polyester substrate can achieve preferable flexibility and strength. Accordingly, breaking of the surface of the polyester substrate or separation of the layered portion from the polyester substrate can be suppressed.

Specifically, if IV of the polyester is 0.65 dL/g or higher, the molecular chain of the polyester molecule is not easily shortened, and the molecules are sufficiently entangled with one another. Accordingly, it is possible to suppress breaking of the surface of the polyester substrate or separation of the layered portion from the polyester substrate. Moreover, if IV of the polyester is 1.05 dL/g or lower, the polyester substrate is not easily hardened, and stress concentration does not easily occur on the surface of the polyester substrate. Accordingly, it is possible to suppress breaking of the surface of the polyester substrate or separation of the layered portion from the polyester substrate.

IV of the polyester contained in the polyester substrate is more preferably 0.65 dL/g to 0.85 dL/g, even more preferably 0.68 dL/g to 0.80 dL/g, and most preferably 0.70 dL/g to 0.78 dL/g.

AV and IV of the polyester substrate can be adjusted according to the type of polymerization catalysts and film formation conditions (temperature or time for forming a film). It is preferable that the polyester contained in the polyester substrate is in a solid-phase polymerized state after polymerization. If the polyester is in such a state, preferable AV and IV can be achieved.

The thickness of the polyester substrate is preferably from 25 μm to 300 μm, and more preferably from 120 μm to 300 μm. If the thickness is 25 μm or more, a sufficient dynamic strength is obtained. If the thickness is 300 μm or less, it is advantageous in terms of cost.

[Method of Producing Polyester Substrate]

The polyester substrate is not particularly limited as long as it is obtained by a method of producing polyester that exhibits the specific IR intensity ratio of from 0.010 to 0.040 when infrared spectroscopy is performed on the surface thereof.

The specific IR intensity ratio greatly depends on the orientation state of the polyester molecules. The orientation state of the polyester molecules can be regulated in detail by biaxially stretching the polyester. Particularly, if the polyester is biaxially stretched by the following production method, the specific IR intensity ratio of the polyester substrate, the haze of the surface layer of the substrate and the entire polyester film, AV, IV, the thickness, and the like can be regulated as in the preferable embodiments.

Hereinafter, a method of producing a polyester substrate will be described in detail. In the following description of the method of producing the polyester substrate, a "polyester film" means a "polyester film as a polyester substrate" unless otherwise specified.

It is preferable that the method of producing a polyester substrate includes a step of performing melt-extrusion of raw material polyester and cooling the resultant to form a polyester film; a step of vertically stretching the polyester film in the longitudinal direction; and a step of stretching the polyester film in at least a horizontal direction by transporting the polyester film to a preheating portion that preheats the polyester film, a stretching portion that horizontally stretches the preheated polyester film while applying tension in at least a direction orthogonal the longitudinal direction of the polyester film, a thermal fixing portion that thermally fixes the tensioned polyester film by heating, and a thermal relaxation portion that release tension of the thermally fixed polyester film, in this order.

The present inventors found that hydrolysis resistance of the polyester film (hereinafter, simply referred to as "film" in some cases) can become excellent by applying tension to the film and making the polyester molecules stretched in the length direction of the molecules. The present inventors also found that in order to orientate the polyester molecules in the form of a layer, it is desirable to biaxially stretch the molecules in the longitudinal direction and the direction orthogonal to the longitudinal direction, and to prevent the stretched molecules from being relaxed as much as possible after stretching.

The polyester molecules can be stretched or orientated in the form of a layer by adjusting a stretch ratio and a stretching temperature during the vertical stretching which will be described later, a stretch ratio during the horizontal stretching, a temperature during the thermal fixing, a temperature during the thermal relaxation, a relaxation ratio during the thermal relaxation, and the like.

The present inventors also found that dimensional stability of the film becomes excellent when an interval between the molecular chains of the polyester molecules is short. It is considered that if the interval between the molecular chains of the polyester molecules is large, intermolecular interaction occurs to make the interval between the molecular chains be shortened, and accordingly, the dimensional stability of the film may worsen (a coefficient of thermal contraction increases).

In the process of stretching the film, generally, by using an apparatus having a roller, a clip, and the like, the film is stretched in the transport direction of the film (vertical stretching) and in the direction orthogonal to the transport direction (horizontal stretching) while being transported. In the step of horizontally stretching the film, the film is stretched while being sequentially transported to a preheating portion that preheats the film for stretching, a stretching portion that applies tension to the film to stretching the film, a thermal fixing portion that heats the film in the tensioned state, and a thermal relaxation portion that release the tension of the film.

[Film Formation Step]

A film formation step is a step of performing melt-extrusion on raw material polyester and cooling the resultant to form a polyester film (preferably a polyester film having an intrinsic viscosity of 0.65 dL/g or higher).

It is preferable that the film formation step includes a step of performing melt-extrusion by adding at least one terminal blocking agent among oxazoline-based compounds, carbodiimide compounds, and epoxy compounds to the raw material polyester.

(Raw Material Polyester)

The raw material polyester is not particularly limited as long as it is a material that is a raw material of the polyester film and contains polyester. The raw material polyester may contain slurry of inorganic or organic particles, in addition to polyester. Moreover, the raw material polyester may contain a titanium element derived from a catalyst.

The kind of polyester contained in the raw material polyester is not particularly limited.

The polyester may be synthesized from a polycarboxylic acid (for example, dicarboxylic acid) component and a polyol (for example, diol) component, or alternatively, commercially available polyester may be used.

When the polyester is synthesized, for example, the polyester can be obtained by causing an esterification reaction and/or a ester exchange reaction between (A) a dicarboxylic acid component and (B) a diol component by a known method.

Examples of the (A) dicarboxylic acid component include dicarboxylic acids or ester derivatives thereof including aliphatic dicarboxylic acid such as malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethylmalonic acid; alicyclic dicarboxylic acids such as adamantane dicarboxylic acid, norbornene dicarboxylic acid, isosorbide, cyclohexane dicarboxylic acid, and decalin decarboxylic acid; and aromatic dicarboxylic acids such as terephthalic acid, isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyletherdicarboxylic acid, sodium 5-sulfoisophthalate, phenyl indane dicarboxylic acid, anthracene dicarboxylic acid, phenanathrene dicarboxylic acid, and 9.9'-bis(4-carboxyphenyl)fluorene.

Examples of the (B) diol component include diol compounds including aliphatic diol such as ethylene glycol, 1,2-propanediol, 1,3-propanediol, 1,4-butanediol, 1,2-butanediol, and 1,3-butanediol; alicyclic diol such as cyclohexanedimethanol, spiroglycol, and isosorbide; and aromatic diols such as bisphenol A, 1,3-benzenedimethanol, 1,4-benzenedimethanol, and 9,9'-bis(4-hydroxyphenyl)fluorene.

It is preferable to use at least one kind of aromatic dicarboxylic acid as the (A) dicarboxylic acid component. It is more preferable that the polyester contains an aromatic dicarboxylic acid as a main component among the dicarboxylic acid components. The "main component" means that the proportion of the aromatic dicarboxylic acid in the dicarboxylic acids is 80% by mass or higher. The polyester may contain dicarboxylic acid components other than the aromatic dicarboxylic acid component. Examples of the dicarboxylic acid components include ester derivatives of aromatic dicarboxylic acid and the like.

Moreover, it is preferable to use at least one kind of aliphatic diol as the (B) diol component. The polyester can contain ethylene glycol as the aliphatic diol, and it is preferable that the polyester contains ethylene glycol as a main component. The "main component" means that the proportion of the ethylene glycol in the diol component is 80% by mass or higher.

The amount of aliphatic diol (for example, ethylene glycol) used is preferably within a range of from 1.015 mol to 1.50 mol with respect to 1 mol of the aromatic dicarboxylic acid (for example, terephthalic acid) and the ester derivatives thereof that are optionally used. The amount of aliphatic diol used is more preferably within a range of from 1.02 mol to 1.30 mol, and even more preferably within a range of from 1.025 mol to 1.10 mol. If the aliphatic diol is used in an amount of 1.015 mol or more, the esterification reaction proceeds excellently. If the aliphatic diol is used in an amount of 1.50 mol or less, for example, byproduction of diethylene glycol resulting from dimerization of ethylene glycol is suppressed, and various properties such as the melting point, glass transition temperature, crystallinity, heat resistance, hydrolysis resistance, and weather resistance can be favorably maintained.

—Polyfunctional Monomer—

It is preferable that the polyester, which is a raw material used for the method of producing the polyester film as an embodiment of the invention, contains a polyfunctional monomer, in which the sum (a+b) of (a) a number of carboxylic groups and (b) a number of hydroxyl groups is 3 or greater (hereinafter, the functional polymer is referred to be as "polyfunctional monomer having 3 or more functional groups" or simply referred to be as "polyfunctional monomer"). If the polyester contains the polyfunctional monomer, the adhesive force between the polyester film and a coating material adjacent thereto becomes excellent. Examples of the coating material adjacent to the polyester film include a coating layer formed on top of the polyester film by coating.

It is considered that functional groups not used for polycondensation of the polyester may form a hydrogen bond or a covalent bond with the components in the coating layer of the coating material adjacent to the polyester film, and accordingly, the adhesive force between the polyester film and the coating material adjacent thereto may be improved as above.

It is preferable that the raw material polyester contains the polyfunctional monomer as a copolymerization component (a constituent having 3 or more functional groups). The "to contain the polyfunctional monomer as a copolymerization component (a constituent having 3 or more functional groups)" means that the raw material polyester contains a structural unit derived from the polyfunctional monomer.

As described above, the polyester can be obtained by, for example, causing an esterification reaction and/or a ester exchange reaction between the (A) dicarboxylic acid component and the (B) diol component by a known method. It is more preferable to obtain the polyester by copolymerizing the components (A) and (B) with the polyfunctional monomer having 3 or more functional groups.

Examples of the polyfunctional monomer, in which the sum (a+b) of the (a) number of carboxylic groups and the (b) number of hydroxyl groups is 3 or greater, include trifunctional aromatic dicarboxylic acids such as trimesic acid, trimellitic acid, pyromellitic acid, naphthalene tricarboxylic acid, and anthracene tricarboxylic acid; trifunctional aliphatic carboxylic acids such as methane tricarboxylic acid, ethane tricarboxylic acid, propane tricarboxylic acid, and butane tricarboxylic acid; tetrafunctional aromatic carboxylic acids such as benzene tetracarboxylic acid, benzophenone tetracarboxylic acid, naphthalene tetracarboxylic acid, anthracene tetracarboxylic acid, and perylene tetracarboxylic acid; tetrafunctional aliphatic carboxylic acids such as ethane tetracarboxylic acid, ethylene tetracarboxylic acid, butane tetracarboxylic acid, cyclopentane tetracarboxylic acid, cyclohexane tetracarboxylic acid, and adamantane tetracarboxylic acid; aromatic carboxylic acids having 5 or more functional groups, such as benzene pentacarboxylic acid, benzene hexacarboxylic acid, naphthalene pentacarboxylic acid, naphthalene hexacarboxylic acid, naphthalene heptacarboxylic acid, naphthalene octacarboxylic acid, anthracene pentacarboxylic acid, anthracene hexacarboxylic acid, anthracene heptacarboxylic acid, and anthracene octacarboxylic acid; aliphatic carboxylic acid having 5 or more functional groups, such as ethane pentacarboxylic acid, ethane heptacarboxylic acid, butane pentacarboxylic acid, butane heptacarboxylic acid, cyclopentane pentacarboxylic acid, cyclohexane pentacarboxylic acid, cyclohexane hexacarboxylic acid, adamantane pentacarboxylic acid, and adamantane hexacarboxylic acid; and the like.

Examples of the polyfunctional monomer include ester derivatives or acid anhydrides of the above, but the polyfunctional monomer is not limited to these.

Moreover, the monomers obtained by adding oxy acid such as l-lactide, d-lactide, hydroxybenzoic acid and derivatives thereof, a raw of plural oxy acid molecules, and the like to the carboxy terminal of the carboxylic acids are preferably used.

These may be used singly, or alternatively, plural kinds of these may be concurrently used if necessary.

Examples of the polyfunctional monomer having 3 or more of the (b) hydroxyl groups include trifunctional aromatic compounds such as trihydroxybenzene, trihydroxynaphthalene, trihydroxyanthracene, trihydroxychalcone, trihydroxyflavone, and trihydroxycoumarin; trifunctional aliphatic alcohols such as glycerin, trimethylolpropane, and propanetriol; and tetrafunctional aliphatic alcohols such as pentaerythritol and the like. Moreover, the compounds obtained by adding diol to the hydroxyl group terminal of the compounds are preferably used.

These may be used singly, or alternatively, plural kinds of these may be concurrently used if necessary.

In addition, examples of polyfunctional monomers other than the above include oxy acid which have both the hydroxyl group and carboxylic group in a single molecule and in which the sum (a+b) of the (a) number of carboxylic groups and the (b) number of hydroxyl groups is 3 or greater. Examples of such oxy acid include hydroxyisophthalic acid, hydroxyterephthalic acid, dihydroxyterephthalic acid, trihydroxyterephthalic acid, and the like.

Moreover, the monomers obtained by adding oxy acid such as l-lactide, d-lactide, hydroxybenzoic acid and derivatives thereof, a raw of plural oxy acid molecules, and the like to the carboxy terminal of the polyfunctional monomers are preferably used.

These may be used singly, or alternatively, plural kinds of these may be concurrently used if necessary.

In the raw material polyester, a content of the polyfunctional monomer is preferably from 0.005 mol % to 2.5 mol % with respect to the total mol number of the polyester. The content of the polyfunctional monomer is more preferably from 0.020 mol % to 1 mol %, even more preferably from 0.025 mol % to 1 mol %, still more preferably from 0.035 mol % to 0.5 mol %, particularly preferably from 0.05 mol % to 0.5 mol %, and most preferably from 0.1 mol % to 0.25 mol %.

If the polyester has a structural unit derived from the polyfunctional monomer having 3 or more functional groups, as described above, when the polyester film is finally formed, a structure in which a polyester molecule chain has been branched from the structural unit derived from the polyfunctional monomer having 3 or more functional groups is obtained, whereby entanglement between the polyester molecules can be promoted.

The polyfunctional monomer may be added in the process of polymerizing the polyester, that is, in the step of esterification reaction between the dicarboxylic acid component and the diol component.

It is possible to use conventionally known reaction catalysts for the estrification reaction and/or ester exchange reaction. Examples of the reaction catalysts include alkali metal compounds, alkaline earth metal compounds, zinc compounds, lead compounds, manganese compounds, cobalt compounds, aluminum compounds, antimony compounds, titanium compounds, phosphorus compounds, and the like. Generally, it is preferable to add an antimony compound, a germanium compound, or a titanium compound as a polymerization catalyst at any stage before the end of the method of producing polyester. For example, if a germanium compound is used, it is preferable to use a method in which the germanium compound powder is added as is.

For example, in the esterification reaction step, aromatic dicarboxylic acid and aliphatic diol are polymerized in the presence of a catalyst containing a titanium compound. In the esterification reaction step, an organic chelated titanium complex that uses an organic acid as a ligand is used as the titanium compound functions as a catalyst. Moreover, the step includes at least a process of adding the organic chelated titanium complex, a magnesium compound, and a pentavalent phosphoric acid ester not having an aromatic ring as a substituent in this order.

First, before the magnesium compound and the phosphorus compound are added, the aromatic dicarboxylic acid and the aliphatic diol are mixed with the catalyst containing the organic chelated titanium complex as a titanium compound. The titanium compound such as the organic chelated titanium complex keeps exhibiting a high degree of catalytic activity even in the esterification reaction, and accordingly, the esterification reaction can be performed excellently. At this time, the titanium compound may be added to the mixture of the dicarboxylic acid component and the diol component. Alternatively, after the dicarboxylic acid component (or the diol component) is mixed with the titanium compound, the diol compound (or the dicarboxylic acid component) may be mixed with the resultant. Moreover, the dicarboxylic acid component, the diol component, and the titanium compound may be mixed together at the same time.

The mixing method is not particularly limited, and the above components can be mixed by conventionally known methods.

The polyester is more preferably polyethylene terephthalate (PET) or polyethylene-2,6-naphthalene (PEN), and even more preferably PET. Further, it is preferable that PET is polymerized using one, two, or more kinds selected from germanium (Ge)-based catalysts, antimony (Sb)-based catalysts, aluminum (Al)-based catalysts, and titanium (Ti)-based catalysts. Among these, it is preferable to use Ti-based catalysts.

The Ti-based catalysts exhibit a high degree of reaction activity and can reduce the polymerization temperature. Accordingly, the catalysts can prevent the polyester from undergoing thermolysis particularly during the polymerization reaction and prevent the generation of COOH. That is, if the Ti-based catalysts are used, the amount of terminal carboxylic acid of the polyester that causes the thermolysis can be reduced, and the generation of foreign substances can be prevented. If the amount of terminal carboxylic acid of the polyester is reduced beforehand, it is also possible to prevent the polyester film from undergoing thermolysis after the polyester film is produced.

Examples of the Ti-based catalysts include oxides, hydroxides, alkoxides, carboxylates, carbonates, oxalates, organic chelated titanium complexes, halides, and the like. As the Ti-based catalysts, two or more kinds of titanium compounds may be concurrently used as long as the effects of the invention are not diminished.

Examples of the Ti-based catalysts include titanium alkoxides such as tetra-n-propyl titanate, tetra-1-propyl titanate, tetra-n-butyl titanate, tetra-n-butyl titanate tetramers, tetra-t-butyl titanate, tetracyclohexyl titanate, tetraphenyl titanate, and tetrabenzyl titanate; titanium oxides obtained by hydrolysis of titanium alkoxides; titanium-silicon or titanium-zirconium composite oxides obtained by hydrolysis of mixtures of titanium alkoxides and silicon alkoxides or zirconium alkoxides; titanium acetate; titanium oxalate; potassium titanium oxalate; sodium titanium oxalate; potassium titanate; sodium titanate; titanic acid-aluminum hydroxide mixtures; titanium chloride; titanium chloride-aluminum chloride mixtures; titanium acetylacetonate; organic chelated titanium complexes that uses organic acid as a ligand; and the like.

At the time of polymerizing the polyester, it is preferable to perform the polymerization by using the titanium (Ti) compound as a catalyst, in an amount within a range of from 1 ppm to 50 ppm, preferably within a range of from 2 ppm to 30 ppm, and even more preferably within a range of from 3 ppm to 15 ppm. In this case, the raw material polyester contains a titanium element in an amount of from 1 ppm to 50 ppm.

If the amount of the titanium element contained in the raw material polyester is 1 ppm or more, the weight average molecular weight (Mw) of the polyester can be increased, and the thermolysis does not easily occur. Accordingly, it is possible to suppress the increase in the amount of foreign substances in an extruder. If the amount of the titanium element contained in the raw material polyester is 50 ppm or less, the amount of the Ti-based catalyst to be the foreign substance is reduced. Accordingly, it is possible to suppress stretching irregularity when the polyester film is stretched.

[Titanium Compound]

As the titanium compound used as a catalyst component, at least one kind of organic chelated titanium complex that uses organic acid as a ligand is used. Examples of the organic acid include citric acid, lactic acid, trimellitic acid, malic acid, and the like. Among these, organic chelated complexes that use citric acid or citrate are preferable.

For example, when a chelated titanium complex that uses citric acid as a ligand is used, the foreign substances such as fine particles are caused less, and the polyester that exhibits better polymerization activity and color hue is obtained, compared to a case in which other titanium compounds are used. Moreover, when a citric acid-chelated titanium complex is used, if a method of adding the catalyst at the stage of esterification reaction is implemented, the polyester that exhibits better polymerization activity and color hue and has a smaller amount of terminal carboxy groups is obtained, compared to a case in which the catalyst is added after the esterification reaction. The reason is assumed to be as below. That is, the titanium catalyst may function as a catalyst for the esterification reaction, and accordingly, if the catalyst is added at the stage of esterification, the acid value of the oligomer may be reduced at the end of the esterification reaction, whereby the polycondensation reaction following the esterification reaction may be more efficiently performed. Moreover, the complex that uses citric acid as a ligand may be more resistant to hydrolysis than titanium alkoxides and the like are, and accordingly, the complex may more effectively function as the catalyst for the esterification reaction and the polycondensation reaction while maintaining the original activity thereof without being decomposed in the process of the esterification reaction.

In addition, it is generally known that the more the terminal carboxy groups, the worse the hydrolysis resistance. Therefore, the hydrolysis resistance is expected to be improved by reducing the terminal carboxy groups by adding the catalyst in the method described above.

The citric acid-chelated titanium complex can be easily obtained in the form of a commercially available product such as VERTEC AC-420 (trade name) manufactured by Johnson Matthey.

The aromatic dicarboxylic acid and the aliphatic diol can be added by preparing slurry containing these components and continuously supplying the slurry to the esterification reaction step.

At the time of causing the esterification reaction, it is preferable to adopt an embodiment in which the Ti catalyst is used, and a polymerization reaction is performed by adding Ti in an amount that is within a range of from 1 ppm to 30 ppm, more preferably within a range of from 3 ppm to 20 ppm, and even more preferably within a range of from 5 ppm to 15 ppm expressed in terms of a Ti element. If the amount of titanium added is 1 ppm or more, it is advantageous in terms of the increase in the polymerization speed. If the amount is 30 ppm or less, it is advantageous since excellent color hue is obtained.

Examples of the titanium compounds generally include oxides, hydroxides, alkoxides, carboxylates, carbonates, oxalates, halides, and the like, in addition to the organic chelated titanium complexes. Other titanium compounds may be concurrently used with the organic chelated titanium complexes, as long as the effects of the invention are not diminished.

Examples of such titanium compounds include titanium alkoxides such as tetra-n-propyl titanate, tetra-1-propyl titanate, tetra-n-butyl titanate, tetra-n-butyl titanate tetramers, tetra-t-butyl titanate, tetracyclohexyl titanate, tetraphenyl titanate, and tetrabenzyl titanate; titanium oxides obtained by hydrolysis of titanium alkoxides; titanium-silicon or titanium-zirconium composite oxides obtained by hydrolysis of mixtures of titanium alkoxides and silicon alkoxides or zirconium alkoxides; titanium acetate; titanium oxalate; potassium titanium oxalate; sodium titanium oxalate; potassium titanate; sodium titanate; titanic acid-aluminum hydroxide mixtures; titanium chloride; titanium chloride-aluminum chloride mixtures; titanium acetylacetonate; and the like.

In a preferable embodiment, the polyester is produced by a method of producing polyester that includes an esterification reaction step in which aromatic dicarboxylic acid and aliphatic diol are polymerized in the presence of a titanium compound-containing catalyst, and at least one kind of the titanium compound is an organic chelated titanium complex that uses organic acid as a ligand, and which includes at least a process of adding the organic chelated titanium complex, a magnesium compound, and pentavalent phosphoric acid ester not having an aromatic ring as a substituent in this order; and a polycondensation step in which the product of the esterification reaction that is produced in the esterification reaction step is subjected to a polycondensation reaction to generate a polycondensate.

In this case, in the process of the esterification reaction, a magnesium compound is added in the presence of the organic chelated titanium complex as a titanium compound, and then a specific pentavalent phosphorus compound is added. Therefore, the reaction activity of the titanium catalyst is maintained at an appropriately high level, and it is possible to effectively suppress the decomposition reaction during the polycondensation while imparting electrostatic chargeability by using magnesium. As a result, the polyester that is colored less, exhibits a high degree of electrostatic chargeability, and shows improvement in terms of yellowing which is caused when the polyester is exposed to a high temperature is obtained.

Accordingly, it is possible to provide the polyester that is colored less at the time of polymerization and colored less when being melted and formed into a film after the polymerization, has yellow hue lighter than that of the conventional antimony (Sb) catalyst-based polyester, has color hue and transparency as good as those of the germanium catalyst-based polyester having a relatively high degree of transparency, and exhibits excellent heat resistance. Moreover, even if a color hue-adjusting material such as a cobalt compound or a dye is not used, the polyester that has a high degree of transparency and is slightly yellowish is obtained.

The polyester can be used for purposes that is required to have a high degree of transparency (for example, optical films and industrial lith films), and does not need to use the expensive germanium-based catalyst, and accordingly, great cost reduction can be realized. In addition, since mingling of foreign substances that results from a catalyst and is easily generated by Sb-based catalysts is avoided, occurrence of failure in the film production process or quality defect is reduced, and cost reduction can be realized by the increase in yield of the film.

At the time of performing the esterification reaction, the process of adding the organic chelated titanium complex as a titanium compound and the magnesium compound and the pentavalent phosphorus compound as additives in this order is performed. At this time, the esterification reaction is performed in the presence of the organic chelated titanium complex, and then the magnesium compound is added before the phosphorus compound is added.

[Phosphorus Compound]

As the pentavalent phosphorus compound, at least one kind of pentavalent phosphoric acid ester not having an aromatic ring as a substituent is used. Examples thereof include phosphoric acid esters [$(OR)_3$—P=O, in which R is an alkyl group having 1 or 2 carbon atoms] having a lower alkyl group having 2 or less carbon atoms as a substituent. Specifically, trimethyl phosphate and triethyl phosphate are particularly preferable.

The amount of the phosphorus compound added is preferably within a range of from 50 ppm to 90 ppm expressed in terms of the P element. The amount of the phosphorus compound is more preferably within a range of from 60 ppm to 80 ppm, and even more preferably within a range of from 60 ppm to 75 ppm.

[Magnesium Compound]

If the polyester contains the magnesium compound, the electrostatic chargeability of the polyester is improved. In the conventional technique, polyester is easily colored when it contains the magnesium compound. However, in the polyester film of an embodiment of the invention, coloration is suppressed, and excellent color hue and heat resistance are obtained.

Examples of the magnesium compound include magnesium salts such as magnesium oxide, magnesium hydroxide, magnesium alkoxide, magnesium acetate, and magnesium carbonate. Among these, from the viewpoint of solubility in ethylene glycol, magnesium acetate is most preferable.

In order to impart a high degree of electrostatic chargeability, the amount of the magnesium compound added is preferably 50 ppm or more expressed in terms of the Mg element, and more preferably within a range of from 50 ppm to 100 ppm. From the viewpoint of imparting electrostatic chargeability, the amount of the magnesium compound added is preferably within a range of from 60 ppm to 90 ppm, and more preferably within a range of from 70 ppm to 80 ppm.

In the esterification reaction step, it is particularly preferable to perform melt polymerization by adding the titanium compound as a catalyst component and the magnesium compound and the phosphorus compound as additives, such that a value Z calculated from the following Expression (i) satisfies the following Inequality (ii). Herein, the content of P is the amount of phosphorus derived from all of the phosphorus compound containing pentavalent phosphoric acid ester not having an aromatic ring, and the content of Ti is an the amount of Ti derived from all of the Ti compound containing the organic chleated titanium complex. In this manner, if the magnesium compound and the phosphorus compound are concurrently used in the catalyst system containing the titanium compound, and the timing of adding the compounds and the proportion of the compounds added are regulated, it is possible to maintain the catalytic activity of the titanium compound at an appropriately high level, obtain color hue that is slightly yellowish, and impart heat resistance to the polyester such that the polyester is not easily colored with yellow even being exposed to a high temperature at the time of polymerization reaction or at the time of film formation (melting) following the polymerization reaction.

$$Z=5\times(\text{content of P [ppm]/atomic weight of P}) - 2\times(\text{content of Mg [ppm]/atomic weight of Mg}) - 4\times(\text{content of Ti [ppm]/atomic weight of Ti}) \quad \text{(i)}$$

$$+0 \leq Z \leq +5.0 \quad \text{(ii)}$$

The phosphorus compound not only acts on titanium but also interacts with the magnesium compound. Accordingly, Z is an index that quantitatively expresses the balance among the three compounds.

The Expression (i) expresses the amount of phosphorus that can act on titanium by subtracting the amount of phosphorus that acts on magnesium from the total amount of reactable phosphorus. When the value Z is positive, it shows that the amount of phosphorus hinder titanium is excessive. Inversely, when the value Z is negative, it shows that the amount of phosphorus required for hindering titanium is insufficient. In the reaction, a single Ti atom, a single Mg atom, and a single P atom are not equivalent to each other, and accordingly, the number of moles of the respective elements in the formula is weighted by being multiplied with the valence thereof.

Special synthesis method and the like are not necessary for obtaining the polyester. By using the titanium compound, phosphorus compound, and magnesium compound that are inexpensive and easily available, it is possible to obtain the polyester that has excellent color hue and exhibits excellent coloration resistance with respect to heat, while maintaining the reaction activity required for the reaction.

In Inequality (ii), from the viewpoint of further improving the color hue and the coloration resistance with respect to heat while maintaining polymerization reactivity, Z preferably satisfies +1.0≤Z≤+4.0, and more preferably satisfies +1.5≤Z≤+3.0.

For example, a preferable embodiment is as follows. In this embodiment, before the esterification reaction ends, the chelated titanium complex that uses citric acid or citrate as a ligand is added in an amount of from 1 ppm to 30 ppm to the aromatic dicarboxylic acid or the aliphatic diol. Thereafter, in the presence of the chelated titanium complex, a slightly acidic magnesium salt is added thereto in an amount of from 60 ppm to 90 ppm (preferably from 70 ppm to 80 ppm). Subsequently, the pentavalent phosphoric acid ester not having an aromatic ring as a substituent is added thereto in an amount of from 60 ppm to 80 ppm (preferably from 65 ppm to 75 ppm).

The esterification reaction can be performed using a multistage apparatus, in which at least two reactors are connected to each other in series, under ethylene glycol reflux, while water or alcohol generated by the reaction is being removed outside the system.

The esterification reaction may be performed by a single step or performed by being divided into multiple steps.

When the esterification reaction is performed by a single step, the esterification reaction temperature is preferably from 230° C. to 260° C., and more preferably from 240° C. to 250° C.

When the esterification reaction is performed by being divided into multiple steps, the esterification temperature of the first reaction tank is preferably from 230° C. to 260° C. and more preferably from 240° C. to 250° C., and the pressure thereof is preferably from 1.0 kg/cm$^2$ to 5.0 kg/cm$^2$ and more preferably from 2.0 kg/cm$^2$ to 3.0 kg/cm$^2$. The esterification temperature of the second reaction tank is preferably from 230° C. to 260° C. and more preferably from 245° C. to 255° C., and the pressure thereof is preferably from 0.5 kg/cm$^2$ to 5.0 kg/cm$^2$ and more preferably from 1.0 kg/cm$^2$ to 3.0 kg/cm$^2$. When the esterification reaction is performed by being divided into 3 or more steps, it is preferable that the conditions of the esterification reaction of the intermediate step are set such that the conditions become intermediate between the conditions of the first reaction tank and the conditions of the final reaction tank.

—Polycondensation—

The product of the esterification reaction is subjected to a polycondensation reaction so as to generate a polycondensate. The polycondensation may be performed by a single step or performed by being divided into multiple steps.

The product of the esterification reaction, such as an oligomer, is then used for a polycondensation reaction. The polycondensation reaction can be preferably performed by supplying the product to a multistage polycondensation reaction tank.

For example, when the reaction is performed using 3-stage reaction tank, in a preferable embodiment, the conditions of the polycondensation reaction are set such that the reaction temperature of the first reaction tank becomes from 255° C. to 280° C. and more preferably becomes from 265° C. to 275° C., and the pressure thereof becomes from 100 torr to 10 torr (from $13.3 \times 10^{-3}$ MPa to $1.3 \times 10^{-3}$ MPa) and more preferably becomes from 50 torr to 20 torr (from $6.67 \times 10^{-3}$ MPa to $2.67 \times 10^{-3}$ MPa); the reaction temperature of the second reaction tank becomes from 265° C. to 285° C. and more preferably from 270° C. to 280° C., and the pressure thereof becomes from 20 torr to 1 torr (from $2.67 \times 10^{-3}$ MPa to $1.33 \times 10^{-4}$ MPa) and more preferably becomes from 10 torr to 3 torr (from $1.33 \times 10^{-3}$ MPa to $4.0 \times 10^{-4}$ MPa); and the reaction temperature of the third reaction tank in the final reaction tank becomes from 270° C. to 290° C. and more preferably becomes from 275° C. to 285° C., and the pressure thereof becomes from 10 torr to 0.1 torr (from $1.33 \times 10^{-3}$ MPa to $1.33 \times 10^{-5}$ MPa) and more preferably becomes from 5 torr to 0.5 torr (from $6.67 \times 10^{-4}$ MPa to $6.67 \times 10^{-5}$ MPa).

Additives such as an optical stabilizer, an antioxidant, a UV absorber, a flame retardant, a lubricant (fine particles), a nucleating agent (crystallizer), and crystallization inhibitor may be further added to the polyester synthesized as above.

It is preferable that the polyester as the raw material of the polyester film is in a form of a pellet obtained by solid-phase polymerization.

If the polyester is polymerized by the esterification reaction and then subjected to solid-phase polymerization, the moisture content, a degree of crystallinity, AV, and IV of the polyester film can be regulated.

When only the polyester is used as a polyester raw material, from the viewpoint of the durability of the polyester film, the intrinsic viscosity (IV) of the polyester is preferably 0.65 dL/g or higher.

The intrinsic viscosity (IV) of the raw material polyester is more preferably from 0.70 dL/g to 0.90 dL/g.

If the intrinsic viscosity is 0.65 dL/g or higher, the molecular motion of the polyester is hindered, and this makes it difficult for the polyester to be crystallized. If the intrinsic viscosity is 0.9 dL/g or lower, the thermolysis of the polyester that results from shear heating in the extruder is not caused to an excessive degree, the crystallization is suppressed, and the acid value (AV) can be reduced.

The IV of the polyester used for the raw material is more preferably from 0.75 dL/g to 0.85 dL/g.

Particularly, in the esterification reaction, if the intrinsic viscosity (IV) of the polyester is regulated to be from 0.65 dL/g to 0.90 dL/g by using a Ti catalyst and performing solid-phase polymerization, it is easy to suppress the crystallization of the polyester in a cooling step of molten resin in the production step of the polyester.

Accordingly, it is preferable that the polyester as the raw material of the polyester film, which will be stretched vertically and horizontally, has an intrinsic viscosity of from 0.65 dL/g to 0.90 dL/g and contains titanium atoms derived from a catalyst (Ti catalyst).

The intrinsic viscosity (IV) is a value that is obtained by extrapolation in which a value, which is obtained by dividing a specific viscosity ($\eta_{sp}=\eta_r-1$) obtained by subtracting 1 from a ratio $\eta_r$, that is a relative viscosity $\eta/\eta_0$ between a solution viscosity ($\eta$) and a solvent viscosity ($\eta_0$), by concentration, is applied to a case in which the concentration is zero. The IV is determined by dissolving the polyester in a solvent as a mixture of 1,1,2,2-tetrachloroethane/phenol (=2/3 [mass ratio]) and measuring the viscosity of the solution at 25° C. with a Ubbelohde viscometer.

For the solid-phase polymerization of the polyester, the polyester polymerized by the esterification reaction or commercially available polyester that are made into pellets or small pieces may be used as a starting material.

The solid-phase polymerization of the polyester may be performed by a continuous method (a method in which a resin is filled in a tower, allowed to slowly flow in the tower for a predetermined time under heating, and then sequentially sent out) or by a batch method (a method in which a resin is put in a container and heated for a predetermined time).

It is preferable that the solid-phase polymerization of the polyester is performed at a temperature of from 150° C. to 250° C., more preferably from 170° C. to 240° C., and even more preferably from 180° C. to 230° C., for 1 hour to 50 hours, more preferably for 5 hours to 40 hours, and even more preferably for 10 hours to 30 hours. Moreover, it is preferable that the solid-phase polymerization is performed in a vacuum or under a nitrogen flow.

The temperature of the solid-phase polymerization is preferably from 170° C. to 240° C., more preferably from 180° C. to 230° C., and even more preferably from 190° C. to 220° C. If the temperature is within the above range, it is preferable since the acid value (AV) of the polyester is reduced to a greater extent. Moreover, the time of the solid-phase polymerization is preferably from 5 hours to 100 hours, more preferably from 10 hours to 75 hours, and even more preferably from 15 hours to 50 hours. If the time is within the above range, it is preferable since the acid value (AV) and the intrinsic viscosity (IV) of the polyester can be easily regulated within a preferable range. It is preferable that the solid-phase polymerization is performed in a vacuum or a nitrogen atmosphere.

—Compound Having Cyclic Structure in which First Nitrogen and Second Nitrogen of Carbodiimide Group are Bonded to Each Other Through a Bonding Group—

The polyester raw material contained in the polyester substrate may contain other compounds in addition to the polyester. For example, the polyester raw material may contain a compound having a cyclic structure in which the first nitrogen and the second nitrogen of a carbodiimide group are bonded to each other through a bonding group (hereinafter, if appropriate, the compound is called a "cyclic carbodiimide compound") and at least one of the components having a structure derived from the cyclic carbodiimide compound. Moreover, the polyester raw material may further contain a ketenimine compound, in addition to the above components.

In an embodiment, the polyester raw material may contain the cyclic carbodiimide compound, in an amount of from 0.05% by mass to 20% by mass with respect to the total mass thereof.

The cyclic carbodiimide compound and the ketenimine compound functions as a so-called terminal blocking agent and can improve the durability of the polyester film against humidity and heat by sealing the terminal carboxy groups of the polyester.

[Cyclic Carbodiimide Compound]

The molecular weight of the cyclic carbodiimide compound contained in the polyester raw material is preferably 400 or more, and more preferably 500 to 1,500.

The cyclic carbodiimide compound may have plural cyclic structures.

In the cyclic carbodiimide compound, the cyclic structure has one carbodiimide group (—N=C=N—), and the first nitrogen and the second nitrogen thereof are bonded to each other through a bonding group. In a single cyclic structure, there is only one carbodiimide group. The molecule of the cyclic carbodiimide compound can have one or plural carbodiimide groups. When the cyclic carbodiimide compound has plural cyclic structures in the molecule, such as spiro-rings, there is one carbodiimide group in each of the cyclic structures bonded to the spiro atoms, accordingly, a single molecule of the compound can have plural carbodiimide groups. The number of atoms in the cyclic structure is preferably from 8 to 50, more preferably from 10 to 30, even more preferably from 10 to 20, and still more preferably from 10 to 15.

Herein, the number of atoms in the cyclic structure means the number of atoms which directly form the cyclic structure. For example, if the cyclic structure is a 8-membered ring, the number of atoms is 8, and if the cyclic structure is a 50-membered ring, the number of atoms is 50. If the number of atoms in the cyclic structure is 8 or greater, stability of the cyclic carbodiimide compound is improved, and this makes it easy to store and use the compound. From the viewpoint of the reactivity, the upper limit of the number of members of the ring is not particularly limited. However, from the viewpoint of avoiding cost increase caused by difficulties in the synthesis, the upper limit of the number of atoms in the cyclic structure may be preferably 50.

The cyclic structure is preferably a structure represented by the following Formula (1).

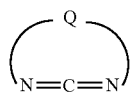

(1)

In Formula (1), Q is a bonding group having a valency of 2 to 4 that is selected from the group consisting of an aliphatic group, an alicyclic group, an aromatic group, and a combination of two or more groups selected from the above groups. Moreover, the combination of two or more groups may be in the form of a combination of the same kind of groups.

Each of the aliphatic group, the alicyclic group, and the aromatic group included in Q may have at least one of the heteroatom and substituent. In this case, the heteroatom refers to O, N, S, or P. Among the valencies of the bonding group, two valencies are used for forming the cyclic structure. When being a bonding group having a valency of 3 or 4, Q is bonded to a polymer or another cyclic structure through at least one of the single bond, double bond, atom, and atomic group.

Preferably, each bonding group may have at least one of the heteroatom and substituent. The bonding group is a aliphatic group having a valency of 2 to 4 and having from 1 to 20 carbon atoms, an alicyclic group having a valency of 2 to 4 and having from 3 to 20 carbon atoms, a aromatic group having a valency of 2 to 4 and having from 5 to 15 carbon atoms, or a combination of two or more groups selected from the above groups. Moreover, the bonding group has carbon atoms as much as being required for forming the cyclic structure specified as above. Examples of the combination include a structure of an alkylene-arylene group in which an alkylene group is bonded to an arylene group.

The bonding group (Q) is preferably a bonding group having a valency of 2 to 4 that is represented by the following Formula (1-1), (1-2), or (1-3).

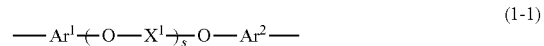 (1-1)

 (1-2)

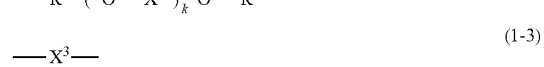 (1-3)

In the formulae, each of $Ar^1$ and $Ar^2$ independently represents an aromatic group having a valency of 2 to 4 and having from 5 to 15 carbon atoms. Each of $Ar^1$ and $Ar^2$ may independently contain at least one of the heteroatom and monovalent substituent.

Each aromatic group may contain a heteroatom and have a heterocyclic structure, and examples thereof include an arylene group having from 5 to 15 carbon atoms, an arenetriyl group having from 5 to 15 carbon atoms, and an arenetetrayl group having from 5 to 15 carbon atoms. Examples of the arylene group (divalent) include a phenylene group, a naphthalenediyl group, and the like. Examples of the arenetriyl group (trivalent) include a benzenetriyl group, a naphthalenetriyl group, and the like. Examples of the arenetetrayl group (tetravalent) include a benzenetetrayl group, a naphthalenetetrayl group, and the like. These aromatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Each of $R^1$ and $R^2$ may independently contains at least one of the heteroatom and monovalent substituent, and represents an aliphatic group having a valency of 2 to 4 and having from 1 to 20 carbon atoms, an alicyclic group having a valency of 2 to 4 and having from 3 to 20 carbon atoms, a combination of two or more groups selected from the above groups, or a combination of the above alicyclic group or aliphatic group and a aromatic group having a valency of 2 to 4 and having from 5 to 15 carbon atoms.

Examples of the aliphatic group include an alkylene group having from 1 to 20 carbon atoms, an alkanetriyl group having from 1 to 20 carbon atoms, an alkanetetrayl group having from 1 to 20 carbon atoms. Examples of the alkylene group include a methylene group, an ethylene group, a propylene group, a butylene group, a pentylene group, a hexylene group, a heptylene group, an octylene group, a nonylene group, a decylene group, a dodecylene group, a hexadecylene group, and the like. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, a hexadecanetriyl group, and the like. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, a hexadecanetetrayl group, and the like. These aliphatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, a cyclohexadecylene group, and the like. Examples of the alkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, a cyclohexadecanetriyl group, and the like. Examples of the alkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododacanetetrayl group, a cyclohexadecanetetrayl group, and the like. These alicyclic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Each aromatic group may contain a heteroatom and have a heterocyclic structure. Examples thereof include an arylene group having from 5 to 15 carbon atoms, an arenetriyl group having from 5 to 15 carbon atoms, and an arenetetrayl group having from 5 to 15 carbon atoms. Examples of the arylene group include a phenylene group, a naphthalenediyl group, and the like. Examples of the arenetriyl group (trivalent) include a benzenetriyl group, a naphthalenetriyl group, and the like. Examples of the arenetetrayl group (tetravalent) include a benzenetetrayl group, a naphthalenetetrayl group, and the like. These aromatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

In the Formulae (1-1) and (1-2), each of $X^1$ and $X^2$ may independently contain at least one of the heteroatom and monovalent substituent, and represents an aliphatic group having a valency of 2 to 4 and having from 1 to 20 carbon atoms, an alicyclic group having a valency of 2 to 4 and having from 3 to 20 carbon atoms, an aromatic group having a valency of 2 to 4 and having from 5 to 15 carbon atoms, or a combination of two or more groups selected from the above groups.

Examples of the aliphatic group include an alkylene group having from 1 to 20 carbon atoms, an alkanetriyl group having from 1 to 20 carbon atoms, an alkanetetrayl group having from 1 to 20 carbon atoms, and the like. Examples of the alkylene group include a methylene group, an ethylene group, a propylene group, a butylene group, a pentylene group, a hexylene group, a heptylene group, an octylene group, a nonylene group, a decylene group, a dodecylene group, a hexadecylene group, and the like. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, a hexadecanetriyl group, and the like. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, a hexadecanetetrayl group, and the like. These aliphatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, a cyclohexadecylene group, and the like. Examples of the alkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, a cyclohexadecanetriyl group, and the like. Examples of the alkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododecanetetrayl group, a cyclohexadecanetetrayl group, and the like. These alicyclic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Each aromatic group may contain a heteroatom and have a heterocyclic structure. Examples thereof include an arylene group having from 5 to 15 carbon atoms, an arenetriyl group having from 5 to 15 carbon atoms, and an arenetetrayl group having from 5 to 15 carbon atoms. Examples of the arylene group include a phenylene group, a naphthalenediyl group, and the like. Examples of the arenetriyl group (trivalent) include a benzenetriyl group, a naphthalenetriyl group, and the like. Examples of the arenetetrayl group (tetravalent) include a benzenetetrayl group, a naphthalenetetrayl group, and the like. These aromatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

In Formulae (1-1) and (1-2), each of s and k preferably represents an integer from 0 to 10, preferably an integer from 0 to 3, and more preferably an integer of 0 or 1. When s and k are 10 or smaller, it is possible to avoid cost increase resulting from the difficulties in synthesizing a cyclic carbodiimide compound. When s or k is 2 or greater, $X^1$ or $X^2$ as a repeating unit may be the same as or different from another $X^1$ or $X^2$.

In Formula (1-3), each $X^3$ may contain at least one of the heteroatom and monovalent substituent, and represents an aliphatic group having a valency of 2 to 4 and having from 1 to 20 carbon atoms, an alicyclic group having a valency of 2 to 4 and having from 3 to 20 carbon atoms, an aromatic group having a valency of 2 to 4 and having from 5 to 15 carbon atoms, or a combination of two or more groups selected from the above groups.

Examples of the aliphatic group include an alkylene group having from 1 to 20 carbon atoms, an alkanetriyl group having from 1 to 20 carbon atoms, an alkanetetrayl group having from 1 to 20 carbon atoms, and the like. Examples of the alkylene group include a methylene group, an ethylene group, a propylene group, a butylene group, a pentylene group, a hexylene group, a heptylene group, an octylene group, a nonylene group, a decylene group, a dodecylene group, a hexadecylene group, and the like. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, a hexadecanetriyl group, and the like. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an onctanetetrayl group, a nonanetetrayl group, a decanetetrayl group, a dodecanetetrayl group, a hexadecanetetrayl group, and the like. These aliphatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, a cyclohexadecylene group, and the like. Examples of the alkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, a cyclohexadecanetriyl group, and the like. Examples of the alkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecnaetetrayl group, a cyclododecanetetrayl group, a cyclohexadecanetetrayl group, and the like. These alicyclic groups may have substituents. Examples of the substituents include an alkyl group having from 1 to 20 carbon atoms, an arylene group having from 6 to 15 carbon atoms, a halogen atom, a nitro group, an amide group, a hydroxyl group, an ester group, an ether group, an aldehyde group, and the like.

Each aromatic group may contain a heteroatom and have a heterocyclic structure. Examples thereof include an arylene group having from 5 to 15 carbon atoms, an arenetriyl group having from 5 to 15 carbon atoms, and an arenetetrayl group having from 5 to 15 carbon atoms. Examples of the arylene group include a phenylene group, a naphthalenediyl group, and the like. Examples of the arenetriyl group (trivalent) include a benzenetriyl group, a naphthalenetriyl group, and the like. Examples of the arenetetrayl group (tetravalent) include a benzenetetrayl group, a naphthalenetetrayl group, and the like. These aromatic groups may have substituents. Examples of the substituents include an alkyl group having from 1 to 20 carbon atoms, an aryl group having from 6 to 15 carbon atoms, a halogen atom, a nitro group, an amide group, a hydroxyl group, an ester group, an ether group, an aldehyde group, and the like.

$Ar^1$, $Ar^2$, $R^1$, $R^2$, $X^1$, $X^2$, and $X^3$ may contain a heteroatom. When Q is a divalent bonding group, all of the $Ar^1$, $Ar^2$, $R^1$, $R^2$, $X^1$, $X^2$, and $X^3$ are divalent groups. When Q is a trivalent bonding group, one of the $Ar^1$, $Ar^2$, $R^1$, $R^2$, $X^1$, $X^2$, and $X^3$ is a trivalent group. When Q is a tetravalent bonding group, one of the $Ar^1$, $Ar^2$, $R^1$, $R^2$, $X^1$, $X^2$, and $X^3$ is a tetravalent group, or alternatively, two of the $Ar^1$, $Ar^2$, $R^1$, $R^2$, $X^1$, $X^2$, and $X^3$ are trivalent groups.

Examples of the cyclic carbodiimide compound include the compounds represented by the following (a) to (c).

(Cyclic Carbodiimide Compound (a))

Examples of the cyclic carbodiimide compound include a compound represented by the following Formula (2) (hereinafter, the compound will be referred to as "cyclic carbodiimide compound (a)" in some cases).

(2)

In Formula (2), $Q_a$ is a divalent bonding group which is an aliphatic group, an alicyclic group, an aromatic group, or a combination of two or more groups selected from the above groups, and may contain a heteroatom. The definition and details of the aliphatic group, the alicyclic group, the aromatic group, and the group which is a combination of these are the same as those described for the aliphatic group, the alicyclic group, the aromatic group, and the group which is a combination of these represented by Q of Formula (1). Here, in the compound of Formula (2), all of the aliphatic group, the alicyclic group, the aromatic group, and the group which is a combination of these represented by $Q_a$ are divalent. It is preferable that $Q_a$ is a divalent bonding group represented by the following Formula (2-1), (2-2), or (2-3).

(2-1)

(2-2)

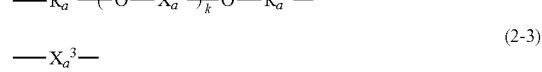

(2-3)

In the formulae, the definition and details of $Ar_a^1$, $Ar_a^2$, $R_a^1$, $R_a^2$, $X_a^1$, $X_a^2$, $X_a^3$, s, and k are the same as those described for $Ar^1$, $Ar^2$, $R^1$, $R^2$, $X^1$, $X^2$, $X^3$, s, and k in each of Formulae (1-1) to (1-3). Here, all of the $Ar_a^1$, $Ar_a^2$, $R_a^1$, $R_a^2$, $X_a^1$, $X_a^2$, and $X_a^3$ are divalent.

Examples of the cyclic carbodiimide compound (a) include the following compounds.

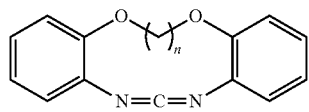

(*n* represents an integer from 1 to 6.)

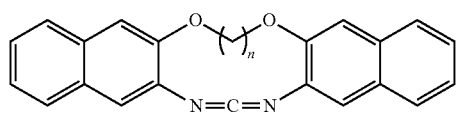

(*n* represents an integer from 1 to 6.)

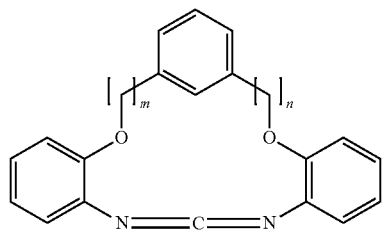

(*m* represents an integer from 0 to 3, and *n* represents an integer from 0 to 3.)

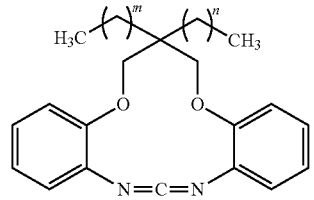

(*m* represents an integer from 0 to 5, and *n* represents an integer from 0 to 5.)

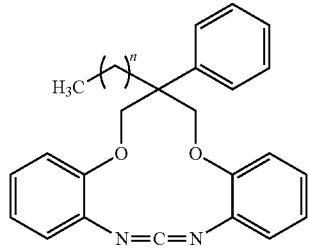

(*n* represents an integer from 0 to 5.)

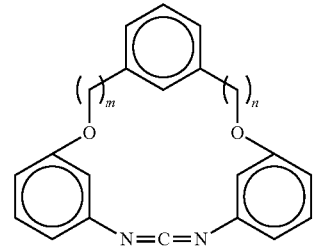

(*m* and *n* respectively represent an integer from 0 to 3.)

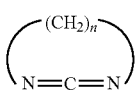

(*n* represents an integer from 5 to 20.)

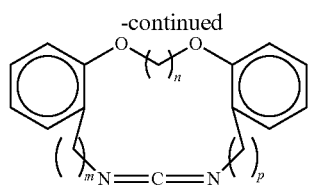

(*m*, *n*, *p*, and *q* respectively represent an integer from 1 to 6.)

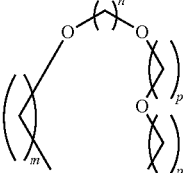

(*m*, *n*, *p*, and *q* respectively represent an integer from 1 to 6.)

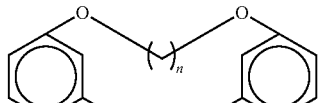

(*n* represents an integer from 1 to 6.)

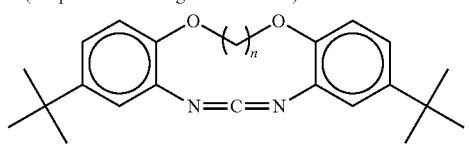

(*n* represents an integer from 1 to 6.)

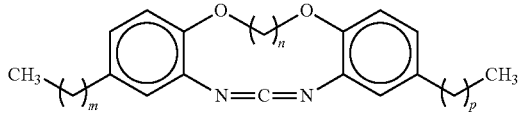

(*m* and *p* represent an integer from 1 to 5, and *n* represents an integer from 1 to 6.)

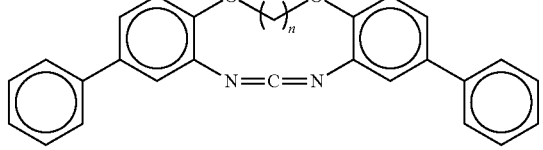

(*n* represents an integer from 1 to 6.)

(Cyclic Carbodiimide Compound (b))

Examples of the cyclic carbodiimide compound also include a compound represented by the following Formula (3) (hereinafter, the compound will be referred to as a "cyclic carbodiimide compound (b)" in some cases).

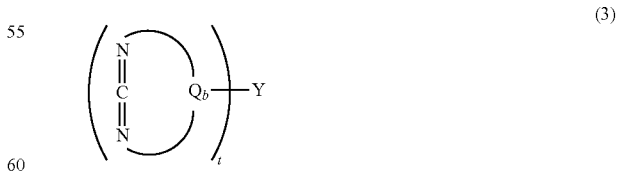

(3)

In Formula (3), $Q_b$ is a trivalent bonding group which is an aliphatic group, an alicyclic group, an aromatic group, or a combination of two or more groups selected from the above groups, and may contain a heteroatom. t represents an integer of 2 or greater. Y is a support that supports the cyclic structure. The definition and details of the aliphatic group, the alicyclic group, the aromatic group, and the group which is a combination of these are the same as those described for the aliphatic group, the alicyclic group, the aromatic group, and the group which is a combination of these represented by Q of Formula (1). Here, in the compound of Formula (3), $Q_b$ is trivalent. Accordingly, when $Q_b$ is a trivalent bonding group which is the combination, one of the groups which form the combination is trivalent.

It is preferable that $Q_b$ is a trivalent bonding group represented by the following Formula (3-1), (3-2), or (3-3).

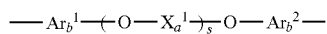
(3-1)

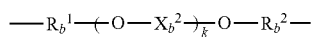
(3-2)

(3-3)

In Formulae (3-1), (3-2), and (3-3), the definition and details of $Ar_b^1$, $Ar_b^2$, $R_b^1$, $R_b^2$, $X_b^1$, $X_b^2$, $X_b^3$, s, and k are the same as those described for $Ar^1$, $Ar^2$, $R_1$, $R_2$, $X^1$, $X^2$, $X^3$, s, and k in each of Formulae (1-1) to (1-3). Here, one of the $Ar_b^1$, $Ar_b^2$, $R_b^1$, $R_b^2$, $X_b^1$, $X_b^2$, and $X_b^3$ is a trivalent group.

Y is preferably a single bond, a double bond, an atom, an atomic group, or a polymer. Plural cyclic structures are bonded to one another through Y and forms the structure represented by Formula (3).

Examples of the cyclic carbodiimide compound (b) include the following compounds.

(Cyclic Carbodiimide Compound (c))

Examples of the cyclic carbodiimide compound also include a compound represented by the following Formula (4) (hereinafter, the compound will be referred to as "cyclic carbodiimide compound (c)" in some cases).

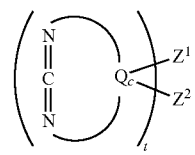
(4)

In Formula (4), $Q_c$ is a tetravalent bonding group which is an aliphatic group, an alicyclic group, an aromatic group, or a combination of two or more groups selected from the above groups, and may contain a heteroatom. t represents an integer of 2 or greater. $Z^1$ and $Z^2$ are supports that support the cyclic structure. $Z^1$ and $Z^2$ may form a cyclic structure by being bonded to each other.

The definition and details of the aliphatic group, the alicyclic group, the aromatic group, and the group which is a combination of these are the same as those described for the aliphatic group, the alicyclic group, the aromatic group,

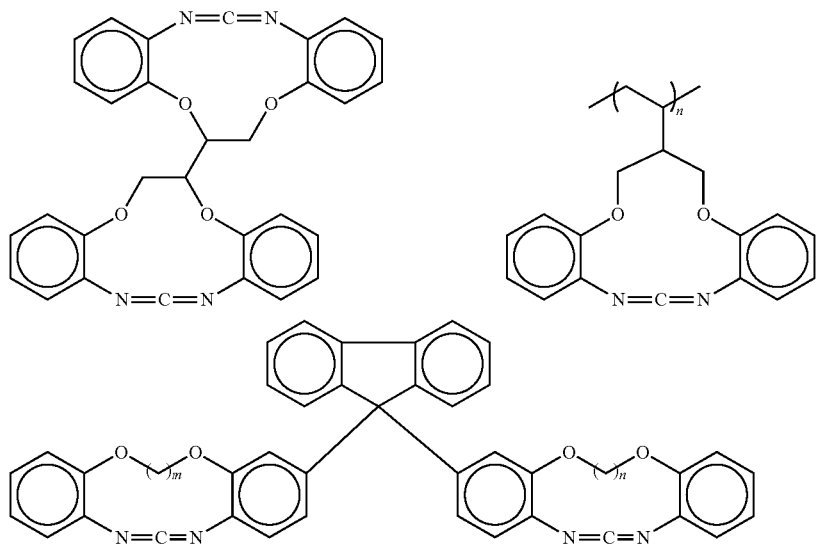

m and n respectively represent an integer from 1 to 6

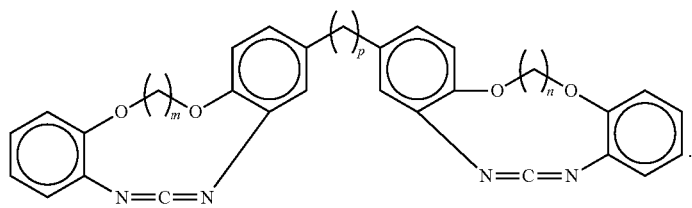

p, m and n respectively represent an integer from 1 to 6 and the group which is a combination of these represented by Q of Formula (1). Here, in the compound of Formula (4), $Q_c$ is tetravalent. Accordingly, when $Q_c$ is a tetravalent bonding group which is the combination, one of the groups which form the combination is a tetravalent group, or alternatively, two of the groups are trivalent groups.

Qc is preferably a tetravalent bonding group represented by the following Formula (4-1), (4-2), or (4-3).

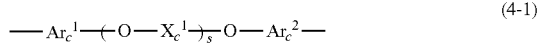

(4-1)

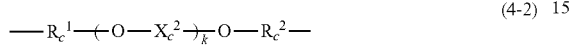

(4-2)

(4-3)

The definition and details of $Ar_c^1$, $Ar_c^2$, $R_c^1$, $R_c^2$, $X_c^1$, $X_c^2$, $X_c^3$, s, and k are the same as those described for $Ar^1$, $Ar^2$, $R^1$, $R^2$, $X^1$, $X^2$, $X^3$, s, and k in each of Formulae (1-1) to (1-3). Here, one of the $Ar_c^1$, $Ar_c^2$, $R_c^1$, $R_c^2$, $X_c^1$, $X_c^2$, and $X_c^3$ is a tetravalent group, or alternatively, two of $Ar_c^1$, $Ar_c^2$, $R_c^1$, $R_c^2$, $X_c^1$, $X_c^2$, and $X_c^3$ are trivalent groups.

It is preferable that each of $Z^1$ and $Z^2$ is independently a single bond, a double bond, an atom, an atomic group, or a polymer. Plural cyclic structures are bonded to one another through $Z^1$ and $Z^2$ and form the structure represented by Formula (4).

Examples of the cyclic carbodiimide compound (c) include the following compounds.

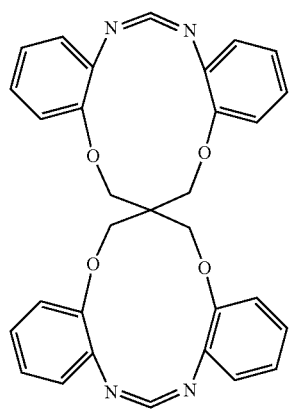

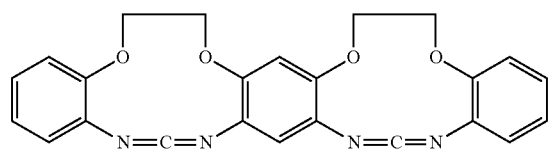

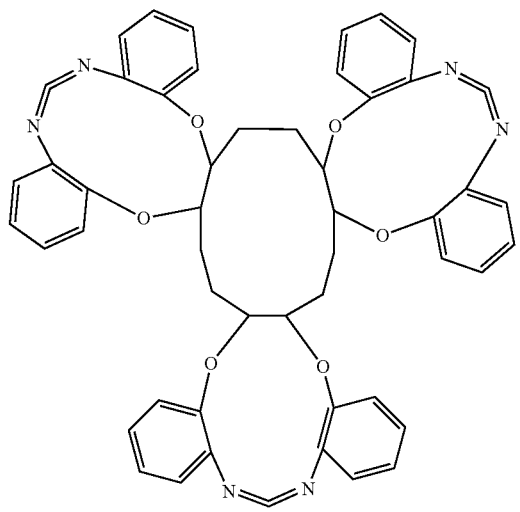

When a cyclic carbodiimide compound is added to polyester, the cyclic carbodiimide compound reacts with carboxylic acid at a terminus of the polyester, and a compound generated by the reaction reacts with a hydroxyl group at a terminus of the polyester or water in the polyester film, whereby various structures may be generated. Specifically, for example, in a case of using the following cyclic carbodiimide compound and using polyethylene terephthalate as polyester, a reaction product (1) or a reaction product (2) which are components having a structure derived from the cyclic carbodiimide component are generated by the following reaction scheme, and a part of the reaction product (1) or the reaction product (2) reacts with the hydroxyl group at a terminus of the polyester, and thus a reaction product (3) or a reaction product (4) may be generated.

Moreover, the presence of those reaction products in the film can be confirmed by analyzing the film by a nuclear magnetic resonance method (NMR method) or infrared absorption spectrometry (IR).

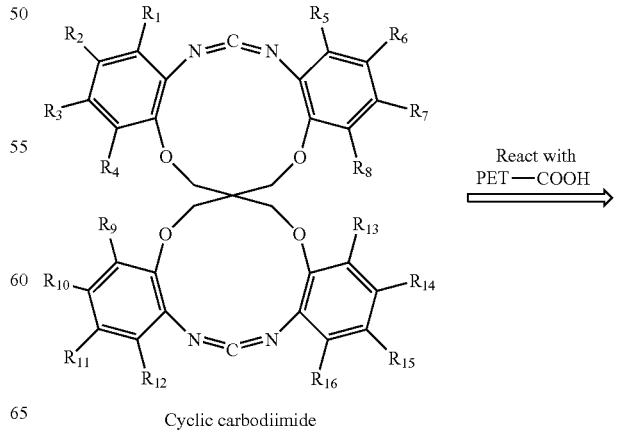

Cyclic carbodiimide

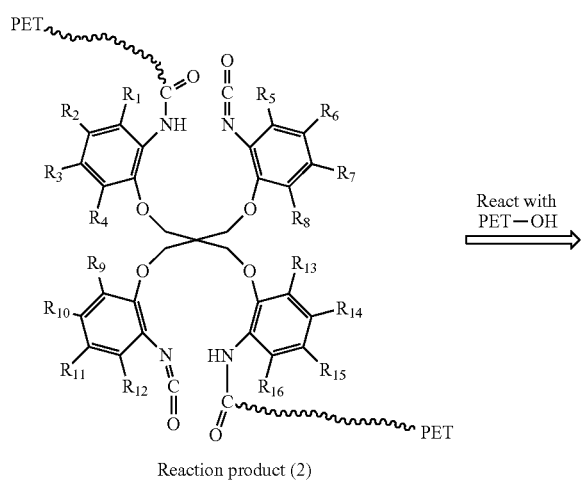

Reaction product (1)

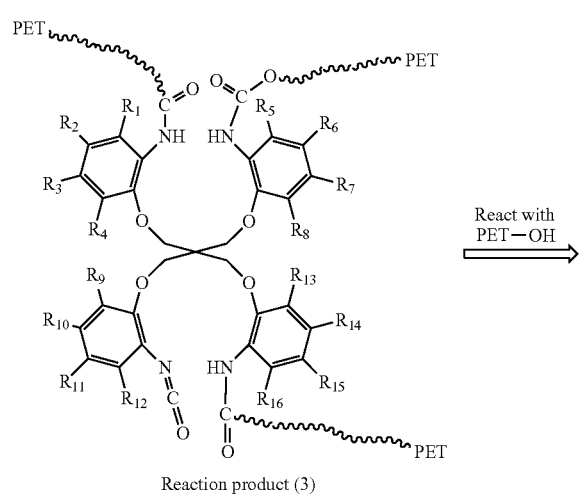

Reaction product (2)

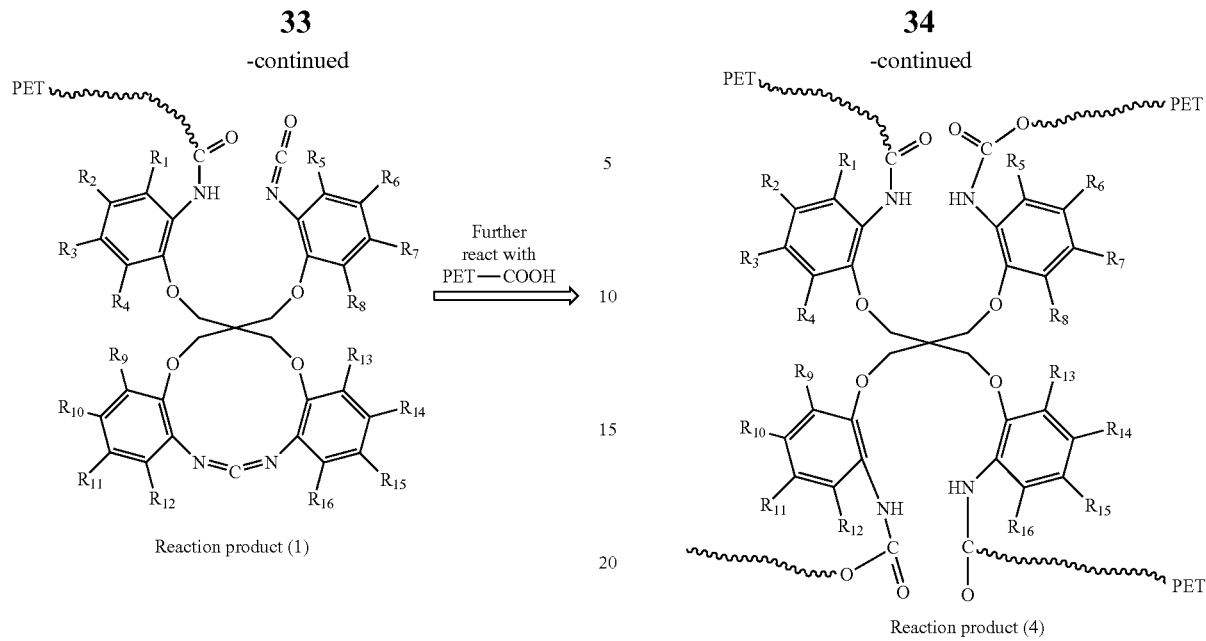

Reaction product (3)

Reaction product (4)

(Method of Producing Cyclic Carbodiimide Compound)

The cyclic carbodiimide compound can be synthesized with respect to the method described in JP-A No. 2011-256337 and the like.

—Structure Derived from 1,4-Cyclohexanedimethanol—

The polyester film as an embodiment of the invention may have at least one layer containing polyester that contains a structure derived from 1,4-cyclohexanedimethanol (hereinafter, abbreviated to "CHDM" in some cases) in the diol component (hereinafter, the polyester will also be referred to as "CHDM-based polyester").

(Composition of Layer Containing CHDM-Based Polyester)

(1) CHDM-Based Polyester

In the CHDM-based polyester, a content of the structure derived from 1,4-cyclohexanedimethanol is preferably from 0.1 mol % to 20 mol % or from 80 mol % to 100 mol %, more preferably from 0.5 mol % to 16 mol % or from 83 mol % to 98 mol %, and particularly preferably from 1 mol % to 12 mol % or from 86 mol % to 96 mol %, with respect to the total amount of the diol component (all of the diol).

The reason why there are two regions including a region in which the content of the CHDM-derived structure is small (0.1 mol % to 20 mol %) and a region in which the content is large (80 mol % to 100 mol %) is that the polyester can easily have a crystalline structure in these regions, and a high degree of dynamic strength and heat resistance are easily obtained.

If these CHDM-based polyesters are used, the flexibility and strength of the obtained polyester substrate is maintained within a more preferable range, and the obtained polyester film exhibits excellent durability in a humid and hot environment.

Typical examples of materials for forming units other than the 1,4-cyclohexanedimethanol-derived structure of the CHDM-based polyester include the diol component including aliphatic diol such as 1,2-propanediol, 1,3-propanediol, 1,4-butanediol, 1,2-butanediol, and 1,3-butanediol; alicyclic diol such as spiroglycol and isosorbide; and aromatic diol such as bisphenol A, 1,3-benzenedimethanol, 1,4-benzenedimethanol, and 9,9'-bis(4-hydroxyphenyl)fluorene; and the like, but the materials are not limited to these. Among these, it is preferable to use ethylene glycol.

Typical examples of materials for forming units other than the 1,4-cyclohexanedimethanol-derived structure of the CHDM-based polyester dicarboxylic acid components including aliphatic dicarboxylic acid such as malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethylmalonic acid; alicyclic dicarboxylic acids such as adamantane dicarboxylic acid, norbornene dicarboxylic acid, isosorbide, cyclohexane dicarboxylic acid, and decalin decarboxylic acid; aromatic dicarboxylic acids such as terephthalic acid, isophthalic acid, phthalic acid, 1,4-naphthalenedicarboxylic acid, 1,5-naphthalenedicarboxylic acid, 2,6-naphthalenedicarboxylic acid, 1,8-naphthalenedicarboxylic acid, 4,4'-diphenyldicarboxylic acid, 4,4'-diphenyletherdicarboxylic acid, sodium 5-sulfoisophthalate, phenyl indane dicarboxylic acid, anthracene dicarboxylic acid, phenanathrene dicarboxylic acid, and 9.9'-bis(4-carboxyphenyl) fluorene; ester derivatives of these; and the like, but the materials are not limited to these.

It is preferable that the polyester film contains at least a terephthalic acid-derived structure as the dicarboxylic acid component of the CHDM-based polyester.

Isophthalic acid (IPA) may be added to the dicarboxylic acid component of the CHDM-based polyester in addition to the terephthalic acid. The amount of IPA is preferably from 0 mol % to 15 mol %, more preferably from 0 mol % to 12 mol %, and even more preferably from 0 mol % to 9 mol % with respect to the total amount of the dicarboxylic acid.

[Ketenimine Compound]

The ketenimine compound that can be contained in the polyester raw material is not particularly limited, but is preferably the compound represented by the following Formulae (i) to (iv)

Formula (i)

In Formula (i), each of $R^1$ and $R^2$ independently represents an alkyl group, an aryl group, an alkoxy group, an alkoxycarbonyl group, an aminocarbonyl group, an aryloxy group, an acyl group, or an aryloxycarbonyl group, and $R^3$ represents an alkyl group or an aryl group.

In Formula (i), the molecular weight of a group $R^1$—C (=C)—$R^2$ represented by the following Partial Structure (i-1) is preferably 320 or more. If the molecular weight of the Partial Structure (i-1) is 320 or more, volatilization of the ketenimine compound caused at the time of producing the polyester film can be suppressed.

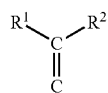

Partial Structure (i-1)

$R^1$ and $R^2$ in the Partial Structure (i-1) have the same definition as $R^1$ and $R^2$ in Formula (i)).

The ketenimine compound may contain a repeating structure as shown in the following Formulae (ii) to (iv).

In this case, at least one of the $R^1$ and $R^3$ is the repeating unit.

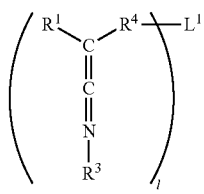

Formula (ii)

In Formula (ii), $R^1$ and $R^3$ have the same definition as $R^1$ and $R^3$ in Formula (i)). $R^4$ is a divalent group formed when one hydrogen atom is removed from $R^2$ in Formula (i). l represents an integer of 2 or greater, and $L^1$ represents a monovalent atom or linking group.

Provided that n=2, examples of $L^1$ in Formula (ii) include an oxygen atom, a sulfur atom, alkylene, arylene, and the like.

The ketenimine compound may be a compound represented by the following Formula (iii) or (iv).

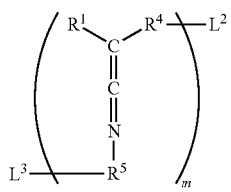

Formula (iii)

$R^1$ in Formula (iii) has the same definition as $R^1$ in Formula (i), and $R^4$ in Formula (iii) has the same definition as $R^4$ in Formula (ii). $R^5$ in Formula (iii) is a divalent group formed when one hydrogen atom is removed from $R^3$ in Formula (i). m represents an integer of 2 or greater. When $L^2$ and $L^3$ are linking groups for linking the repeating units put in the bracket of Formula (iii), $L^2$ and $L^3$ represent a single bond or a divalent linking group (for example, a divalent atom, alkylene, or arylene). Moreover, $L^2$ and $L^3$ may form a ring by being bonded to each other. Here, when $L^2$ and $L^3$ are terminals, each of $L^2$ and $L^3$ independently represents a hydrogen atom, an alkyl group, an aryl group, an alkoxy group, an alkoxycarbonyl group, an aminocarbonyl group, a aryloxy group, an acyl group, or an aryloxycarbonyl group.

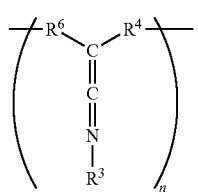

Formula (iv)

$R^3$ in Formula (iv) has the same definition as $R^3$ in Formula (i)), and $R^4$ in Formula (iii) has the same definition as $R^4$ in Formula (ii). $R^6$ in Formula (iii) is a divalent group formed when one hydrogen atom is removed from $R^1$ in Formula (i). n represents an integer of 2 or greater.

Exemplary compounds (including the compounds represented by Formulae (i) to (iv)) of the ketenimine compound will be shown below, but the invention is not limited thereto.
Exemplary compound (1)
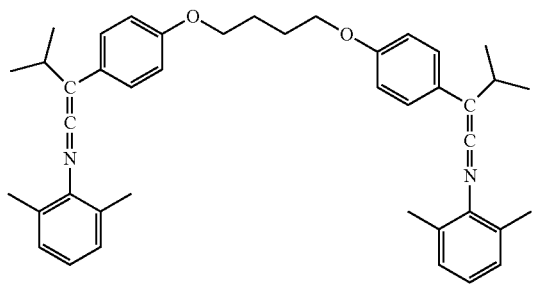
Exemplary compound (2)
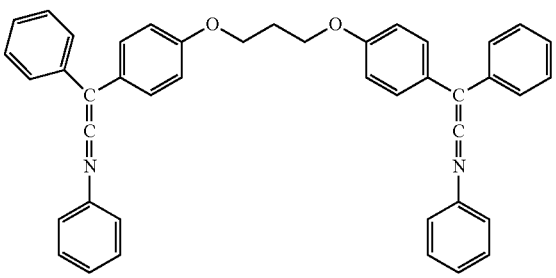
Exemplary compound (3)
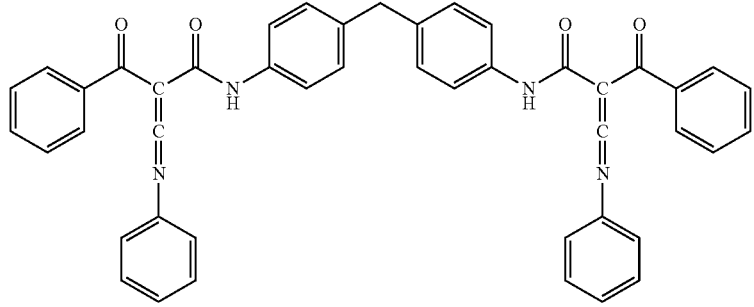
Exemplary compound (4)
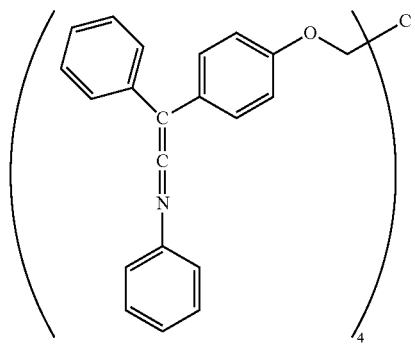
Exemplary compound (5)
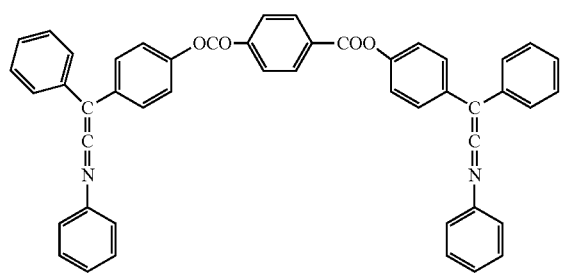
Exemplary compound (6)
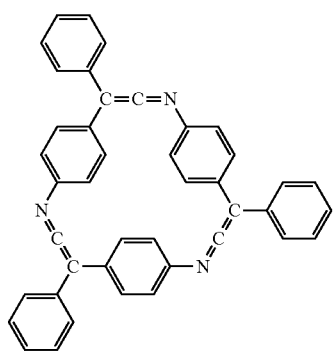

-continued
Exemplary compound (7)
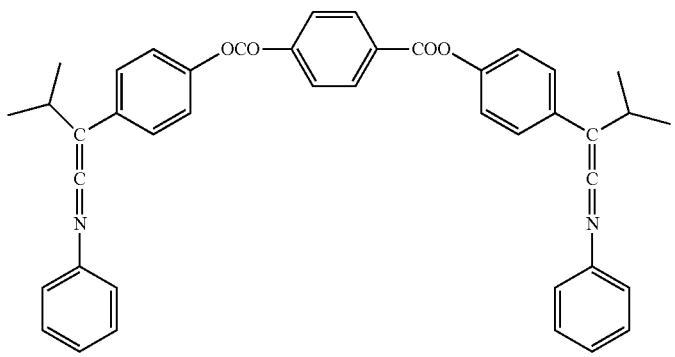
Exemplary compound (8)
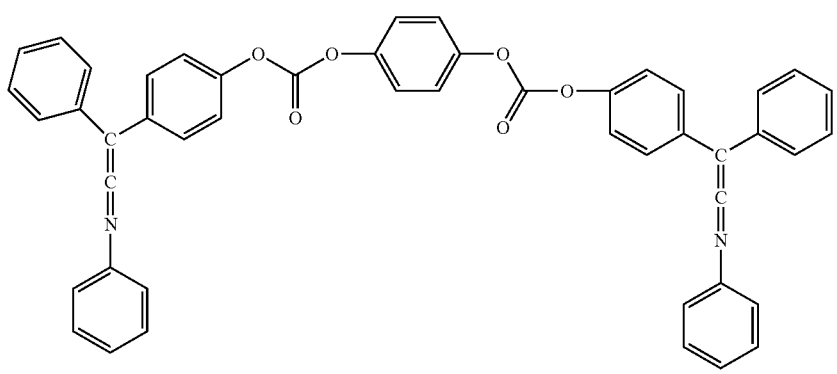
Exemplary compound (9)
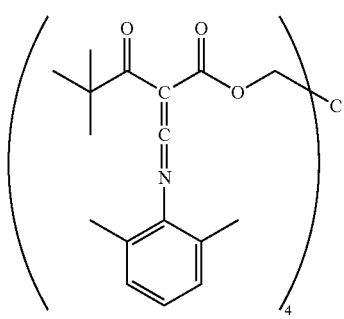
Exemplary compound (10)
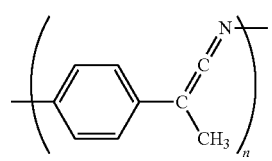
Exemplary compound (11)
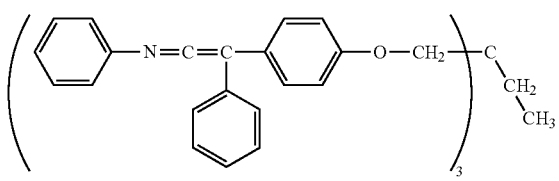
Exemplary compound (12)
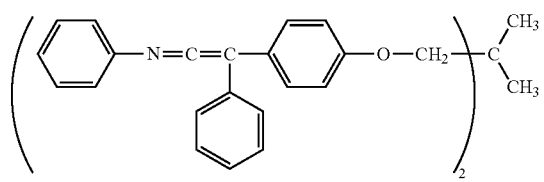
Exemplary compound (13)
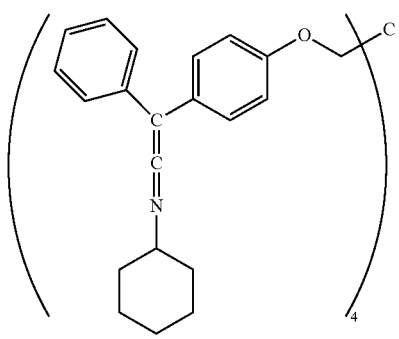
Exemplary compound (14)
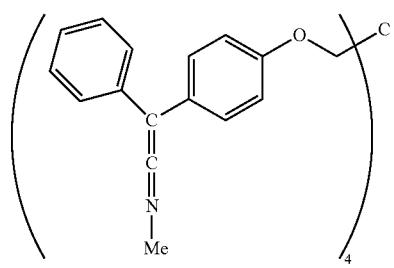

-continued
Exemplary compound (15)
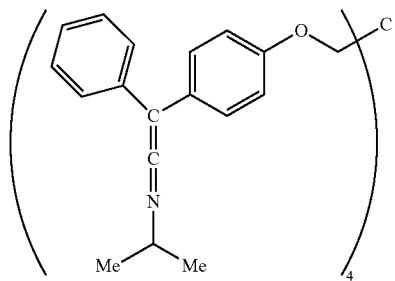
Exemplary compound (16)
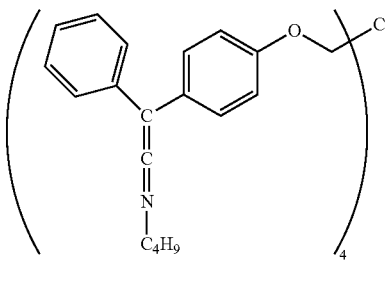
Exemplary compound (17)
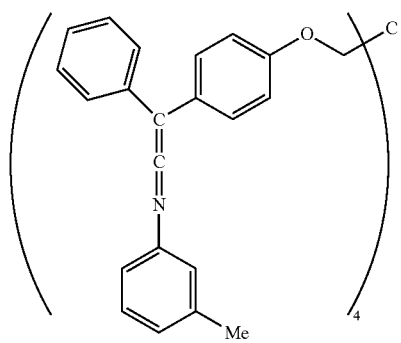
Exemplary compound (18)
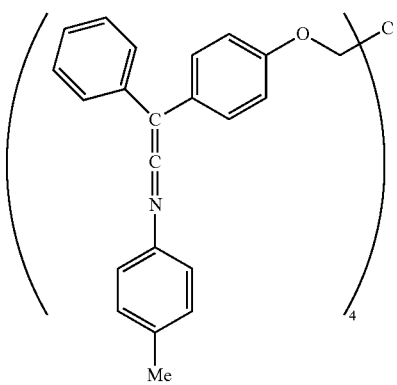
Exemplary compound (19)
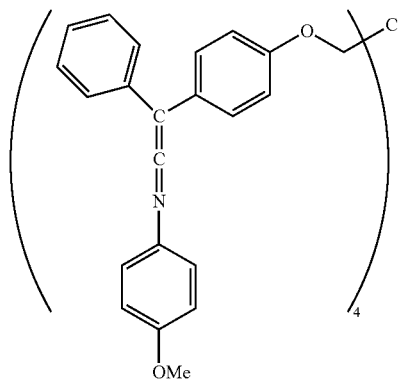
Exemplary compound (20)
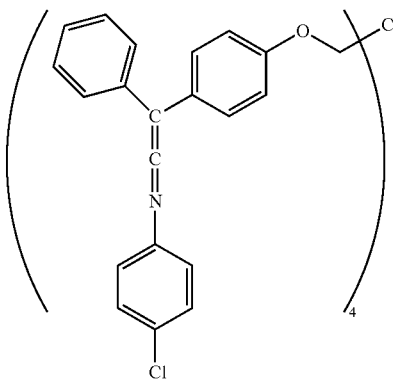
Exemplary compound (21)
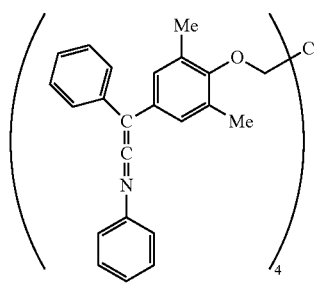
Exemplary compound (22)
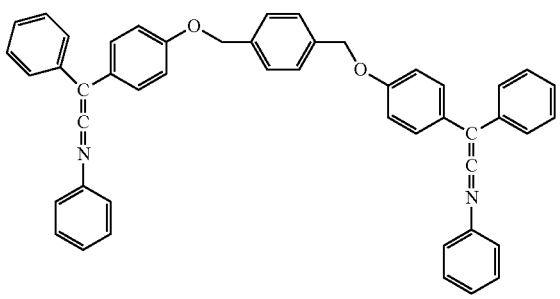

-continued
Exemplary compound (23)
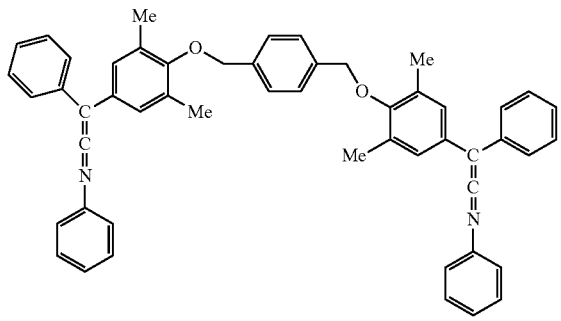
Exemplary compound (24)
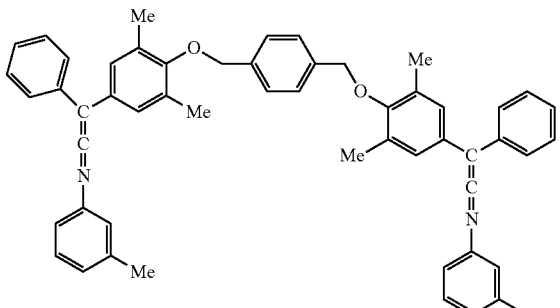
Exemplary compound (25)
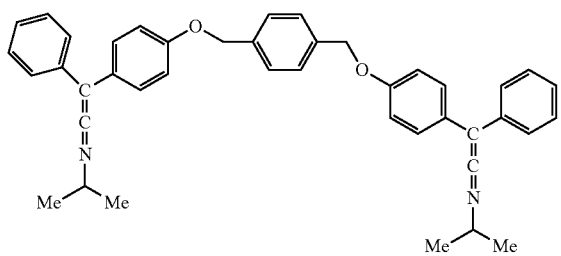
Exemplary compound (26)
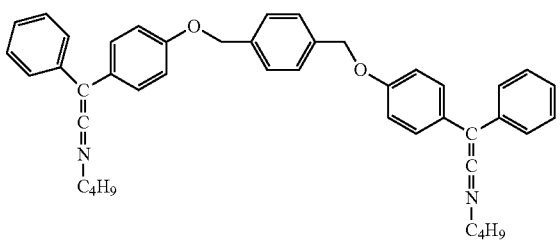
Exemplary compound (27)
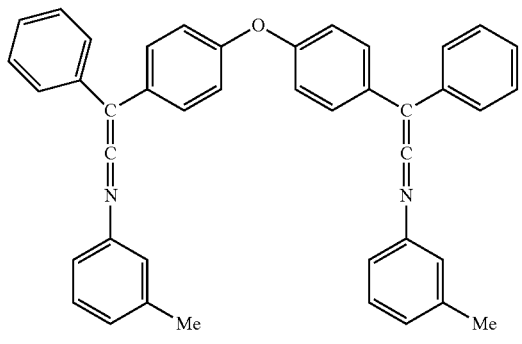
Exemplary compound (28)
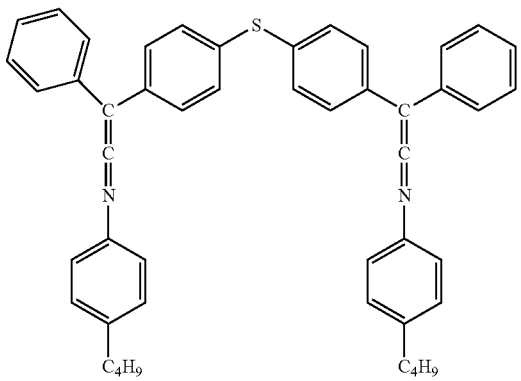
Exemplary compound (29)
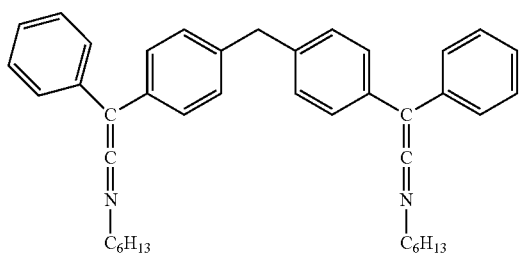
Exemplary compound (30)
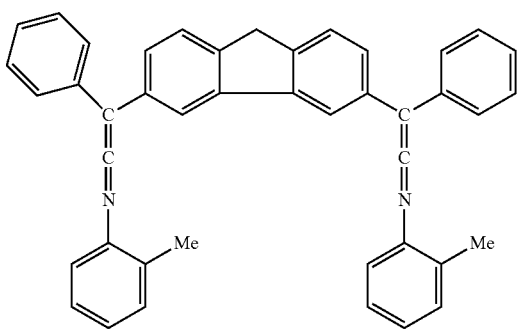

-continued
Exemplary compound (31)
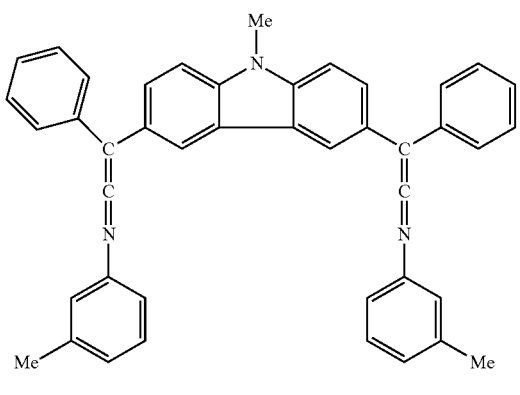
Exemplary compound (32)
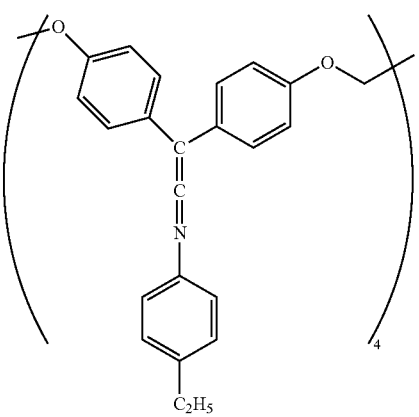
Exemplary compound (33)
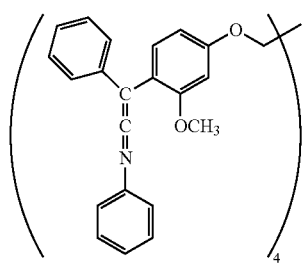
Exemplary compound (34)
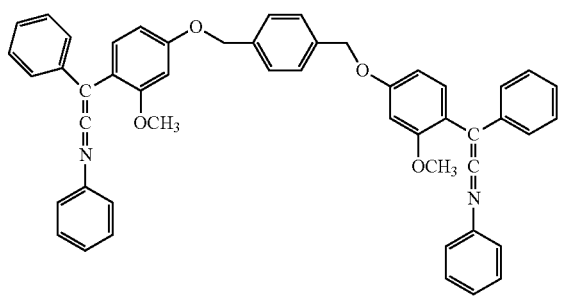
Exemplary compound (35)
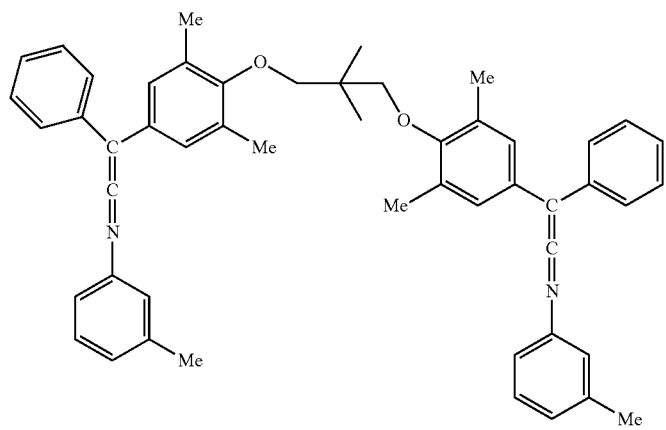
Exemplary compound (36)
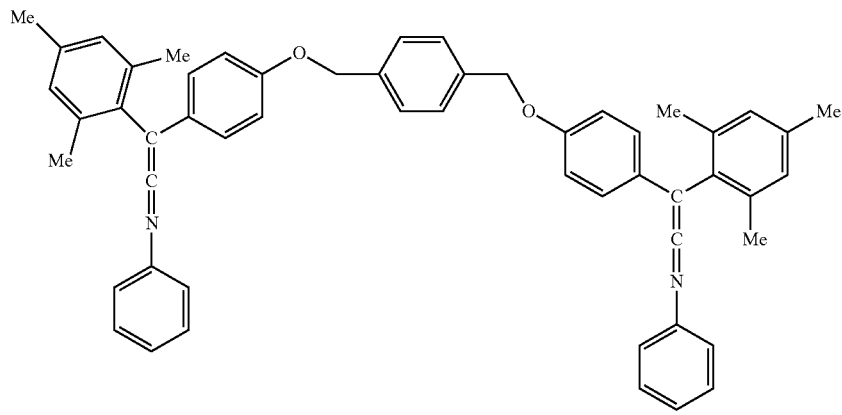

(Layering)

In a preferable embodiment, the polyester film has at least one layer containing the CHDM-based polyester. In this embodiment, the polyester film may include only one layer containing the CHDM-based polyester or may have a structure in which the CHDM-based polyester-containing layer and a layer having other compositions are layered on each other. Particularly, when the content of the CHDM-derived structure is from 80 mol % to 100 mol % with respect to the total amount of all constituents of the polyester film, it is preferable that the polyester film has a layered structure. When the proportion of the CHDM-derived structure is increased, weather resistance (hydrolysis resistance) of the polyester tends to be improved compared to polyethylene terephthalate (PET), but the dynamic strength thereof tends to be weakened. Accordingly, it is preferable that the CHDM-based polyester is layered on another polyester (for example, PET), since the polyeters can become complementary in this manner.

In one preferable embodiment, the polyester film has a configuration in which a layer (referred to as "P1 layer") which contains the CHDM-based polyester and a layer (referred to as "P2 layer") which contains polyethylene terephthalate as main component and includes polyester are layered.

The P2 layer refers to a layer that contains 95% or more of a terephthalic acid unit in the dicarboxylic acid unit and contains 95 mol % or more of an ethylene glycol unit in the diol unit.

IV of the P2 layer is preferably from 0.7 to 0.9, more preferably from 0.72 to 0.85, and even more preferably from 0.74 to 0.82. If the IV is set to a high level as above, decomposition (increase in molecular weight) at the time of wet- and dry-thermo process can be suppressed.

In the polyester film, a total number of layers including the P1 layer and the P2 layer is preferably 2 or greater, more preferably from 2 to 5, and even more preferably 2 to 4. Particularly, a three-layer structure in which both sides of the P2 layer is interposed between the P1 layer, a three-layer structure in which both sides of the P1 layer is interposed between the P2 layer, or a two-layer structure in which the P2 layer and the P1 layer are layered on each other is preferable.

When the polyester film includes two or more layers, the full thickness of the P1 layer is preferably from 5% to 40%, more preferably from 7% to 38%, and even more preferably from 10% to 35% of the total thickness of the film. If the full thickness of the P1 layer is set to be equal to or greater than the lower limit described above, a high degree of weather resistance can be obtained, and if it is set to be equal to or smaller than the upper limit described above, a high dynamic strength is easily obtained.

The layered structure can be prepared by common methods in which a melt (molten resin) supplied from plural extruders is formed into layers disposed on one another and extruded, by using a multi-manifold die or a feed-block die.

The thickness of each layer of the polyester film can be determined by measuring the cross-section of the film by using SIMS and imaging characteristic fragments of the P1 layer and the P2 layer.

As described above, as the polyester substrate, it is possible to use a polyester substrate containing at least one layer of the polyester film containing only the polyester, the polyester film containing the cyclic carbodiimide compound, the polyester film containing the ketenimine compound, or the CHDM-based polyester film.

(Melt-Extrusion)

In the film formation step, the raw material polyester obtained as above is subjected to melt-extrusion and then cooled, thereby forming a polyester film.

The melt-extrusion of the raw material polyester is performed by using, for example, an extruder having one or more screws and rotating the screw while heating the raw material polyester at a temperature equal to or higher than the melting point of the polyester. By being heated and kneaded by the screw, the raw material polyester is melted in the extruder and becomes a melt. From the viewpoint of suppressing thermolysis (hydrolysis of polyester) caused in the extruder, it is preferable to perform the melt-extrusion of the raw material polyester by purging the internal atmosphere of the extruder with nitrogen.

The molten raw material polyester (melt) passes through a gear pump, a filter, and the like and is extruded from an extrusion die. The extrusion die will also be simply referred to as "die" [see JIS B8650: 2006, a) extrusion molding machine, No. 134].

At this time, the melt may be extruded in the form of a single layer or multiple layers.

By being extruded onto a casting drum from the die, the melt (polyester) can be formed into a film.

The thickness of the polyester-molded article in the form of a film that is obtained by casting process is preferably from 0.5 mm to 5 mm, more preferably from 0.7 mm to 4.7 mm, and even more preferably from 0.8 mm to 4.6 mm.

If the thickness of the polyester-molded article in the form of a film is set to be 5 mm or less, delay of cooling that is caused by the heat accumulated in the melt is avoided. Moreover, if the thickness is set to be 0.5 mm or more, during the time period between extrusion and cooling, OH groups or COOH groups in the polyester are inhibited from diffusing into the polyester, whereby the OH groups or COOH groups that cause the hydrolysis are prevented from being exposed on the surface of the polyester.

Methods for cooling the melt extruded from the extrusion die are not particularly limited. In order to cool the melt, the melt may be exposed to cold air, brought into contact with a cast drum (cast drum for cooling), or sprayed with water. The melt may be cooled by one method or by a combination of two or more methods.

Among the above cooling methods, from the viewpoint of preventing oligomers from adhering onto the film surface during the continuous operation, at least one of the cooling method using cold air and cooling method using the cast drum is preferable. Moreover, it is particularly preferable that the melt extruded from the extruder is cooled by being exposed to cold air and brought into contact with the cast drum simultaneously.

The polyester-molded article cooled by the cast drum and the like is separated from the cooling member such as the cast drum by using a separation member such as a separation roll.

—Terminal Blocking Agent—

In the method of producing the polyester film, it is preferable that the film formation step includes a step in which at least one terminal blocking agent selected from the group consisting of oxazoline-based compounds, carbodiimide compounds, epoxy compounds, and ketenimine compounds is added in an amount of from 0.1% by mass to 5% by mass to the raw material polyester, and the resultant is subjected to melt-extrusion. That is, it is preferable to concurrently use the terminal blocking agent at the time of melt-extrusion of the raw material polyester. By the concurrent use of the terminal blocking agent, the terminal of the polyester molecule reacts with the encapsulant, whereby the terminal portion of the molecular chain becomes bulky, and the number of fine concavities and convexities of the surface of the obtained polyester film increases. Accordingly, an anchoring effect is easily exhibited, and the adhesive force between the polyester film and the material adjacent thereto becomes excellent.

The terminal blocking agent can be added at any time without particular limitation, as long as the encapsulant is added at a stage between the time when the raw material of the polyester film is put into the extruder and the time when the raw material is extruded from the extruder. However, it is preferable that the terminal blocking agent is added at a stage during the process, which is performed after the raw material polyester is dried and in which the raw material polyester is put into the extruder, send by the screw, and extruded from the extruder, and to be subjected to melt-kneading together with the raw material polyester.

For example, after the raw material polyester is dried, the terminal blocking agent may be put into the extruder together with the raw material polyester. Moreover, a supply port for supplying the terminal blocking agent may be placed between a raw material injection portion of the extruder for performing melt-kneading and a discharge port of the molten polyester (melt), and the terminal blocking agent may be directly added to the raw material polyester in the extruder. At this time, though the terminal blocking agent has been started to be heated and kneaded, it may be added to the polyester that has not yet been completely melted or added to the molten polyester (melt).

As the terminal blocking agent, compounds having a carbodiimide group, an epoxy group, or an oxazoline group are preferable. Specific examples of preferable terminal blocking agents include carbodiimide compounds, epoxy compounds, oxazoline-based compounds, ketenimine compounds, and the like. Among these compounds, the cyclic carbodiimide compounds and ketenimine compounds are preferable.

The following carbodiimid compounds (hereinafter, also referred to as "other carbodiimide compounds") that differ from the carbodiimie compounds with a cyclic structure in terms of the structure are also useful as the terminal blocking agent.

Other carbodiimide compounds having a carbodiimide group are monofunctional and polyfunctional carbodiimides. Examples of the monofunctional carbodiimide include dicyclohexylcarbodiimide, diisopropylcarbodiimide, dimethylcarbodiimide, diisobutylcarbodiimide, dioctylcarbodiimide, t-butylisopropylcarbodiimide, diphenylcarbodiimide, di-t-butylcarbodiimide, di-β-naphthylcarbodiimide, and the like. Among these, dicyclohexylcarbodiimide or diisopropylcarbodiimide is preferable.

As the polyfunctional carbodiimide, polycarbodiimides having a degree of polymerization of from 3 to 15 are preferable. The polycarbodiimides generally have a repeating unit represented by "—R—N=C=N—" or the like, and R represents a divalent linking group such as alkylene or arylene. Examples of such a repeating unit include 1,5-naphthalenecarbodiimide, 4,4'-diphenylmethanecarbodiimide, 4,4'-diphenyldimethylmethanecarbodiimide, 1,3-phenylenecarbodiimide, 1,4-phenylenediisocyanate, 2,4-tolylenecarbodiimide, 2,6-tolylenecarbodiimide, a mixture of 2,4-tolylenecarbodiimide and 2,6-tolylenecarbodiimide, hexamethylenecarbodiimide, cyclohexane-1,4-carbodiimide, xylylenecarbodiimide, isophoronecarbodiimide, dicyclohexylmethane-4,4'-carbodiimide, methylcyclohexanecarbodiimide, tetramethylxylylenecarbodiimide, 2,6-diisopropylphenylcarbodiimide, 1,3,5-triisopropylbenzene-2,4-carbodiimide, and the like.

As other carbodiimide compounds described above, from the viewpoint of suppressing generation of isocyanate-based gas by thermolysis, carbodiimide compounds having a high degree of heat resistance are preferable. In order to improve the heat resistance, it is preferable to increase the molecular weight (degree of polymerization), and it is more preferable to form a structure having a high degree of heat resistance at the terminal of the carbodiimide compounds. Moreover, if the temperature at which the raw material polyester has undergone melting/extrusion is decreased, the effect of improving weather resistance and decreasing a degree of thermal contraction that is obtained by other carbodiimide compounds is more effectively obtained.

The amount of isocyanate-based gas generated when the polyester film, which uses the cyclic carbodiimide compound or other carbodiimide compounds, is held at 300° C. for 30 minutes is preferably from 0% by mass to 0.02% by mass. If the amount of isocyanate-based gas generated is 0.02% by mass or less, air bubbles (voids) are not easily generated in the polyester film, and accordingly, a portion to which stress is concentrated is not easily formed. Accordingly, it is possible to prevent breaking or separation that is easily caused in the polyester film. Consequently, the adhesiveness between the polyester film and materials adjacent thereto becomes excellent.

Herein, the isocyanate-based gas is gas having an isocyanate group, and examples thereof include diisopropylphenyl isocyanate, 1,3,5-triisopropylphenyl diisocyanate, 2-amino-1,3,5-triisopropylphenyl-6-isocyanate, 4,4'-dicyclohexylmethane diisocyanate, isophorone diisocyanate, cyclohexyl isocyanate, and the like.

Preferable examples of the epoxy compound having an epoxy group include glycidyl ester compounds, glycidyl ether compounds, and the like.

Specific examples of the glycidyl ester compounds include benzoic acid glycidyl ester, t-Bu-benzoic acid glycidyl ester, P-toluic acid glycidyl ester, cyclohexane carboxylic acid glycidyl ester, pelargonic acid glycidyl ester, stearic acid glycidyl ester, lauric acid glycidyl ester, palmitic acid glycidyl ester, behenic acid glycidyl ester, versatic acid glycidyl ester, oleic acid glycidyl ester, linoleic acid glycidyl ester, linolenic acid glycidyl ester, behenolic acid glycidyl ester, stearolic acid glycidyl ester, terephthalic acid diglycidyl ester, isophthalic acid diglycidyl ester, phthalic acid diglycidyl ester, naphthalene dicarboxylic acid diglycidyl ester, methyl terephthalic acid diglycidyl ester, hexahydrophthalic acid diglycidyl ester, tetrahydrophthalic acid diglycidyl ester, cyclohexane dicarboxylic acid diglycidyl ester, adipic acid diglycidyl ester, succinic acid diglycidyl ester, sebacic acid diglycidyl ester, dodecanedioic acid diglycidyl ester, octadecane dicarboxylic acid diglycidyl ester, trimellitic acid triglycidyl ester, pyromellitic acid tetraglycidyl ester, and the like.

Specific examples of the glycidyl ether compounds include bisglycidyl polyethers and the like obtained by a reaction between bisphenol and epichlorohydrin, such as phenyl glycidyl ether, O-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyloxyethane, 2,2-bis[p-(β,γ-epoxypropoxy)phenyl]propane, 2,2-bis-(4-hydroxyphenyl)propane, and 2,2-bis(4-hydroxyphenyl)methane.

The oxazoline compounds can be used by being appropriately selected from compounds having an oxazoline group. Among the compounds, bisoxazoline compounds are preferable.

Examples of the bisoxazoline compounds include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-buty-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylenebis(2-oxazoline), 2,2'-m-phenylenebis(2-oxazoline), 2,2'-o-phenylenebis(2-oxazoline), 2,2'-p-phenylenebis(4-methyl-2-oxazoline), 2,2'-p-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'-octamethylenebis(2-oxazoline), 2,2'-decamethylenebis(2-oxazoline), 2,2'-ethylenebis(4-methyl-2-oxazoline), 2,2'-tetramethylenebis(4,4-dimethyl-2-oxazoline), 2,2'-9,9'-diphenoxyethanebis(2-oxazoline), 2,2'-cyclohexylenebis(2-oxazoline), 2,2'-diphenylenebis(2-oxazoline), and the like. Among these, 2,2'-bis(2-oxazoline) is most preferable since this compound exhibits excellent reactivity with respect to polyester and improves the weather resistance to a high degree.

The bisoxazoline compound may be used singly or in combination of two or more kinds thereof, as long as the compound does not diminish the effects of the invention.

An amount of the terminal blocking agent with respect to the polyester is preferably from 0.1% by mass to 5% by mass with respect to the total mass of the raw material polyester. The amount of the terminal blocking agent with respect to the raw material polyester is preferably from 0.3% by mass to 4% by mass, and more preferably from 0.5% by mass to 2% by mass.

If the proportion of the terminal blocking agent added is 0.1% by mass or more, the weather resistance can be improved by the AV reduction effect, and low-heat contractility can be imparted to the film. If the proportion of the terminal blocking agent added is 5% by mass or less, decrease in the glass transition temperature (Tg) of the polyester that is caused by the addition of the terminal blocking agent is suppressed, and accordingly, it is possible to suppress deterioration of the weather resistance and increase in the degree of thermal contraction. This is because the increase in the degree of hydrolysis that is caused when the reactivity of the polyester is relatively improved as the Tg decreases is suppressed, and the thermal contraction that is caused when the motility of the polyester molecules is easily improved by the decrease of the Tg is suppressed.

[Vertical Stretching Step]

In the vertical stretching step, the polyester film obtained by the film formation step is vertically stretched in the longitudinal direction of the polyester film.

The film can be vertically stretched by, for example, the following manner. That is, the film is caused to pass through a pair of nip rolls that interpose the film therebetween, and while the film is being transported in the longitudinal direction thereof, two or more pairs of nip rolls that line up in the transport direction of the film are used to stretching the film.

Specifically, for example, when a pair of nip rolls A is disposed at the upstream side of the transport direction of the film, and a pair of nip rolls B is disposed at the downstream side thereof, for transporting the film, if the rotation speed of the nip rolls B at the downstream side is set to be higher than the rotation speed of the nip roll A of the upstream side, the film is stretched in the transport direction (MD; Machine Direction).

Moreover, two or more pairs of nip rolls may be independently disposed at each of the upstream side and downstream side.

Alternatively, the polyester film may be vertically stretched using a vertical stretching apparatus having the above nip rolls.

In the vertical stretching step, an areal stretch ratio (product of respective stretch ratios) of the polyester film is preferably from 3.0-fold to 3.8-fold and more preferably from 3.1-fold to 3.7-fold of the area of the unstretched polyester film. If the ratio is 3.0-fold or higher, the molecules are sufficiently orientated in the longitudinal direction, and the hydrolysis resistance is improved, whereby the polyester film does not easily deteriorate in a humid and hot environment. Moreover, if the ratio is 3.8-fold or less, it is possible to inhibit the molecules from being orientated in the form of a layer to an excessive degree.

Provided that the glass transition temperature of the polyester film is Tg, the temperature at the time of vertical stretching of the polyester film (hereinafter, also referred to as "vertical stretching temperature") is preferably from a temperature which is higher than Tg by 5° C. to a temperature which is higher than Tg by 30° C., and more preferably from a temperature which is higher than Tg by 5° C. to a temperature which is higher than Tg by 25° C. If the temperature is Tg+30° C. or lower, the molecules are sufficiently aligned in the longitudinal direction, and the hydrolysis resistance is improved, whereby the polyester film does not easily deteriorate in a humid and hot environment. Moreover, if the temperature is Tg+5° C. or higher, it is possible to inhibit the molecules from being aligned in the form of a layer to an excessive degree.

When being stretched using rolls such as nip rolls, the polyester film can be heated by a method in which a heater or piping through which a warm solvent can flow is disposed inside the rolls so as to heat the polyester film that comes into contact with the rolls. Moreover, even if the rolls are not used, the polyester film can be heated by being exposed to warm air, being brought into contact with a heat source such as a heater, or being caused to pass through a portion in the vicinity of the heat source.

The method of producing the polyester film includes, in addition to the vertical stretching step, a horizontal stretching step, which will be described later. Accordingly, in this production method, the polyester film is stretched at least two directions including the longitudinal direction (transport direction, MD) of the polyester film and the direction (TD: Transverse Direction) orthogonal to the longitudinal direction of the polyester film. The polyester film may be stretched at least once in each of the MD direction and TD direction.

The "directon (TD) orthogonal to the longitudinal direction (transport direction, MD) of the polyester film" means a direction that is at right angle (90°) to the longitudinal direction (transport direction, MD) of the polyester film, but TD may be within a range of instrumental errors. The "range of instrumental errors" refers to a direction that can be regarded as being at an angle (90°±5°) vertical to the longitudinal direction (transport direction, MD) of the polyester.

The method of biaxial stretching may be either a sequential biaxial stretching method in which the vertical stretching and horizontal stretching are separately performed or a simultaneous biaxial stretching method in which the vertical stretching and horizontal stretching are performed simultaneously.

Each of the vertical stretching and horizontal stretching may be independently performed twice or further, and the vertical stretching and horizontal stretching may be performed in any order. For example, the film may be stretched in order of "vertical stretching, and then horizontal stretching", "vertical stretching, horizontal stretching, and then vertical stretching", "vertical stretching, vertical stretching, and then horizontal stretching", "horizontal stretching, and then vertical stretching", or the like. Among these, the order of "vertical stretching, and then horizontal stretching" is preferable.

Next, the horizontal stretching step will be described in detail.

[Horizontal Stretching Step]

In the horizontal stretching step, the polyester film is horizontally stretched by being transported at least to a preheating portion that preheats the polyester film obtained by the film formation step; a stretching portion that horizontally stretches the preheated polyester film while applying tension in at least a direction orthogonal to the longitudinal direction of the polyester film; a thermal fixing portion that thermally fixes the tensioned polyester film by heating; and a thermal relaxation portion that release tension of the thermally fixed polyester film by heating, in this order.

The horizontal stretching step is performed by any means without limitation, as long as the polyester film is at least horizontally stretched by the above process. However, it is preferable to use a horizontal stretching apparatus or a biaxial stretching machine that can perform the above process.

Moreover, in the horizontal stretching step, it is preferable to cool the polyester film that has passed through the thermal relaxation portion.

Hereinafter, the horizontal stretching step will be described in detail by describing a biaxial stretching machine.

(Biaxial Stretching Machine)

FIG. 1 shows an example (top view) of a biaxial stretching machine.

FIG. 1 shows a biaxial stretching machine 100 and a polyester film 200 that is mounted on the biaxial stretching machine 100. The biaxial stretching machine 100 has a pair of cyclic rails 60a and 60b that are arranged symmetrically while interposing the polyester film 200 therebetween.

The biaxial stretching machine 100 is divided into: a preheating portion 10 that preheats the polyester film 200; a stretching portion 20 that applies tension to the polyester film 200 by stretching the polyester film in the direction indicated by the arrow TD orthogonal to the direction indicated by the arrow MD; a thermal fixing portion 30 that heats the polyester film in the tensioned state; a thermal relaxation portion 40 that releases the tension of the thermally fixed polyester film by heating the film; and a cooling portion 50 that cools the polyester film that has passed through the thermal relaxation portion.

The cyclic rail 60a includes at least gripping members 2a, 2b, 2e, 2f, 2i, and 2j that can move around the rim of the cyclic rail 60a. The cyclic rail 60b includes at least gripping members 2c, 2d, 2g, 2h, 2k, and 2l that can move around the rim of the cyclic rail 60b. The gripping members 2a, 2b, 2e, 2f, 2i, and 2j grip one end of the polyester film 200 in the TD direction, and the gripping members 2c, 2d, 2g, 2h, 2k, and 2l grip the other end of the polyester film 200 in the TD direction. The gripping members 2a to 2l are generally called chucks, clips, and the like.

The gripping members 2a, 2b, 2e, 2f, 2i, and 2j move counter clockwise along the rim of the cyclic rail 60a, and the gripping members 2c, 2d, 2g, 2h, 2k, and 2l move clockwise along the rim of the cyclic rail 60b.

The gripping members 2a to 2d grip the end of the polyester film 200 in the preheating portion 10. In this state, the gripping members move along the rim of the cyclic rail 60a or 60b, pass through the stretching portion 20 or the thermal relaxation portion 40 in which the gripping members 2e to 2h are positioned, and move to the cooling portion 50 in which the gripping members 2i to 2l are positioned. Thereafter, the gripping members 2a and 2b and the gripping members 2c and 2d move along the transport direction, and release end of the polyester film 200 when they reach the end of the downstream side of the cooling portion 50 in the MD direction. In this state, the gripping members keep moving along the rim of the cyclic rail 60a or 60b and return to the preheating portion 10.

As a result, the polyester film 200 moves in the direction indicated by the arrow MD in FIG. 1 and is transported to the preheating portion 10, the stretching portion 20, the thermal fixing portion 30, the thermal relaxation portion 40, and the cooling portion 50 in this order.

The movement speed of the gripping members 2a to 2l is the transport speed of the gripped portion of the polyester film 200.

The movement speed of each of the gripping members 2a to 2l can be varied independently.

Accordingly, although the biaxial stretching machine 100 can horizontally stretch the polyester film 200 in the TD direction in the stretching portion 20, by varying the movement speed of the gripping members 2a to 2l, the polyester film 200 can also be stretched in the MD direction.

That is, the polyester film can be biaxially stretched at the same time by using the biaxial stretching machine 100.

FIG. 1 merely shows twelve gripping members 2a to 2l that grip the edge of the polyester film 200 in the TD direction. However, in order to support the polyester film 200, the biaxial stretching machine 100 also has other gripping members not shown in the stretching in addition to 2a to 2l.

Hereinafter, the gripping members 2a to 2l will be collectively referred to as "gripping members 2" in some cases.

(Preheating Portion)

In the preheating portion 10, the polyester film 200 is preheated. The polyester film 200 is preheated before being stretched, and this makes it easy to perform horizontal stretching of the polyester film 200.

Provided that the glass transition temperature of the polyester film 200 is Tg, the film surface temperature (hereinafter, also referred to as "preheating temperature" in some cases) at the end point of the preheating portion is preferably from a temperature which is lower than Tg by 10° C. to a temperature which is higher than Tg by 60° C., and more preferably from Tg to a temperature which is higher than Tg by 50° C.

The end point of the preheating portion refers to the point in time when the preheating of the polyester film 200 ends, that is, the position in which the polyester film 200 is separated from the area of the preheating portion 10.

(Stretching Portion)

In the stretching portion 20, the preheated polyester film 200 is horizontally stretched in at least the direction (TD)

orthogonal to the longitudinal direction (transport direction, MD) of the polyester film 200 such that tension is applied to the polyester film 200.

As described above, the polyester film 200 is stretched (horizontally stretched) in the direction (TD) orthogonal to the longitudinal direction (transport direction, MD) of the polyester film 200, such that the film is stretched in the direction that is at right angle (90°) to the longitudinal direction (transport direction, MD) of the polyester film 200. However, the film may be stretched in the direction within a range of instrumental errors. The "range of instrumental errors" refers to a direction that can be regarded as being at an angle (90°±5°) vertical to the longitudinal direction (transport direction, MD) of the polyester.

In the stretching portion 20, the tension (stretching tension) that is applied to the polyester film 200 for horizontal stretching is from 0.1 t/m to 6.0 t/m.

Moreover, an areal stretch ratio (product of respective stretch ratios) of the polyester film 200 is preferably from 6-fold to 18-fold, more preferably from 8-fold to 17.5-fold, even more preferably from 10-fold to 17-fold, and still more preferably from 11-fold to 17-fold of the area of the unstretched polyester film 200.

Further, provided that the glass transition temperature of the polyester film 200 is Tg, the film surface temperature (hereinafter, also referred to as "horizontal stretching temperature" in some cases) at the time of horizontal stretching of the polyester film 200 is preferably from a temperature which is lower than Tg by 10° C. to a temperature which is higher than Tg by 100° C., more preferably from Tg to a temperature which is higher than Tg by 90° C., and even more preferably from a temperature which is higher than Tg by 10° C. to a temperature which is higher than Tg by 80° C.

As described above, the movement speed of each of the gripping members 2 (gripping members 2a to 2l) can be varied independently. For example, if the movement speed of the gripping members 2 in the downstream side of the stretching portion 20 such as the stretching portion 20, the thermal fixing portion 30, and the like in the MD direction is set to be higher than the movement speed of the gripping members 2 in the preheating portion 10, vertical stretching by which the polyester film 200 is stretched in the transport direction (MD) can also be concurrently performed.

The vertical stretching of the polyester film 200 in the horizontal stretching step may be performed only in the stretching portion 20 or performed in the thermal fixing portion 30, the thermal relaxation portion 40, or the cooling portion 50 which will be described later. The vertical stretching may be performed at plural sites.

(Thermal Fixing Portion)

In the thermal fixing portion 30, the tensioned polyester film 200 is thermally fixed by heating. At this time, it is preferable that the polyester film 200 is heated such that the highest film surface temperature thereof becomes from 160° C. to 230° C.

The "thermal fixing" means that the polyester film 200 is heated at a certain temperature in the stretching portion 20, in a state of being applied with tension. It is preferable that the polyester film 200 is heated such that the highest film surface temperature thereof becomes from 160° C. to 230° C.

If the tensioned polyester film 200 is heated such that the highest film surface temperature thereof becomes from 160° C. to 230° C., it is possible to impart hydrolysis resistance to the film by orientating the crystals of the polyester molecules.

If the highest film surface temperature (hereinafter, also be referred to as "thermal fixing temperature" or "$T_{thermal\,fixing}$" in some cases) of the polyester film 200 at the time of thermal fixing is 160° C. or higher, it is possible to relax the polyester molecules to an appropriate degree and to inhibit the molecules from being orientated in the form of a layer to an excessive degree. Moreover, if the thermal fixing temperature is 230° C. or lower, it is possible to suppress excessive relaxation of the polyester molecules and to fix the film in a state where the polyester molecules are extended relatively well. Consequently, it is possible to improve the hydrolysis resistance and to make the film do not easily deteriorate in a humid and hot environment.

The thermal fixing temperature is preferably from 170° C. to 220° C., and more preferably from 175° C. to 215° C.

The thermal fixing temperature can be measured by bringing the surface of the polyester film 200 into contact with a thermocouple.

(Thermal Relaxation Portion)

The thermal relaxation portion 40 releases the tension applied to the polyester film 200 by heating the polyester film 200.

It is preferable that the polyester film 200 is heated such that the highest film surface temperature thereof becomes 100° C. to the highest film surface temperature ($T_{thermal\,fixing}$) of the polyester film 200 in the thermal fixing portion 30.

Hereinafter, the highest film surface temperature of the polyester film 200 at the time of thermal relaxation is called "thermal relaxation temperature" ($T_{thermal\,relaxation}$).

In the thermal relaxation portion 40, the film is heated at the thermal relaxation temperature ($T_{thermal\,relaxation}$) that is within a range of 100° C. to thermal fixing temperature ($T_{thermal\,fixing}$) (100° C.≤$T_{thermal\,relaxation}$≤$T_{thermal\,fixing}$[° C.]), such that the tension of the film is released (the stretching tension is decreased). As a result, it is possible to suppress breaking of the surface of polyester substrate of the polyester film or suppress separation of a layer adjacent to the polyester substrate from the polyester substrate.

If the thermal relaxation temperature ($T_{thermal\,relaxation}$) is equal to or lower than $T_{thermal}$ fixing, it is possible to suppress excessive relaxation of the polyester molecules in the relaxation step and to fix the film in a state where the polyester molecules are extended relatively well. Accordingly, it is possible to improve the hydrolysis resistance and to make the film do not easily deteriorate in a humid and hot environment.

If the thermal relaxation temperature ($T_{thermal\,relaxation}$) is 100° C. or higher, it is possible to relax the polyester molecules to an appropriate degree and to inhibit the molecules from being orientated in the form of a layer to an excessive degree.

The thermal relaxation temperature ($T_{thermal\,relaxation}$) is more preferably equal to or higher than 120° C. but lower than the thermal fixing temperature ($T_{thermal\,fixing}$) by 5° C. or more (120° C.≤$T_{thermal\,relaxation}$≤$T_{thermal\,fixing}-5°$ C.), and even more preferably equal to or higher than 150° C. but lower than the thermal fixing temperature ($T_{thermal\,fixing}$) by 5° C. or more (150° C.≤$T_{thermal\,relaxation}$≤$T_{thermal\,fixing}-5°$ C.).

The thermal relaxation temperature can be measured by bringing the surface of the polyester film 200 to a thermocouple.

In the thermal relaxation portion 40, the tension of the polyester film 200 in the TD direction is released, whereby the tensioned polyester film 200 contracts in the TD direction. When the tension of the polyester film 200 in the MD direction is released, the tensioned polyester film 200 contracts in the MD direction.

The tension is preferably released at a relaxation rate of from 1% to 20% in the TD direction and at a relaxation rate of from 0% to 20% in the MD direction. The relaxation rate is more preferably from 2% to 17% in the TD direction and from 0% to 15% in the MD direction, even more preferably from 3% to 15% in the TD direction and from 1% to 10% in the MD direction, and most preferably from 4% to 14% in the TD direction and from 2% to 8% in the MD direction.

If the relaxation rates are set to 20% or less in the TD direction and 20% or less the MD direction, it is possible to suppress excessive relaxation of the polyester molecules in the relaxation step and to fix the film in a state where the polyester molecules are extended relatively well. Accordingly, it is possible to improve the hydrolysis resistance and to make the film do not easily deteriorate in a humid and hot environment.

If the relaxation rate is set to 1% or higher in the TD direction and set to 0% or higher in the MD direction, it is possible to relax the polyester molecules to an appropriate degree and to inhibit the molecules from being orientated in the form of a layer to an excessive degree.

(Cooling Portion)

The cooling portion 50 cools the polyester film 200 having passed through the thermal relaxation portion 40.

By cooling the polyester film 200 that has been heated in the thermal fixing portion 30 or the thermal relaxation portion 40, the shape of the polyester film 200 can be fixed.

The film surface temperature (hereinafter, also referred to as "cooling temperature") of the polyester film 200 at the exit of the cooling portion 50 is preferably lower than a temperature which is higher the glass transition temperature Tg of the polyester film 200 by 50° C. Specifically, the temperature is preferably from 25° C. to 110° C., more preferably from 25° C. to 95° C., and even more preferably from 25° C. to 80° C.

If the cooling temperature is within the above range, it is possible to suppress uneven contraction of the film after being released from clipping of the gripping members.

Herein, the exit of the cooling portion refers to the end of the cooling portion 50 at the time when the polyester film 200 leaves the cooling portion 50. The exit refers to the position where the gripping members 2 (gripping members 2j ad 2l in FIG. 1) that grip the polyester film 200 release the polyester film 200.

As means for regulating temperature that heats or cools the polyester film 200 in the preheating, stretching, thermal fixing, thermal relaxation, and cooling in the horizontal stretching step, for example, the polyester film 200 is exposed to warm air or cold air, or alternatively, the polyester film 200 is brought into contact with the surface of a metal plate that can control temperature or is caused to pass through the vicinity of the metal plate.

(Collecting Film)

The cooled polyester film 200 is cut at the gripped both ends in the TD direction and wound up in a form of a roll.

In the horizontal stretching step, in order to further improve the hydrolysis resistance and dimensional stability of the produced polyester film, it is preferable to relax the stretched polyester film by the following method.

As described above, the horizontal stretching step is preferably performed after the vertical stretching step.

In order to perform the horizontal stretching step after the vertical stretching step and then relax the film in the MD direction in the cooling portion 50 as described above, the following method can be used.

First, in the preheating portion 10, each of the both ends of the polyester film 200 in the width direction (TD) thereof is gripped by at least two gripping members. For example, one end of the polyester film 200 in the width direction (TD) thereof is gripped by the gripping members 2a and 2b, and the other end is gripped by the gripping members 2c and 2d. Thereafter, the gripping members 2a to 2d are moved to transport the polyester film 200 to the cooling portion 50 from the preheating portion 10.

When the film is transported as above, the interval between the gripping member 2a (or 2c) (one of the two gripping members) that grips one end of the polyester film 200 in the width direction thereof and the other gripping member 2b (or 2d) (the other gripping member among the two gripping members) that is adjacent to the gripping member 2a (or 2c) in the cooling portion 50 is made narrower than the interval between the gripping member 2a (or 2c) (one of the two gripping members) that grips one end of the polyester film 200 in the width direction thereof (TD direction) and the other gripping member 2b (or 2d) (the other gripping member among the two gripping members) that is adjacent to the gripping member 2a (or 2c) in the preheating portion 10, whereby the transport speed of the polyester film 200 can be reduced. By this method, the film can be relaxed in the MD direction in the cooling portion 50.

The polyester film 200 can be relaxed in the MD direction in at least one of the thermal fixing portion 30, the thermal relaxation portion 40, and the cooling portion 50.

As described above, by making the interval between the gripping members 2a and 2b and the interval between the gripping members 2c and 2d narrower in the downstream side of the MD direction than in the upstream side thereof, the polyester film 200 can be relaxed in the MD direction. Accordingly, in a case in which the film is relaxed in the MD direction in the thermal fixing portion 30 or the thermal relaxation portion 40, when the gripping members 2a to 2d reach the thermal fixing portion 30 or thermal relaxation portion 40, the movement speed of the gripping members 2a to 2d may be reduced to reduce the transport speed of the polyester film 200, and the interval between the gripping members 2a and 2b and the interval between the gripping members 2c and 2d may be made narrower than the interval in the preheating portion.

In this manner, in the horizontal stretching step, the polyester film 200 is stretched (horizontal stretching) and relaxed in the TD direction and is stretched (vertical stretching) and relaxed in the MD direction. As a result, it is possible to improve the dimensional stability with improving the hydrolysis resistance.

It is preferable that the polyester film 200 is relaxed in the TD direction and the MD direction, by regulating the transport speed and width (length in the TD direction) of the polyester film 200 in the following manner.

That is, it is preferable to perform the horizontal stretching step after the vertical stretching step. Moreover, it is preferable that a width L1 of the polyester film 200, which is a maximum width of the polyester film 200 in the horizontal stretching step, and a width L2 of the polyester film 200 at the end of the cooling portion 50 that is a position in which the polyester film 200 leaves the cooling portion 50 satisfy the following Inequality (1). Further, it is preferable that a transport speed S1 of the polyester film 200 in the preheating portion 10 and a transport speed S2 of the polyester film 200 at the end of the cooling portion 50 satisfy the following Inequality (2).

$$1\% \leq \frac{L1 - L2}{L1} \times 100 \leq 20\% \tag{1}$$

$$0\% \leq \frac{S1 - S2}{S1} \times 100 \leq 20\% \tag{2}$$

Herein, the "width L1 of the polyester film 200, which is a maximum width of the polyester film 200 in the horizontal stretching step" is a maximum length of the polyester film 200 in the TD direction that is obtained after the polyester film 200 is widened in the TD direction in the stretching portion 20.

FIG. 1 shows a state in which a width L0 of the unstretched polyester film 200 in the preheating portion 10 becomes the width L1 after the polyester film 200 is widened in the TD direction by the stretching portion 20, and then becomes the width L2 when the polyester film 200 leaves the cooling portion 50 after the tension thereof is released in the thermal relaxation portion 40. In FIG. 1, the width increases in order of L0<L2<L1. That is, L1 is the maximum width of the polyester film 200 in the horizontal stretching step that starts from the preheating portion 10 and ends at the cooling portion 50.

As shown in FIG. 1, the polyester film 200 having passed through the stretching portion 20 is then heated in the thermal fixing portion 30, in the state of being applied with tension. Therefore, generally, it is possible to say that the width L1 is the width (length in the TD direction) of the polyester film 200 in the thermal fixing portion 30.

Moreover, the "width L2 of the polyester film 200 at the end of the cooling portion 50 that is a position in which the polyester film 200 leaves the cooling portion 50" is the width of the polyester film 200 that is obtained when the gripping members 2 (gripping members 2j and 2l in FIG. 1), which are positioned in the cooling portion 50 and grip the polyester film 200, release the polyester film 200.

When the gripping members 2 that grip the polyester film 200 release the polyester film 200, the polyester film 200 leaves the area of the cooling portion 50. For example, when the gripping member 2j or 2l releases the polyester film 200 in a point P or Q respectively, the end (end in the MD direction) of the cooling portion 50 is indicated by a straight line that connects the point P to the point Q.

The "transport speed S1 of the polyester film 200 in the preheating portion 10" corresponds to the movement speed of the gripping members 2 (2a to 2d in FIG. 1) that move along the rim of the cyclic rail 60 while gripping the polyester film 200.

Moreover, the "transport speed S2 of the polyester film 200 at the end of the cooling portion 50" is the transport speed of the polyester film 200 that is obtained when the gripping members 2 (gripping members 2j and 2l in FIG. 1), which are positioned in the cooling portion 50 and grip the polyester film 200, release the polyester film 200. In other words, for example, when the gripping members 2j or 2l releases the polyester film 200 in the point P or Q respectively, the "transport speed S2 of the polyester film 200 at the end of the cooling portion 50" corresponds to the transport speed that is obtained when the polyester film 200 goes over the straight line that connects the point P to the point Q. That is to say, the "transport speed S2 of the polyester film 200 at the end of the cooling portion 50" corresponds to the movement speed of the gripping members 2j and 2l that is obtained immediately before the gripping members 2j and 2l release the polyester film 200.

Inequality (1) shows that when the polyester film 200 is relaxed in the TD direction after being stretched, it is preferable that the film is relaxed such that the maximum width (length in the TD direction) L1 of the polyester film 200 contracts by 1% to 20% in the cooling portion 50.

Inequality (2) shows that when the polyester film 200 is relaxed in the MD direction, it is preferable that the film is relaxed such that the transport speed S1 of the polyester film 200 in the preheating portion 10 is reduced 0% to 20% in the cooling portion 50.

If the horizontal stretching step is performed under the above conditions, it is possible to inhibit the surface of the polyester substrate from being broken and to inhibit a layer adjacent to the polyester substrate from being separated from the polyester substrate.

$$\frac{L1 - L2}{L1} \times 100 = \Delta L$$

$$\frac{S1 - S2}{S1} \times 100 = \Delta S$$

ΔL indicates a relaxation rate of the polyester film in the TD direction (horizontal direction). Accordingly, ΔL is also called "relaxation rate in the horizontal direction". Moreover, ΔS indicates a relaxation rate of the polyester film in the MD direction (vertical direction). Accordingly, ΔS is also called "relaxation rate in the vertical direction".

In a case in which the above relationship is established between L1 and L2 and between S1 and S2, ΔL is preferably from 1% to 20% (1%≤ΔL≤20%), more preferably from 2% to 17% (2%≤ΔL≤17%), even more preferably from 3% to 15% (3%≤ΔL≤15%), and most preferably from 4% to 14% (4%≤ΔL≤14%). Moreover, ΔS is preferably from 0% to 20% (0%≤ΔS≤20%), more preferably from 0% to 15% (0%≤ΔS≤15%), even more preferably from 1% to 10% (1%≤ΔS≤10%), and most preferably from 2% to 8% (2%≤ΔS≤8%).

As described above, the horizontal stretching step may be performed using a horizontal stretching apparatus specialized for horizontal stretching of the polyester film. Though not shown in the stretching, the horizontal stretching apparatus has the same structure as that of the biaxial stretching machine, except that the apparatus does not stretching the film in the MD direction (vertical stretching). The apparatus has gripping members that grip the polyester film and rails having the gripping members. The horizontal stretching apparatus is similar to the biaxial stretching machine, in the respect that the apparatus has at least a preheating portion, a stretching portion, a thermal fixing portion, and a thermal relaxation portion and in terms of the function thereof.

Incidentally, when the polyester film 200 to be horizontally stretched is a thick film (for example, a film having a thickness of 700 μm or greater) that becomes a polyester film having a thickness of 200 μm or greater after being horizontally stretched, a great stretching tension is required. Consequently, a heavy load is applied during the horizontal stretching, whereby the biaxial stretching machine or the horizontal stretching apparatus breaks down in some cases.

In order to solve the above problem, it is preferable to perform horizontal stretching of the polyester film 200 in the following manner.

That is, provided that an angle, which is formed between the transport direction (MD) of the polyester film 200 in the stretching portion 20 and the travelling directin of the end of the polyester film 200 in the width direction (TD) in the stretching portion 20, is a stretching angle θ[°], it is preferable to stretching the polyester film 200, such that a stretching angle θx[°] in a position X in which the horizontal stretching of the polyester film 200 in the stretching portion 20 is started, a stretching angle θz[°] in a position Z in which the horizontal stretching of the polyester film 200 in the stretching portion 20 ends, and a stretching angle θy[°] in a position Y that is between the positions X and Z in the stretching portion 20 satisfy the following Inequality (3), and a polyester film having a thickness of 200 μm or greater is obtained after the horizontal stretching ends.

$$0<\theta x \leq \theta z<\theta y<10 \tag{3}$$

The details of the horizontal stretching will be described using FIG. 2.

Figure 2:
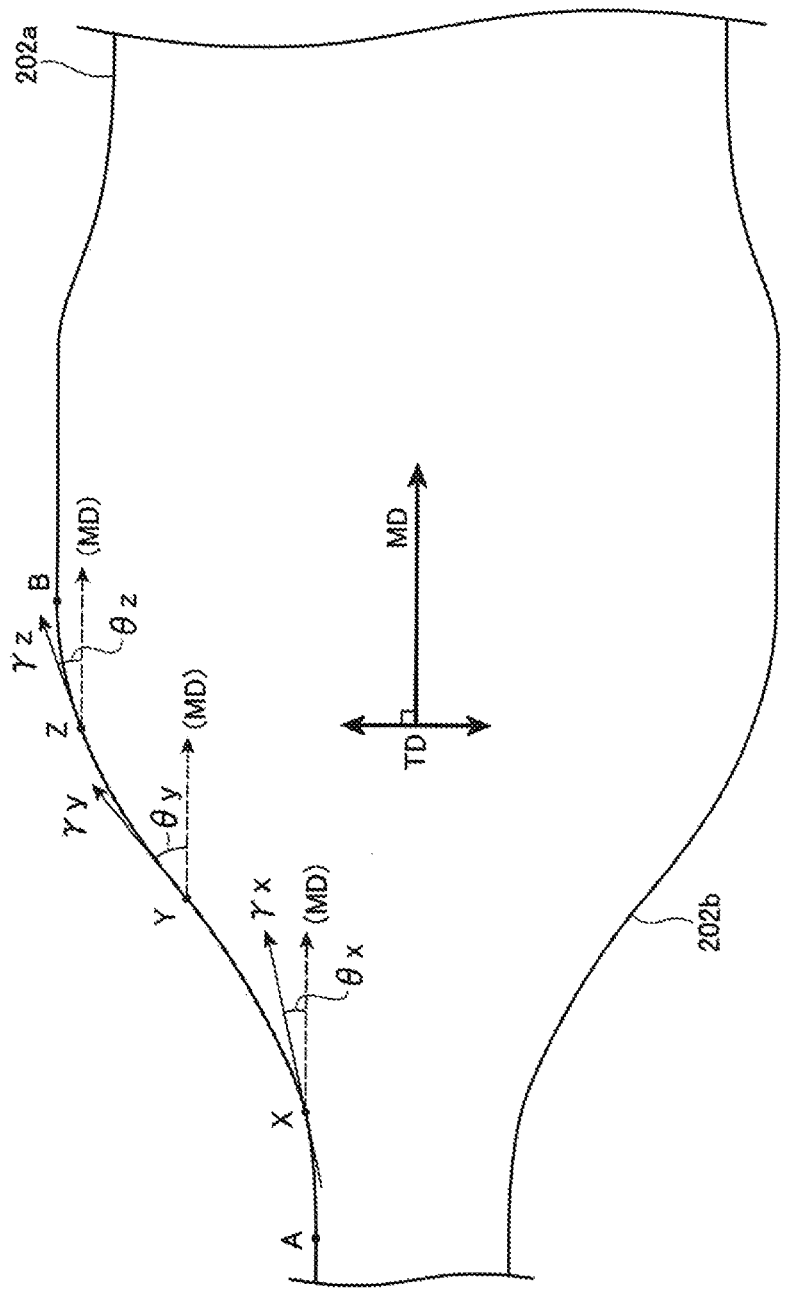
FIG. 2 is a view schematically showing how a polyester film is stretched in a horizontal stretching step.

FIG. 2 is a view schematically showing how a polyester film is stretched in the horizontal stretching step.

202a and 202b shown in FIG. 2 show the trajectory of the end of the polyester film in the TD direction that has been horizontally stretched in the horizontal stretching step.

In FIG. 2, the point A is a position of one end of the polyester film in the width direction (TD) in a state where the polyester film is positioned in the preheating portion and has not yet been horizontally stretched. The point B is a position of one end of the polyester film in the width direction (TD) in a state where the polyester film is positioned in the thermal fixing portion and has undergone horizontal stretching.

The points X, Y, and Z are positions of one end of the polyester film in the width direction (TD) in a state where the polyester film is positioned in the stretching portion and is being widened in the width direction (TD).

The end of the polyester film in the width direction (TD) moves from the point A, passes through the points X, Y, and Z, and reaches the point B.

The position of the points X, Y, and Z will be described in more detail.

The point X is a position in which the horizontal stretching of the polyester film in the stretching portion is started, and the point Z is a position in which the horizontal stretching of the polyester film in the stretching portion ends.

Herein, provided that the length of the stretching portion in the MD direction is M, the "position in which the horizontal stretching of the polyester film in the stretching portion is started" specifically refers to a position that takes up 10% of M from the upstream end of the stretching portion in the MD direction. Moreover, the "position in which the horizontal stretching of the polyester film in the stretching portion ends" refers to a position that takes up 10% of M from the downstream end of the stretching portion in the MD direction.

The point Y is a position that is between the position of the point X and the position of the point Z.

When one end of the polyester film in the width direction (TD) is placed in the point X (position X), the travelling direction of the end of the polyester film in the width direction in the point X (position X) is indicated by the direction of a tangent of the point X that is shown by the arrow (γx).

Therefore, provided that an angle, which is formed between the transport direction (MD) of the polyester film in the stretching portion and the travelling direction of the end of the polyester film in the width direction in the stretching portion, is the stretching angle θ[°], the stretching angle θx[°] in the position X (point X) is indicated by an angle formed between MD and γx.

When one end of the polyester film in the width direction (TD) is placed in the point Y (position Y), the travelling direction of the end of the polyester film in the width direction in the point Y (position Y) is indicated by the direction of a tangent of the point Y (position Y) that is shown by the arrow (γy). Moreover, when one end of the polyester film in the width direction (TD) is placed in the point Z (position Z), the travelling direction of the end of the polyester film in the width direction in the point Z (position Z) is indicated by the direction of a tangent of the point Z (position Z) that is shown by the arrow (γz).

Accordingly, the stretching angle θy[°] in the position Y (point Y) is indicated as an angle formed between MD and γy, and the stretching angle θz[°] in the position Z (point Z) is indicated as an angle formed between MD and γz.

It is preferable that θx[°], θy[°], and θz[°] satisfy Inequality (3).

If a polyester film having a thickness of 200 μm or greater is obtained by performing horizontal stretching of the polyester film in the manner described above, it is possible to reduce the heavy load that can be applied to the biaxial stretching machine or the horizontal stretching apparatus.

Formula (3) is preferably represented by the following Inequality (3-1), and more preferably represented by the following Inequality (3-2).

$$0.5 \leq \theta x<\theta z<\theta y \leq 8.0 \tag{3-1}$$

$$1.0 \leq \theta x<\theta z<\theta y \leq 7.0 \tag{3-2}$$

The polyester film obtained in the above manner can be used as a polyester substrate.

[Layered Portion]

The layered portion that the polyester film has is disposed on at least one surface of the polyester substrate and has an elastic modulus of from 5 MPa to 800 MPa.

The layered portion may be a layer that is layered on the polyester substrate while coming into contact with the polyester substrate. The layered portion may be formed of only one layer or may have a layered structure consisting of two or more layers.

The layered portion may be disposed only one surface of the polyester substrate or disposed on both surfaces thereof. When both surfaces of the polyester substrate have a layer adjacent thereto, the elastic modulus of one of the layers adjacent to the surfaces may be from 5 MPa to 800 MPa in the layered portion.

In a case in which the layered portion has the layered structure consisting of two or more layers, examples of the structure include: a structure in which a polymer member that contains a polymer is stuck to the polyester substrate via an adhesive member that contains an adhesive; and a structure in which an undercoat layer is formed on the polyester substrate by coating and a polymer layer and a weather-resistant layer are formed in this order on the undercoat layer by coating.

When the adhesive member and the polymer member are stuck onto the polyester substrate, two layers including the adhesive member and the polymer member become the layered portion. When the undercoat layer, the polymer layer, and the weather-resistant layer are formed on the polyester substrate in this order by coating, three layers including the undercoat layer, the polymer layer, and the weather-resistant layer become the layered portion.

The elastic modulus of the layered portion is from 5 MPa to 800 MPa.

If the elastic modulus of the layered portion is 5 MPa or higher, it is possible to prevent the phenomenon caused by excessive softness of the layered portion, such as separation of the layered portion from the polyester substrate, or separation of the layered portion from the encapsulant that is caused when the layered portion is adjacent to the encapsulant. If the elastic modulus of the layered portion is 800 MPa or lower, it is possible to prevent the phenomenon caused by excessive hardness of the layered portion, such as breaking of the surface of the polyester substrate that is caused by concentration of stress on the polyester substrate side, or the phenomenon in which the layered portion is easily separated from the polyester substrate.

The elastic modulus of the layered portion is preferably from 50 MPa to 650 MPa, more preferably from 80 MPa to 550 MPa, even more preferably from 100 MPa to 500 MPa, and most preferably from 100 MPa to 450 MPa.

The elastic modulus of the layered portion can be measured by the following method by using only the layered portion cut off from the polyester film or using a separately prepared sample of the layered portion to be measured that has the same structure as that of the layered portion of the polyester film. By using a tensilon (trade name: RTM-50, manufactured by Orientec Co., Ltd), a tensile test is performed under the conditions of an inter-chuck distance of 20 mm and a crosshead speed of 50 mm/min. The obtained data is analyzed by test data processing software for general purpose, thereby calculating the elastic modulus from a stress-strain curve.

The sample of the layered portion to be measured can be obtained by the following method for example. That is, in producing the polyester film, a temporary support that is easily separated is used instead of the polyester substrate, a layered portion is formed on the temporary support, and then the temporary support is separated to obtain the sample.

The thickness of the layered portion is greater than 0 µm and preferably 30 µm or less.

If the layered portion is too thick, the layered portion can easily have a strength that is at a level equal to or higher than a certain degree even if the elastic modulus of the layered portion is low. If the thickness of the layered portion is 30 µm or less, breaking of the surface of the polyester substrate, which results from stress concentration that occurs at the polyester substrate side due to excessive hardness of the layered portion, is suppressed, and this makes it easy to suppress separation of the layered portion from the polyester substrate.

The thickness of the layered portion is more preferably 20 µm or less, even more preferably 15 µm or less, and most preferably 10 µm or less.

The layered portion is not particularly limited as long as the elastic modulus thereof is within the above range. From the viewpoint of making the elastic modulus of the layered portion fall within the above range, it is preferable that the layered portion contains at least one kind of a binder having an elastic modulus of 5 MPa to 320 MPa.

The layered portion may include only one polymer layer containing at least one kind of binder having an elastic modulus of from 5 MPa to 320 MPa. Alternatively, the layered portion may include a polymer layer, which contains at least one kind of binder having an elastic modulus of from 5 MPa to 320 MPa, and another layer.

If the elastic modulus of the binder contained in the layered portion is regulated to be from 5 MPa to 320 MPa, durability of the polyester film in a humid and hot environment is further improved, and separation trouble is not easily caused even in a humid and hot environment.

If the elastic modulus of the binder is regulated to be 5 MPa or higher, it is possible to suppress separation of the layered portion from the polyester substrate due to excessive softness of the layered portion. Moreover, it is possible to suppress separation o the layered portion from the encapsulant when the layered portion is stuck to the encapsulant.

If the elastic modulus of the binder is 320 MPa or lower, breaking of the surface of the polyester substrate, which results from stress concentration that occurs in the polyester substrate side due to excessive hardness of the layered portion, is suppressed, and the layered portion is not easily separated from the polyester substrate.

The elastic modulus of the binder is more preferably from 10 MPa to 250 MPa, even more preferably from 20 MPa to 150 MPa, and most preferably from 30 MPa to 100 MPa.

The elastic modulus of the binder can be measured by the following method.

A single binder film (film thickness: about 100µ) is formed on CERAPEEL® HP2 (manufactured by Toray Advanced Film Co., Ltd.) and then separated carefully so as not to be stretched. The obtained single binder film is cut in 5 mm×50 mm, and is subjected to a tensile test by using a tensilon (trade name: RTM-50, manufactured by Orientec Co., Ltd) in an environment of 25° C. and 50% RH under the conditions of an inter-chuck distance of 20 mm and a crosshead speed of 50 mm/min. The obtained data is analyzed by test data processing software for general purpose, and the elastic modulus is calculated from a stress-strain curve.

—Binder (Polymer Layer)—

The type of binder is not particularly limited. However, considering the elastic modulus, the binder is preferably at least one of the olefin-based binder and urethane-based binder.

At this time, the layered portion may have an olefin-based polymer layer that contains at least one kind of olefin-based binder or have a urethane-based polymer layer that contains at least one kind of urethane-based binder. Alternatively, the layered portion may have both the olefin-based polymer layer and urethane-based polymer layer. Moreover, the layered portion may have a mixed polymer layer that contains at least one kind of olefin-based binder and at least one kind of urethane-based binder. It is particularly preferable that the layered portion contains an olefin-based binder.

If the layered portion has the olefin-based polymer layer that contains at least one kind of olefin-based binder or the urethane-based polymer layer that contains at least one kind of urethane-based binder, it is easy to regurate the elastic modulus of the layered portion within a range of from 5 MPa to 800 MPa.

In addition, the adhesive force between the layered portion and the encapsulant or the adhesive force between the layered portion and the polyester substrate is more easily improved, whereby the separation trouble does not easily occur in a humid and hot environment.

Examples of the type of main chain skeleton of the olefin-based binder include an ethylene-acrylic acid ester-maleic anhydride (and/or acrylic acid) copolymer, and ethylene-propylene-maleic anhydride (and/or acrylic acid) copolymer, an ethylene-butene-maleic anhydride (and/or acrylic acid) copolymer, a propylene-butene-maleic anhydride (and/or acrylic acid) copolymer, an ethylene-propylene-butene-maleic anhydride copolymer, an ethylene-propylene-acrylic acid ester-maleic anhydride (and/or acrylic acid) copolymer, an ethylene-butene-acrylic acid ester-maleic anhydride (and/or acrylic acid) copolymer, a propylene-butene-acrylic acid ester-maleic anhydride (and/or acrylic acid) copolymer, an ethylene-propylene-butene-acrylic acid ester-maleic anhydride (and/or acrylic acid) copolymer, and the like. Among these, binders containing an acrylic acid ester-maleic anhydride copolymer are preferable since those binders exhibit excellent adhesiveness with respect to the EVA layer. Among the above, an ethylene-acrylic acid ester-maleic anhydride (and/or acrylic acid) copolymer and an ethylene-propylene-acrylic acid ester-maleic anhydride (and/or acrylic acid) copolymer are more preferable, and an ethylene-acrylic acid ester-maleic anhydride (and/or acrylic acid) copolymer is even more preferable.

Examples of the urethane-based binder include binders having structural unit, which is represented by a product of a reaction between at least one kind of diisocyanate compound and at least one kind of diol compound, as a basic skeleton.

Commercially available binders may be used as the binder, or alternatively, the binder may be obtained by synthesis. Moreover, the binders, which are obtained by adding additives such as a filler and a crosslinking agent to binders having an elastic modulus lower than 5 MPa so as to adjust the elastic modulus to a range of from 5 MPa to 320 MPa, may be used. Inversely, the binders, which are obtained by adding a plasticizer and oil to binders having an elastic modulus higher than 320 MPa so as to adjust the elastic modulus to a range of from 5 MPa to 320 MPa, may be used.

Examples of commercially available olefin-based binders include AROBASE® SE-1010, AROBASE® SE-1013N, AROBASE® SD-1010, AROBASE® TC-4010, and AROBASE® TD-4010 (manufactured by Unitika, Ltd.); HITEC S3148, HITEC S3121, and HITEC S8512 (all trade name, manufactured by Toho Chemical Industry Co., Ltd.); CHEMIPEARL® S-120, CHEMIPEARL® S-75N, CHEMIPEARL® V-100, and CHEMIPEARL® EV210H (all manufactured by Mitsui Chemicals, Inc.); and the like.

Among these, AROBASE® SE-1010, AROBASE® SE-1013N, and AROBASE® SD-1010 are preferable, and AROBASE® SE-1010 and AROBASE®) SE-1013N are more preferable. It is even more preferable to use AROBASE® SE-1013N (manufactured by Unitika, Ltd.).

Examples of commercially available urethane-based binders include SUPERFLEX® 110 and SUPERFLEX® 460 (manufactured by Dai-Ichi Kogyo Seiyaku Co., Ltd.), and the like.

Any one of the above various binders may be used singly, or plural kinds of binders may be used in the form of a mixture.

When the olefin-based binder (o) and the urethane-based binder are used in the form of a mixture, the ratio (o:u) between the mass of the olefin-based binder (o) and the mass of the urethane-based binder (u) is preferably from 50:50 to 100:0, and more preferably from 80:20 to 100:0.

The form of the binder and mode of using the binder are not particularly limited, as long as a polymer layer containing the binder can be formed (the layer may be the olefin-based polymer layer, urethane-based polymer layer, or mixed polymer layer).

For example, the binder may be a water-dispersible binder or a meltable binder. Moreover, the binder may be a crystalline binder or an amorphous binder.

From the viewpoint of adhesiveness between the layered portion and the polyester substrate, it is preferable that the layered portion is formed by coating the surface of the polyester substrate with a composition containing components that compose the layered portion.

From the viewpoint described above, as the binder, it is preferable to use a binder that can be dispersed in a solvent. Moreover, considering the environmental aspect, the solvent is preferably water or a solvent containing water as a main component. The "solvent containing water as a main component" means that the content of water in the solvent is 80% by mass or more with respect to the total mass of the solvent. Examples of solvents that are concurrently used with water include monol or diol having from 1 to 6 carbon atoms.

—Coloring Pigment (Colored Layer)—

It is preferable that the layered portion has a colored layer containing a coloring pigment.

The layered portion may include only the colored layer containing a coloring pigment or may have a layered structure in which the colored layer is layered on the polymer layer. Alternatively, the layered portion may be a layer in which the polymer layer contains the coloring pigment.

Hereinafter, the colored layer will be described by illustrating a representative example in which the polymer layer is a colored layer containing a coloring pigment.

A primary function of the colored layer is to increase power generation efficiency of a solar cell module, by reflecting the light, which reaches the back sheet in the solar cell without being used for power generation, among incident light and returning the light to the solar cell. A secondary function thereof is to improve decorativeness of the appearance of a solar cell module that is shown when the module is viewed from the surface thereof. Generally, when a solar cell module is viewed from the surface thereof, a back sheet around the solar cell module is seen. Therefore, if the colored layer is disposed on the back sheet, it is possible to improve the appearance of module by enhancing the decorativeness.

The coloring pigment is not particularly limited in terms of the type and may be selected according to the reflectivity, design characteristics, and the like.

The coloring pigment may be an inorganic or organic pigment, and for example, a white pigment can be preferably used.

Examples of the inorganic pigment include titanium oxide, barium sulfate, silicon oxide, aluminum oxide, magnesium oxide, calcium carbonate, kaolin, talc, ultramarine, iron blue, carbon black, and the like.

Examples of the organic pigment include phthalocyanine blue, phthalocyanine green, and the like.

From the viewpoint of reflectivity, cost, and the like, titanium oxide is preferable. From the viewpoint of design characteristics, carbon black is preferable.

For example, if a white pigment is used as the coloring pigment, the colored layer have a function of increasing power generation efficiency by diffusively reflecting light, which escapes from cells, among sun light that enters the solar cell module from the front surface thereof and returning the light to the cells.

The light reflectance at a wavelength of 550 μm of the surface of the polyester substrate on which the layered portion having the colored layer is disposed (outermost surface of the layered portion) can be adjusted to increase the reflectance, by regulating the content of the coloring pigment in the colored layer or the thickness of the layer.

A volume average particle size of the coloring pigment is preferably from 0.03 μm to 0.8 μm, and more preferably from 0.15 μm to 0.5 μm. If the volume average particle size of the coloring pigment is within the above range, it is possible to suppress decrease in the light reflection efficiency.

The volume average particle size of the coloring pigment is a value measured using MICROTRAC® FRA manufactured by Honeywell.

A content of the coloring pigment in the colored layer varies with the type or average particle size of the coloring pigment used. However, it is preferable that the content of the coloring pigment in the colored layer is not too small, since the reflectivity and design characteristics can be sufficiently exhibited. Moreover, from the view point of adhesiveness between the colored layer and the encapsulant, it is preferable that the content is not too large. From the viewpoint of sufficiently exerting the above functions, the content of the coloring pigment in the colored layer is preferably from 3 g/m² to 20 g/m², and more preferably from 5 g/m² to 17 g/m².

A volume fraction of the coloring pigment relative to a total volume of the binder contained in the colored layer is preferably from 50% by volume to 200% by volume, and more preferably from 90% by volume to 150% by volume.

The volume fraction of the coloring pigment relative to a total volume of the layered portion is preferably greater than 0% by volume but equal to or less than 50% by volume.

If the layered portion contains too much coloring pigment as a whole, the elastic modulus of the layered portion is increased, and accordingly, the layered portion easily obtains strength at a level equal to or higher than a certain degree. If the volume fraction of the coloring pigment relative to a total volume of the layered portion is 50% by volume or less, breaking of the surface of the polyester substrate, which results from stress concentration that occurs at the polyester substrate side due to excessive hardness of the layered portion, is suppressed, and this makes it easy to suppress separation of the layered portion from the polyester substrate.

The volume fraction of the coloring pigment relative to a total volume of the layered portion is more preferably from 5% by volume to 40% by volume, even more preferably from 10% by volume to 35% by volume, still more preferably from 13% by volume to 30% by volume, and most preferably from 15% by volume to 25% by volume.

The volume fraction of the coloring pigment relative to a total volume of the layered portion can be measured by the following method.

From the polyester film, a film sample having sides of 10 cm is cut off, and the film thickness of the coating layer, which is the layered portion included in the film sample, is measured with a scanning electron microscope SEM TYPE H (manufactured by Hitachi, Ltd.), whereby the volume of the coating layer is calculated as X cm³. The coating layer is collected by being shaved off from the cut film sample having sides of 10 cm and incinerated by being heated at 900° C. in an electric furnace OPM-50D (manufactured by Toyo Engineering Works), and the weight Yg of the residue is measured. The density Zg/cm³ of the incinerated coloring pigment is measured using a denser MAT-7000 (trade name, manufactured by SEISHIN ENTERPRISE Co., Ltd.) by an immersion method. The volume fraction of the coloring pigment relative to a total volume of the layered portion can be calculated by an expression of $\{(Y/Z)/X)\} \times 100 [\%]$.

—Other Layers—

The layered portion may further has other layers in addition to the polymer layer and the colored layer.

Examples of other layers that the layered portion can have include an undercoat layer and a weather-resistant layer. When other layers as above are formed by coating, it is preferable that these layers do not contain inorganic particles such as inorganic oxide particles.

[Undercoat Layer]

As described above, it is preferable that the layered portion has a polymer layer containing a binder that having the elastic modulus described above. In order to improve the adhesiveness between the polymer layer and the polyester substrate, the layered portion may have an undercoat layer. At this time, the undercoat layer is positioned between the polyester substrate and the polymer layer. The layered portion may have one, two, or more undercoat layers.

It is preferable that the undercoat layer contains an aqueous binder.

As the aqueous binder, polyester, polyurethane, an acrylic resin, polyolefin, and the like can be used. Among these, binders containing a polyester-based resin as a main component are preferable.

The undercoat layer may further contain a crosslinking agent based on epoxy, isocyanate, melamine, carbodiimide, oxazoline, and the like, an anionic or nonionic surfactant, a filler such as silica, and the like, in addition to the aqueous binder.

A content of the aqueous binder with respect to the total mass of solid contents of the undercoat layer is preferably from 50% by mass to 100% by mass, and more preferably from 70% by mass to 100% by mass.

—Weather-Resistant Layer—

The layered portion may have a weather-resistant layer.

Moreover, the polyester film may have the weather-resistant layer, on the surface of the polyester substrate that is opposite to the surface on which the layered portion is disposed.

It is preferable that the weather-resistant layer contains at least one of the fluororesin and silicone-acryl composite resin.

Examples of the fluororesin include chlorotrifluoroethylene, tetrafluoroethylene, hexafluoropropylene, vinylidene fluoride, trifluoroethylene, a chlorotrifluoroethylene-ethylene copolymer, and a tetrafluoroethylene-perfluoroalkyl vinyl ether copolymer.

Among these, from the viewpoint of solubility of the solvent, which is for producing coating liquid for forming a weather-resistant layer, and weather resistance, a chlorotrifluoroethylene-vinyl ether copolymer copolymerized with a vinyl-based compound is preferable.

As the fluororesin, commercially available products may be used, and examples thereof include OBBLIGATO® SW0011F (manufactured by Agc Coat-Tech Co., Ltd.).

From the viewpoint of weather resistance and film strength, the content of the fluororesin with respect to the total mass of solid contents of the weather-resistant layer is preferably from 40% by mass to 90% by mass, and more preferably from 50% by mass to 80% by mass.

Examples of the silicone-acryl composite resin include CERANATE® WSA1060 and CERANATE® WSA1070 (all manufactured by DIC Corporation); and H7620, H7630, and H7650 (all trade name, manufactured by Asahi Kasei Chemicals Corporation).

From the viewpoint of weather resistance and film strength, the content of the silicone-acryl composite resin with respect to the total mass of solid contents of the weather-resistant layer is preferably from 40% by mass to 90% by mass, and more preferably from 50% by mass to 80% by mass.

The film thickness of the weather-resistant layer is preferably from 0.5 μm to 15 μm, and more preferably from 3 μm to 7 μm. If the film thickness is regulated to be 0.5 μm or greater, the weather resistance can be sufficiently exerted, and if it is regulated to be 15 μm or less, deterioration of the surface shape can be suppressed.

The weather-resistant layer may consist of a single layer or consist of two or more layers layered on one another.

It is preferable that the polyester film has a structure in which two weather-resistant layers are layered on each other (for example, a structure having a weather-resistant layer which is adjacent to the polyester substrate and a weather-resistant layer which is positioned on the uppermost surface of the layered portion).

—Other Additives—

The layered portion can further contain various other additives such inorganic particles, a UV absorber, and an antioxidant, in addition to the surfactant and coloring pigment.

These additives may be contained in one, two, or more layers selected from the polymer layer, colored layer, undercoat layer, and weather-resistant layer, or may be contained in all of the layers.

Particularly, for the dispersion stability of the coloring pigment, it is preferable that the composition for forming a colored layer is produced using a surfactant.

As the surfactant, it is possible to use known surfactants such as anionic, cationic, and nonionic surfactants. Specific examples thereof include DEMOL® EP (manufactured by Kao Corporation), NAROACTY® CL95 (manufactured by Sanyo Chemical Industries, Ltd.), and the like. One kind of the surfactant may be used, or plural kinds thereof may be used.

Examples of the inorganic particles other than the coloring pigment include inorganic oxide fillers such as silica, magnesium oxide, and tin oxide. Among these, tin oxide or silica is preferable, since the adhesiveness deteriorates to a small extent when the film is exposed to a humid and hot atmosphere.

The volume average particle size of the inorganic oxide filler is preferably from 10 nm to 700 μm, and more preferably from 20 μm to 300 μm. If the inorganic oxide filler of which the average particle size falls within the above range is used, the colored layer can easily adhere to a layer adjacent thereto with excellent adhesiveness, and particularly in a humid and hot environment (for example, 85° C. and 85% RH), the colored layer can exhibit adhesiveness with respect to a layer adjacent thereto (more particularly preferably the encapsulant of a solar cell module, such as EVA-containing encapsulant layer). The volume average particle size of the inorganic oxide filler is a value measured by MICROTRAC FRA manufactured by Honeywell.

The shape of the inorganic particle size other than the coloring pigment is not particularly limited, and it is possible to use spherical inorganic particles, amorphous inorganic particles, needle-like inorganic particles, and the like.

The content of the inorganic particles other than the coloring pigment in the colored layer is preferably from 5% by mass to 400% by mass, and more preferably from 50% by mass to 300% by mass, with respect to the total mass of the binder resin of the colored layer. If the content of the inorganic particles is 5% by mass or more, the adhesiveness at the time when the film is exposed to a humid and hot atmosphere and the adhesiveness between the film and the encapsulant of the solar cell module at the time when the film is left in a humid and hot environment become excellent. If the content is 400% by mass or less, deterioration of the surface shape of the colored layer can be prevented.

The layered portion may contain, for example, calcium carbonate, magnesium carbonate, and the like, as the inorganic particles other than the inorganic oxide filler.

The film thickness of each of the polymer layers (including the polymer layer containing the coloring pigment) including the olefin-based polymer layer, the urethane-based polymer layer, the mixed polymer layer, and the like is preferably 30 μm or less, more preferably from 1 μm to 20 μm, particularly preferably from 1.5 μm to 10 μm, more particularly preferably from 2 μm to 8 μm. If the film thickness is regulated to be 1 μm or greater, the decorativeness and reflectivity can be sufficiently exerted. If the film thickness is regulated to be 30 μm or less, deterioration of the surface shape can be suppressed, and the adhesiveness between the encapsulant and the film after the film is left in a humid and hot environment can be improved.

—Formation of Layered Portion—

The layered portion may be formed by, for example, sticking a member containing the binder onto the polyester substrate. Alternatively, the layered portion may be formed by coating by using the coating liquid for forming a layered portion that contains the binder and the like.

Particularly, from the viewpoint of the adhesiveness between the polyester substrate and the layered portion, it is preferable that the layered portion is formed by coating.

Hereinafter, the method of forming the polymer layer and the like which form the layered portion may be described. The polymer layer formed by the following method is an exemplary embodiment that contains the coloring pigment and also functions as the colored layer.

—Formation of Polymer Layer by Coating—

The polymer layer can be formed by coating the surface of the polyester substrate or the surface of the undercoat layer with the coating liquid for forming a polymer layer.

The coating liquid for forming a polymer layer contains the binder and coloring pigment. If necessary, the coating liquid can be produced by mixing other binder resin, inorganic oxide filler, crosslinking agent, additives, and the like with a coating solvent.

[Solvent]

The coating solvent is not particularly limited, as long as the binder and other respective components contained in the polymer layer can be dispersed or dissolved in the solvent, and the solvent can be separated after coating. It is preferable to use water.

Particularly, the solvent is preferably an aqueous composition in which water takes up 60% or more of the solvent contained in the coating liquid for forming a polymer layer. Such an aqueous composition is preferable since it hardly causes environmental load. From the viewpoint of environmental load, the higher the proportion of water in the coating liquid for forming a polymer layer, the more desirable. The proportion of water is more preferably 70% by mass or higher in the entire solvent.

[Crosslinking Agent]

It is preferable that the coating liquid for forming a polymer layer contains a crosslinking agent.

If the coating liquid for forming a polymer layer contains the crosslinking agent, this is preferable since a colored layer having adhesiveness and strength can be formed by crosslinking the binder contained in the coating liquid for forming a polymer layer.

Examples of the crosslinking agent include crosslinking agents based on epoxy, isocyanate, melamine, carbodiimide, oxazoline, and the like. Among these, from the viewpoint of securing adhesiveness between the layered portion and the encapsulant or between the layered portion and the polyester substrate after the film is left in a humid and hot environment, oxazoline-based crosslinking agents are particularly preferable.

Specific examples of the oxazoline-based crosslinking agents include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane)sulfide, bis-(2-oxazolinylnorbornane)sulfide, and the like. Moreover, (co) polymers of these compounds can be preferably used.

As the oxazoline-based crosslinking agents, commercially available products may be used. For example, it is possible to use EPOCROS® K2010E, EPOCROS® K2020E, EPOCROS® K2030E, EPOCROS® WS500, EPOCROS® WS700 (all manufactured by Nippon Shokubai Co., Ltd.), and the like.

The content of the crosslinking agent with respect to the total mass of solid contents of the coating liquid for forming a polymer layer is preferably from 5% by mass to 50% by mass, and more preferably from 20% by mass to 40% by mass with respect to the total mass of the aqueous binder. If the content of the crosslinking agent is 5% by mass or more, a sufficient crosslinking effect is obtained, whereby it is possible to suppress strength reduction or adhesion defectiveness of the polymer layer. If the content is 50% by mass or less, it is possible to prevent pot life reduction of the coating liquid for forming a polymer layer.

The surface of the polyester substrate can be coated with the coating liquid for forming a polymer layer by using known methods such as gravure coater and bar coater.

When the coating liquid for forming a polymer layer contains the coloring pigment, from the viewpoint of reflectivity and film strength, the volume fraction of the coloring pigment in the binder is from 50% by volume to 200% by volume. Moreover, it is preferable that the surface of the polyester substrate is coated with the coating liquid for forming a polymer layer, such that the thickness of the liquid becomes from 1 µm to 20 µm after coating. Further, it is preferable to perform coating such that the amount of the coloring pigment used for coating becomes from 3 g/m² to 20 g/m².

—Formation of Undercoat Layer by Coating—

The undercoat layer can be formed by coating the surface of the polyester substrate with a coating liquid for forming an undercoat layer.

The coating liquid for forming an undercoat layer contains at least the aqueous binder and coating solvent.

The coating solvent of the coating liquid for forming an undercoat layer is the same as the coating solvent of the coating liquid for forming a polymer layer, and preferably contains water. Moreover, the content of water in the coating solvent is the same as in the coating liquid for forming a polymer layer, and a preferable embodiment thereof is also the same.

The coating method of the coating liquid for forming an undercoat layer is the same as the method of coating the surface of the polyester substrate with the coating liquid for forming a polymer layer.

From the viewpoint of the adhesiveness and the surface shape, the amount of the coating liquid for forming a undercoat layer that is used for coating the polyester substrate is set such that the thickness of the dried layer becomes preferably less than 10 µm, more preferably from 0.05 µm to 2 µm, and particularly preferably from 0.1 µm to 1.5 µm.

—Formation of Weather-Resistant Layer by Coating—

The coating surface of the weather-resistant layer is not particularly limited. However, it is preferable to perform coating such that the weather-resistant layer becomes the uppermost surface of the polyester film.

That is, when the layered portion has the polymer layer formed on the undercoat layer, it is preferable that the surface of the polymer layer is coated with a coating liquid for forming a weather-resistant layer. When the layered portion is placed only on one surface of the polyester substrate, it is preferable that the weather-resistant layer is formed by coating on the surface of the polyester substrate that is opposite side of the layered portion.

It is preferable that the coating liquid for forming a weather-resistant layer contains at least one of the fluororesin and silicone-acryl composite resin as well as a coating liquid. It is preferable that the layered portion has the weather-resistant layer.

The coating solvent of the coating liquid for forming a weather-resistant layer is the same as the coating solvent of the coating liquid for forming a polymer layer, and preferably contains water. Moreover, the content of water in the coating solvent is the same as in the coating liquid for forming a polymer layer, and a preferable embodiment thereof is also the same.

From the viewpoint of weather resistance and adhesiveness, the amount of the coating liquid for forming a weather-resistant layer used for coating is preferably from 0.5 g/m² to 15 g/m², and more preferably from 3 g/m² to 7 g/m².

The coating method of the coating liquid for forming a weather-resistant layer is the same as the method of coating the surface of the polyester substrate with the coating liquid for forming a polymer layer.

<Back Sheet for Solar Cell and Solar Cell Module>

The back sheet for a solar cell as an embodiment of the invention includes the polyester film as an embodiment of the invention.

The back sheet for a solar cell can be preferably used as a member included in the solar cell module as an embodiment of the invention.

Figure 6:
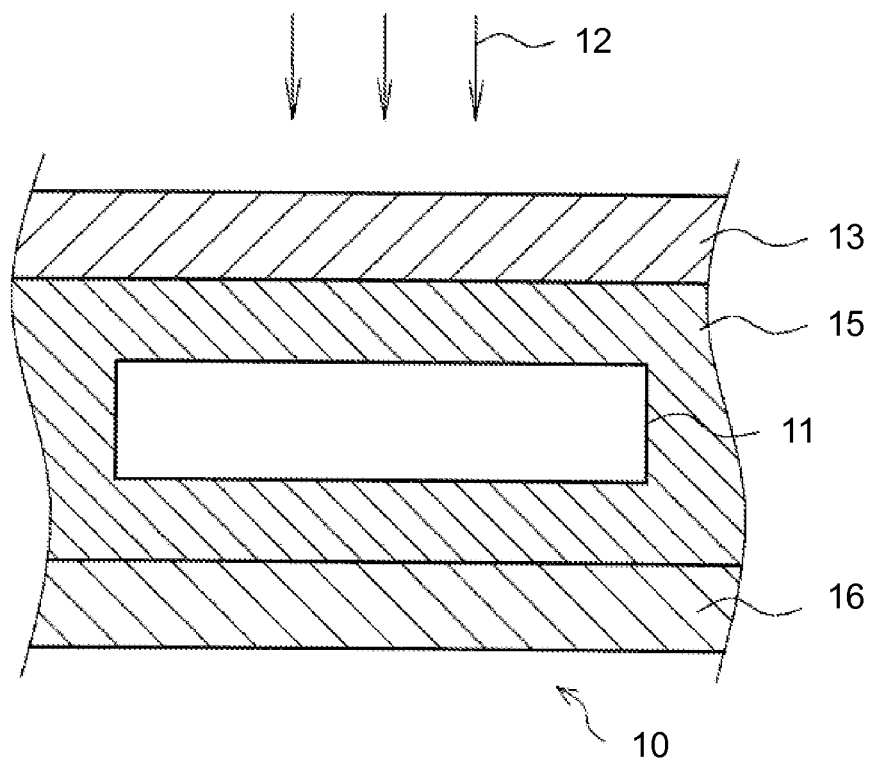
FIG. 6 is a cross-sectional view schematically showing one example of a configuration of the solar cell module as one embodiment of the invention.

For example, as shown in FIG. 6, a solar cell module 10 can have: a transparent front board 13 as a surface member at which sunlight 12 is incident; a cell structure portion that is disposed at one side of the front board 13 and has a solar cell element 11 and an encapsulant 15 which encapsulates the solar cell element 11; and a back sheet for a solar cell 16 which is disposed at a side opposite to the side of the cell structure portion at which the front substrate 13 is positioned and contacts the encapsulant 15.

The members other than the solar cell module, solar cell, and back sheet are described in detail in, for example, "Component Materials for Photovoltaic System" (supervised by Sugimoto Eiichi, published by Kogyo Chosakai Publishing Co., Ltd. in 2008).

The transparent board may have optical transparency that can allow sunlight to be transmitted through the substrate, and can be appropriately selected form optically transparent substrates. The higher the light transmittance, the better it is from the viewpoint of power generation efficiency. As such substrates, for example, a glass substrate and a transparent resin such as an acrylic resin can be preferably used.

As the solar cell element, it is possible to use various known solar cell elements including silicons such as single crystal silicon, poly crystal silicon, amorphous silicon, semiconductors of compounds that belong to group III-V or II-VI, such as copper-indium-gallium-selenium, copper-indium-selenium, cadmium-tellurium, and gallium-arsenic, and the like.

EXAMPLES

Hereinafter, the invention will be described in more detail based on examples, but the invention is not limited to the examples as long as that does not depart from the gist of the invention. Unless otherwise specified, "part" and "%" used for the volume fraction and the like of the coloring pigment are based on mass.

<Synthesis of Law Material Polyester>
(Raw Material Polyester 1)

As described below, polyester (Ti catalyst-based PET) was obtained by using a direction esterification method in which esterification is performed by directly reacting terephthalic acid with ethylene glycol and distilling water away therefrom, and then polycondensation is performed under reduced pressure by using a continuous polymerization apparatus.

(1) Esterification Reaction 4.7 tons of high-purity terephthalic acid was mixed with 1.8 tons of ethylene glycol in a first esterification reaction tank over 90 minutes to form slurry, and the slurry was continuously supplied to the first esterification reaction tank at a flow rate of 3800 kg/h. Moreover, an ethylene glycol solution containing a citric acid-chelated titanium complex (trade name: VERTEC AC420, manufactured by Johnson Matthey) in which citric acid is coordinated to Ti metal was continuously supplied thereto, and a reaction was performed at an internal temperature of the reaction tank of 250° C. under stirring by setting an average residence time to about 4.3 hours. At this time, the citric acid-chelated titanium complex was continuously added such that the amount of Ti added became 9 ppm which being expressed in terms of the element. At this time, an acid value of the obtained oligomer was 600 equivalents/ton.

The reaction product was transferred to a second esterification reaction tank and reacted at an internal temperature of the reaction tank of 250° C. under stirring by setting an average residence time to 1.2 hours, thereby obtaining an oligomer having an acid value of 200 equivalents/ton. The inside of the second esterification reaction tank was divided into three zones. From the second zone, an ethylene glycol solution containing magnesium acetate was continuously supplied such that the amount of Mg added became 75 ppm which being expressed in terms of the element. Subsequently, from the third zone, an ethylene glycol solution containing trimethyl phosphate was continuously supplied such that the amount of P added became 65 ppm which being expressed in terms of the element.

(2) Polycondensation Reaction

The product of the esterification reaction obtained as above was continuously supplied to a first polycondensation reaction tank and subjected to polycondensation at a reaction temperature of 270° C. and an internal pressure of the reaction tank of 20 torr ($2.67 \times 10^{-3}$ MPa) under stirring by setting an average residence time to about 1.8 hours.

Thereafter, the resultant was transferred to a second polycondensation reaction tank and subjected to a reaction (polycondensation) in the reaction tank under stirring, under the conditions of an internal temperature of the reaction tank of 276° C., an internal pressure of the reaction tank of 5 torr ($6.67 \times 10^{-4}$ MPa), and a residence time of about 1.2 hours.

Subsequently, the resultant was transferred to a third polycondensation reaction tank. In this tank, the resultant was subjected to a reaction (polycondensation) under the conditions of an internal temperature of the reaction tank of 278° C., an internal pressure of the reaction tank of 1.5 torr ($2.0 \times 10^{-4}$ MPa), and a residence time of about 1.5 hours, thereby obtaining a reaction product (polyethylene terephthalate (PET)).

The obtained reaction product was then ejected in a form of a strand to cold water and cut immediately, thereby producing polyester pellets (cross section: a major axis of about 4 mm, a minor axis: about 2 mm, a length: about 3 mm).

The obtained polyester was measured as below by using a high-resolution and high-frequency inductively coupled plasma mass spectrometer (HR-ICP-MS) (trade name: ATTOM, manufactured by SII Nanotechnology Inc.), thereby obtaining results of Ti=9 ppm, Mg=75 ppm, and P=60 ppm. The amount of P was slightly reduced compared to the initially added amount. Presumably, this is because P volatilizes in the process of polymerization.

The obtained polymer had IV of 0.65, terminal carboxy group concentration AV of 22 equivalents/ton, melting point of 257° C., solution haze of 0.3%, and glass transition temperature Tg of 73° C.

—Solid-Phase Polymerization—

The polyester pellets obtained as above were subjected to solid-phase polymerization by a batch method. That is, the polyester pellets were put in a container and then subjected to solid-phase polymerization in a vacuum under stirring under the following conditions.

The pellets were subjected to pre-crystallization process at 150° C. and then subjected to a solid-phase polymerization reaction at 190° C. for 30 hours, thereby obtaining a raw material polyester 1 (PET 1). The obtained raw material polyester 1 had intrinsic viscosity IV of 0.79.

(Raw Material Polyester 2)

A raw material polyester 2 (PET 2) was obtained in the same manner as in Synthesis of Raw Material Polyester 1, except that the solid-phase polymerization was performed for 8 hours. The obtained raw material polyester 2 had intrinsic viscosity IV of 0.70.

(Raw Material Polyester 3)

A raw material polyester 3 (PET 3) was obtained in the same manner as in Synthesis of Raw Material Polyester 1, except that the solid-phase polymerization was performed for 60 hours. The obtained raw material polyester 3 had intrinsic viscosity IV of 0.92.

<Production of Polyester Substrate>
—Film Formation Step—

The raw material polyester 1 (PET 1) was dried until the moisture content thereof became 20 ppm or less, and then put into a hopper of a uniaxial kneading extruder having a diameter of 50 mm. Under the following extrusion condition, the raw material polyester 1 was melted at 300° C., passed through a gear pump and a filter (pore size of 20 μm), and extruded from a die. The size of the die slit was adjusted such that the thickness of the polyester sheet became 4 mm. The thickness of the polyester sheet was measured by an automatic thickness gauge installed in the exit of a cast drum.

The molten resin was extruded from the die under the conditions of pressure fluctuation of 1% and temperature distribution of the molten resin of 2%. Specifically, the back pressure was regulated to be 1% higher than the average internal pressure of a barrel of the extruder, and the piping temperature of the extruder was regulated to be 2% higher than the average internal temperature of a barrel of the extruder to heat the resin.

The molten resin was extruded from the die onto a cast drum for cooling and caused to adhere to the cast drum for cooling by using a static electricity applying method.

For cooling the molten resin, the temperature of the cast drum for cooling was set to 25° C., and the molten resin was exposed to cold air of 25° C. blown from a cold air generating apparatus that was disposed to face the cast drum for cooling. By using a separation roll that was disposed to face the cast drum for cooling, the unstretched polyester film (unstretched polyester film 1) having the thickness described in Table 2 was separated from the cast drum for cooling.

The obtained unstretched polyester film 1 had intrinsic viscosity IV of 0.72, terminal carboxy group concentration AV of 15 equivalents/ton, glass transition temperature Tg of 73° C., and thickness of 3.4 μm.

To determine the IV, the unstretched polyester film 1 was dissolved in a mixed solvent of 1,1,2,2-tetrachloroethane/phenol (mass ratio: 2/3), and IV was obtained from the solution viscosity at 25° C. in the mixed solvent.

To determine the AV, the unstretched polyester film 1 was completely dissolved in a mixed solution of benzyl alcohol/chloroform (volume ratio: 2/3), phenol red was used for titration as an indicator by using a reference solution (0.025 N KOH-methanol mixed solution), and the AV was calculated from the titer.

The Tg was measured and determined based on JIS K 7121, that substantially corresponds to ISO 3146:1985.

—Production of Biaxially Stretched Polyester Film—

The obtained unstretched polyester film 1 was subjected to sequential biaxial stretching by the following method and stretched in the following manner, thereby obtaining a biaxially stretched polyester film 1 having a thickness of 250 μm.

—Vertical Stretching Step—

The unstretched polyester film 1 was caused to pass between two pairs of nip rolls having different circumferential speed, and stretched in the vertical direction (transport direction) under the following conditions.

Preheating temperature: 80° C.
Vertical stretching temperature: temperature shown in Tables 2 and 3 [° C.]
Vertical stretch ratio: ratio shown in Tables 2 and 3 [fold]
Vertical stretching stress: 12 MPa —Horizontal Stretching Step—

The polyester film 1 stretched vertically (vertically stretched polyester film 1) was stretched under the following conditions by using a tenter (biaxial stretching machine) having the structure shown in FIG. 1.

(Preheating Portion)
Preheating temperature: 110° C.
(Stretching Portion)
Stretching temperature (horizontal stretching temperature): temperature shown in Tables 2 and 3 [° C.]
Stretch ratio (horizontal stretch ratio): ratio shown in Tables 2 and 3 [fold]
Stretching stress (horizontal stretching stress): 18 MPa
(Thermal Fixing Portion)
Thermal fixing temperature ($T_{thermal\ fixing}$): temperature shown in Tables 2 and 3 [° C.]
(Thermal Relaxation Portion)
Thermal relaxation temperature ($T_{thermal\ relaxation}$): temperature shown in Tables 2 and 3 [° C.]
Relaxation Ratio
TD direction (ΔL): ratio shown in Tables 2 and 3(%)
MD direction (ΔS): ratio shown in Tables 2 and 3(%)

(Cooling Portion)
Cooling temperature: 65 [° C.]
(Collecting Film)

After the thermal relaxation, both ends of the polyester film 1 were trimmed by 20 cm. Thereafter, both ends of the polyester film 1 were subjected to extrusion (knurling) in a width of 10 mm, and then the film was wound up at a tension of 25 kg/m.

In the above manner, a biaxially stretched polyester film (PET film) 1 of Example 1 having a thickness of 250 μm was produced. This film was taken as a polyester film substrate (polyester substrate B1).

The thickness of the obtained biaxially stretched polyester film 1 was measured using a contact-type film thickness gauge (manufactured by Anritsu). From the film, 50 points having the same interval therebewteen were sampled within a range of 0.5 m in the longitudinal direction, and 50 points having the same interval therebetween (points obtained by dividing the film into 50 equal parts in the width direction) were sampled over the entire width of the formed film in the width direction, so as to measure the thickness of these 100 points. The average thickness of these 100 points was calculated and taken as the average thickness of the film.

The thickness of the biaxially stretched polyester film 1 (polyester substrate B1) is shown in Tables 2 and 3.

—Production of Polyester Substrates B1 to B5, B101, and B102—

Unstretched polyester films were obtained in the same manner as in Production of Polyester Substrate B1, except that the raw material polyester was changed to any one of the PET1 to PET 3 shown in Table 2. Moreover, polyester substrates B2 to B5, B101, and B102 were produced by the same process as in the case of polyester substrate B1, except that the respective films were stretched under the film formation condition shown in Table 2.

In Tables 2 and 3 shown below, "PET 1" to "PET 3" in the column of "type" of "raw material polyester" of "film formation condition of polyester substrate" show that raw materials polyester 1 (PET 1) to raw material polyester 3 (PET 3) are used respectively as the raw material polyester.

<Measurement of Specific IR Intensity Ratio of Polyester Substrate>

From the obtained biaxially stretched polyester film (polyester substrate), an infrared absorption spectrum was obtained using FT-IR FTS 7000 (trade name) manufactured by Digilab, Inc.) and an ATR prism of Ge. Thereafter, from the obtained infrared absorption spectrum, the absorption intensity at 988 $cm^{-1}$ and the absorption intensity at 1410 $cm^{-1}$ were determined, and a ratio between the intensities [specific IR intensity ratio=(peak intensity at 988 $cm^{-1}$)/(peak intensity at 1410 $cm^{-1}$)] was calculated.

The results are shown in the column of "specific IR intensity ratio" of "physical properties of polyester substrate" of Tables 2 to 5.

Production of Polyester Film

Example 1

The surface of the polyester substrate B1 was coated with a coating liquid for forming a polymer layer S1 by bar coater, thereby forming a polymer layer. Moreover, a first weather-resistant layer 1 and a second weather-resistant layer 2 shown below were formed in this order on the surface opposite to the surface coated with the polymer layer, thereby producing a polyester film of Example 1.

The coating liquid for forming a polymer layer S1 and the first and second weather-resistant layers were produced in the following manner.

—Production of Coloring Pigment Dispersion 1—

The components of the following composition were mixed together, and the mixture was dispersed by using a Dyno-Mill-type disperser, thereby obtaining a coloring pigment dispersion 1 having a volume average particle size of 0.42 μm.

(Composition of Coloring Pigment Dispersion 1)

| | |
|---|---|
| Titanium dioxide [TIPAQUE ® CR-95, manufactured by ISHIHARA SANGYO KAISHA, LTD., solid content: 100%; white pigment] | 46.5 parts |
| 10% Aqueous polyvinyl alcohol (PVA) solution [trade name: PVA-105, manufactured by KURARAY, CO., LTD., solid content: 100%] | 23.3 parts |
| Surfactant [DEMOL ® EP, manufactured by Kao Corporation, solid content: 25%] | 0.56 parts |
| Distilled water | 29.54 parts |

—Production of Coating Liquid for Forming Polymer Layer S1—

The components of the following composition were mixed together, thereby producing the coating liquid for forming a polymer layer S1.

(Composition of Coating Liquid for Forming Polymer Layer S1)

| | |
|---|---|
| Coloring pigment dispersion 1 | 30.5 parts |
| Aqueous dispersion of polyolefin resin (binder) [AROBASE ® SE-1013N, manufactured by UNITIKA, LTD., solid content: 20.2%] | 55.1 parts |
| 1% Aqueous polyoxyalkylene alkyl ether solution [NAROACTY ® CL95, manufactured by Sanyo Chemical Industries, Ltd., solid content: 100%] | 0.86 parts |
| Oxazoline compound [EPOCROS ® WS-700, manufactured by Nippon Shokubai Co., Ltd., solid content: 25%] | 9.5 parts |
| Distilled water | 4.04 parts |

—Formation of Polymer Layer—

One surface of the polyester substrate B1 was transported at a transport speed of 80 m/min and subjected to corona discharge process under the condition of 730 J/m². Thereafter, the surface was coated with the coating liquid for forming a polymer layer S1 by a bar coating method such that the mass thereof after drying became 11.1 g/m², and the resultant was dried at 170° C. for 1 minute, thereby obtaining a white PET film 1 having a layered portion in which a white polymer layer (olefin-based polymer layer) having a dry thickness of 7 μm was layered on one surface of the polyester substrate B1.

—Measurement of Elastic Modulus of Binder of Polymer Layer (Olefin-Based Polymer Layer)—

The elastic modulus of the binder used for the polymer layer of the white substrate PET film 1 was measured by the following method.

A single binder film (film thickness: about 100μ) was formed on CERAPEEL® HP2 (manufactured by Toray Advanced Film Co., Ltd.), and then only the single binder film was separated therefrom carefully so as not to be stretched. The obtained single binder film was cut in 5 mm×50 mm, and by using a tensilon (trade name: RTM-50, manufactured by Orientec Co., Ltd), a tensile test is performed in an environment of 25° C. and 50% RH under the conditions of an inter-chuck distance of 20 mm and a crosshead speed of 50 mm/min. The obtained data was analyzed by test data processing software for general purpose, and the elastic modulus was calculated from a stress-strain curve.

The obtained results are described in the column of "elastic modulus" of "binder" of "polymer layer (layered portion)" of Tables 4 and 5.

<Formation of Weather-Resistant Layer>

The first weather-resistant layer and the second weather-resistant layer described below were formed in this order on the surface opposite to the surface of the white substrate PET film that was coated with the polymer layer.

—Production of White Inorganic Fine Particle Dispersion—

The respective components described in the composition of the following white inorganic fine particle dispersion were mixed together, and the mixture was dispersed for 1 hour by using a Dyno-Mill-type disperser, thereby obtaining a dispersion 2 of fine particles having a volume average particle size of 0.42 μm.

(Composition of White Inorganic Fine Particle Dispersion)

| | |
|---|---|
| Titanium dioxide [TIPAQUE ®) CR-95, manufactured by ISHIHARA SANGYO KAISHA, LTD., solid content: 100%; white pigment] | 46.5 parts |
| 10% Aqueous polyvinyl alcohol (PVA) solution [trade name: PVA-105, manufactured by KURARAY, CO., LTD., solid content: 100%] | 23.3 parts |
| Surfactant [DEMOL ® EP, manufactured by Kao Corporation, solid content: 25%] | 0.56 parts |
| Distilled water | 29.54 parts |

—Production of Coating Liquid for Forming First Weather-Resistant Layer—

The respective components described in the composition of the following coating liquid for forming a first weather-resistant layer were mixed together, thereby producing a coating liquid for forming a first weather-resistant layer.

(Composition of Coating Liquid for Forming First Weather-Resistant Layer)

| | |
|---|---|
| Aqueous silicone polymer dispersion (CERANATE ®) WSA1070, manufactured by DIC Corporation, solid content concentration 37.4% by mass) | 36.4% |
| Oxazoline-based crosslinking agent (EPOCROS ® WS-700, manufactured by Nippon Shokubai Co., Ltd., (solid content: 25% by mass); crosslinking agent having an oxazoline group) | 11.2% |
| Diammonium hydrogen phosphate (onium compound) | 0.4% |
| Coloring pigment dispersion 1 | 49.4% |
| Distilled water | 1.1% |

—Formation of First Weather-Resistant Layer—

The surface of the white PET film opposite to the surface coated with the white colored layer was transported at a transport speed of 80 m/min and subjected to corona discharge process under the condition of 730 J/m². Thereafter, the surface having undergone the corona discharge process was coated with the coating liquid for forming a first weather-resistant layer such that the amount of the silicone-based resin used for coating became 6.1 g/m², and the resultant was dried at 180° C. for 1 minute, thereby forming the first weather-resistant layer having a dry thickness of 8 μm.

—Production of Coating Liquid for Forming Second Weather-Resistant Layer—

The respective components described in the composition of the following coating liquid for forming a second weather-resistant layer were mixed together, thereby producing a coating liquid for forming a second weather-resistant layer.

(Composition of Coating Liquid for Forming Second Weather-Resistant Layer)

| | |
|---|---|
| Aqueous fluorine polymer dispersion (OBBLIGATO ® AW0011F, manufactured by AGC Coat-Tech Co., Ltd., solid content concentration of 36.1% by mass) | 20.7% |
| Polyoxyalkylene alkyl ether [NAROACTY ® CL-95, manufactured by Sanyo Chemical Industries, Ltd., solid content of 1%] | 0.4% |
| Oxazoline-based crosslinking agent (EPOCROS ® WS-700, manufactured by Nippon Shokubai Co., Ltd., (solid content: 25% by mass); crosslinking agent having an oxazoline group) | 6.0% |
| Silica sol [SNOWTEX ®-UP, manufactured by Nissan Chemical Industries, Ltd., solid content of 20%] | 0.2% |
| Silane coupling agent [TSL8340, manufactured by Momentive Performance Meterials Inc., solid content of 1%] | 4.7% |
| Polyolefin wax dispersion [CHEMIPEARL ® W950, manufactured by Mitsui Chemicals, Inc., solid content of 5%] | 12.5% |
| Distilled water | 55.5% |

—Formation of Second Weather-Resistant Layer—

The surface of the first weather-resistant layer was coated with the obtained coating liquid for forming a second weather-resistant layer such that the amount of the silicone-based resin used for coating became 1.3 g/m², and the resultant was dried at 180° C. for 1 minute, thereby obtaining the second weather-resistant layer having a dry thickness of 1.3 μm.

Examples 2 to 14 and Comparative Examples 1 to 6

Polyester films of Examples 2 to 14 and Comparative Example 1 to 6 were respectively produced in the same manner as in producing the white substrate PET film 1 of Example 1, except that the polyester substrates B1 to B5, B101, or B102 shown in Table 3 were used as the polyester substrate 1, the coating liquids for forming a polymer layer S1 to S8 or S101 to S104 shown in Tables 4 and 5 were used as the coating liquid for forming a polymer layer, and the thickness of the layered portion of the polymer layer side was adjusted to the value shown in Tables 4 and 5 by adjusting the amount of the coating liquid.

In the column of "type" of "physical properties of polyester substrate" in Tables 4 and 5, the type of the polyester substrate used for producing the polyester film of Example 1 was described. Moreover, the column of "formation method" of "polymer layer (layered portion)" in Tables 4 and 5 describes the method of forming the layered portion, and the column of "coating liquid" of "polymer layer (layered portion)" in Tables 4 and 5 described the type of the coating liquid for forming a polymer layer.

The elastic modulus of the binder used for the polymer layer of each of the produced polyester films of Examples 2 to 14 and Comparative Examples 1 to 6 was measured by the same method as used for measuring the elastic modulus of the binder of the polymer layer of the white substrate PET film 1, and shown in Tables 4 and 5.

—Coating Liquid for Forming Polymer Layer S2—

A coating liquid for forming a polymer layer S2 was produced in the same manner as in producing the coating liquid for forming a polymer layer S1, except that the binder (aqueous polyolefin resin dispersion) was replaced with an urethane-based binder SUPERFLEX® 460 (manufactured by Dai-Ichi Kogyo Seiyaku Co., Ltd., solid content of 38.1%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S3—

A coating liquid for forming a polymer layer S3 was produced in the same manner as in producing the coating liquid for forming a polymer layer S1, except that the binder (aqueous polyolefin resin dispersion) was replaced with an olefin-based binder HITEC 53121 (trade name, manufactured by Toho Chemical Industry Co., Ltd., solid content of 25%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S4—

A coating liquid for forming a polymer layer S4 was produced in the same manner as in producing the coating liquid for forming a polymer layer S1, except that the binder (aqueous polyolefin resin dispersion) was replaced with an olefin-based binder CHEMIPEARL® 5120 (manufactured by Mitsui Chemicals, Inc., solid content of 27%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S5—

A coating liquid for forming a polymer layer S5 was produced in the same manner as in producing the coating liquid for forming a polymer layer S1, except that the binder (aqueous polyolefin resin dispersion) was replaced with an acryl-based binder JONCRYL® PDX7341 (manufactured by BASF, Ltd., solid content of 49%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S6—

A coating liquid for forming a polymer layer S6 was produced in the same manner as in producing the coating liquid for forming a polymer layer S1, except that the binder (aqueous polyolefin resin dispersion) was replaced with an olefin-based binder AROBASE® SE-1013N (manufactured by Unitika, Ltd., solid content of 20.2%), and the volume fraction of the coloring pigment (white pigment; titanium dioxide) was adjusted to the value shown in Table 3.

—Coating Liquid for Forming Polymer Layer S7—

A coating liquid for forming a polymer layer S7 was produced in the same manner as in producing the coating liquid for forming a polymer layer S1, except that an olefin-based binder AROBASE® SE-1010N (manufactured by Unitika, Ltd., solid content of 20.2%) was used as the binder (aqueous polyolefin resin dispersion), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S8—

A coloring pigment dispersion 2 was produced in the same manner as in producing the coloring pigment dispersion 1, except that the coloring pigment (titanium dioxide) was replaced with carbon black (trade name: MF-5630, manufactured by Dainichiseika Color & Chemicals MFG Co., Ltd., solid content of 31.5%).

Thereafter, a coating liquid for forming a polymer layer S8 was produced in the same manner as in producing the coating liquid for forming a polymer layer S1, except that the coloring pigment dispersion 2 was used instead of the coloring pigment dispersion 1, and the volume fraction of the coloring pigment (carbon black) was adjusted to the value shown in the column of "amount" of "coloring pigment" of "polymer layer (layered portion)" in Table 3.

—Coating Liquid for Forming Polymer Layer S101—

A coating liquid for forming a polymer layer S101 was produced in the same manner as in producing the coating liquid for forming a polymer layer S1, except that an olefin-based binder AROBASE® SE-1013N (manufactured by Unitika, Ltd., solid content of 20.2%) was used as the binder (aqueous polyolefin resin dispersion), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S102—

A coating liquid for forming a polymer layer S102 was produced in the same manner as in producing the coating liquid for forming a polymer layer S1, except that the binder (aqueous polyolefin resin dispersion) was replaced with an olefin-based binder CHEMIPEARL® 5120 (manufactured by Mitsui Chemicals, Inc., solid content of 27%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S103—

A coating liquid for forming a polymer layer S103 was produced in the same manner as in producing the coating liquid for forming a polymer layer S1, except that the binder (aqueous polyolefin resin dispersion) was replaced with a vinyl chloride-based binder VINYBLAN® GV681 (manufactured by Nissin Chemical Co., Ltd., solid content of 50%), and the volume fraction of the coloring pigment (white pigment; titanium dioxide) was adjusted to the value shown in the column of "amount" of "coloring pigment" of "polymer layer (layered portion)" in Table 3.

—Coating Liquid for Forming Polymer Layer S104—

A coating liquid for forming a polymer layer S104 was produced in the same manner as in producing the coating liquid for forming a polymer layer S1, except that the binder (aqueous polyolefin resin dispersion) was replaced with a polyester-based binder VYLONAL® MD-1200 (manufactured by Toyobo Co., Ltd., solid content of 34%), and the volume fraction of the coloring pigment (white pigment; titanium dioxide) was adjusted to the value shown in the column of "amount" of "coloring pigment" of "polymer layer (layered portion)" in Table 3.

Example 15

In Example 15, a layered body consisting of a substrate film and a colored layer was produced under the same film formation condition as in Example 1, except that during the production of the polyester substrate B1, the following coloring pigment-containing polyethylene was co-extruded from the extrusion die onto the surface of the polyester substrate B1 opposite to the surface that is to contact the cast drum for cooling, such that the thickness of the layered portion became 15 μm after stretching. Thereafter, in the same manner as in Example 1, a weather-resistant layer was layered on the surface opposite to the surface on which the co-extrusion was performed.

(Production of Pigment-Containing Master Batch A)

| | |
|---|---|
| Coloring pigment (trade name: A250, manufactured by Ishihara Sangyo Kaisha, Ltd.; titanium oxide) | 40 parts |
| Low-density polyethylene (trade name: LC607K, manufactured by Japan Polyethylene Corporation) | 60 parts |

(Production of Coloring Pigment-Containing Polyethylene)

| | |
|---|---|
| Pigment-containing master batch A | 35 parts |
| Low-density polyethylene (SUMIKATHENE® L405H, manufactured by Sumitomo Chemical Co., Ltd.) | 15 parts |

Example 16

In Example 16, the following coloring pigment-containing polyethylene was extruded onto the polyester substrate B1 from a coathanger die at a molten resin temperature of 320° C. such that the polyethylene is laminated on the substrate film at a thickness of 15 μm, thereby producing a layered body consisting of the substrate film and the colored layer. Thereafter, a weather-resistant layer was layered on the surface opposite to the laminate surface in the same manner as in Example 1.

(Production of Pigment-Containing Master Batch A)

| | |
|---|---|
| Coloring pigment (trade name: A250, manufactured by Ishihara Sangyo Kaisha, Ltd.; titanium oxide) | 40 parts |
| Low-density polyethylene (trade name: LC607K, manufactured by Japan Polyethylene Corporation) | 60 parts |

(Production of Coloring Pigment-Containing Polyethylene)

| | |
|---|---|
| Pigment-containing master batch A | 35 parts |
| Low-density polyethylene (SUMIKATHENE® L405H, manufactured by Sumitomo Chemical Co., Ltd.) | 15 parts |

Examples 17 to 19

In Example 17, the following cyclic carbodiimide (1) as a cyclic carbodiimide compound was added as an additive in an amount of 8% by mass to the raw material polyester PET 1. In Example 18, the following cyclic carbodiimide (2) was added in an amount of 8% by mass to the raw material polyester PET 1. In Example 19, the cyclic carbodiimide (1) was added as an additive in an amount of 8% by mass to the raw material polyester PET 2.

The cyclic carbodiimide (1) is a compound having a molecular weight of 516 described in Example of JP-A No.

2011-258641. It was synthesized with reference to the synthesis method described in Reference Example 2 of JP-A No. 2011-258641.

The cyclic carbodiimide (2) is a compound having a molecular weight of 252 described in Example of JP-A No. 2011-258641. It was synthesized with reference to the synthesis method described in Reference Example 1 of JP-A No. 2011-258641.

The structures of the cyclic carbodiimide compounds are shown below.

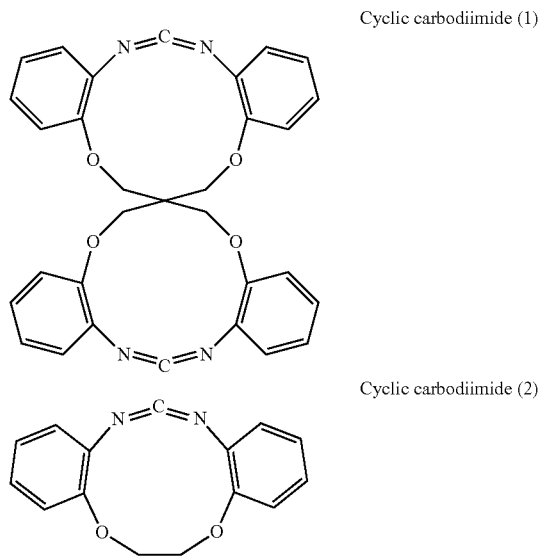

Cyclic carbodiimide (1)

Cyclic carbodiimide (2)

The PET 1 used in Example 1 or the PET 2 used in Example 10 was put into a hopper of a biaxial kneading extruder having a diameter of 50 mm by using a main feeder, and the cyclic carbodiimide (1) or the cyclic carbodiimide (2) was put into a side feeder. The materials were melted at 280° C., and the resultant was extruded. The extruded melt was caused to pass through a gear pump and a filter (having a pore size of 20 μm) and then extruded from the die onto a cooling roll of 20° C., thereby obtaining an amorphous sheet. The extruded melt was caused to adhere to the cooling roll by a static electricity applying method.

Regarding the obtained unstretched polyester films that were used in Examples 17 and 18, the intrinsic viscosity IV of the films of Examples 17 and 18 was 0.78 and 0.77 respectively, and the thickness of the films was 3.4 μm in both the Examples 17 and 18.

Polyester substrates B6 to B8 were obtained in the same manner as in Example 1, except that these stretched polyester films were used instead of the stretched film made of PET 1. By using each of the obtained substrate films, a layered body consisting of the substrate film and a colored layer was produced. Thereafter, in the same manner as in Example 1, a weather-resistant layer was layered on the surface opposite to the surface on which the colored layer had been layered.

Examples 20 to 23

In the present embodiment, CHDM-based polyester was used instead of PET.

(1) Production of CHDM-Based Polyester

First step: isophthalic acid (IPA) and terephthalic acid (TPA) as dicarboxylic acid components and cyclohexanedimethanol (CHDM) and ethylene glycol (EG) as diol components were melted in a nitrogen atmosphere at 150° C. by using magnesium acetate and antimony trioxide as catalysts, and the temperature of the resultant was increased to 230° C. over 3 hours under stirring, while distilling methanol was away, and the ester exchange reaction was terminated. At this time, by varying the addition amounts of IPA, TPA, CHDM, and EG, the CHDM-based polyester having the following composition was obtained.

Second step: after the termination of the ester exchange reaction, an ethylene glycol solution obtained by dissolving phosphoric acid in ethylene glycol was added to the resultant.

Third step: a polymerization reaction was performed at a degree of vacuum of 0.1 Torr until the final temperature became 285° C., thereby obtaining polyester. The polyester was made into pellets.

Fourth step: some of the polyester pellets obtained as above was crystallized by being dried at 160° C. for 6 hours.

The CHDM-based polyester obtained as above was measured in terms of the cyclohexanedimethanol content in the diol component and the isophthalic acid content in the dicarboxylic acid component by the following method.
(Composition Measuring Method)

The CHDM-based polyester pellets were dissolved in hexafluoroisopropanol (HFIP), and then the quantity thereof was determined by $^1$H-NMR. Samples (CHDM, terephthalic acid, EG, and isophthalic acid) were measured in advance, and by using these, signal identification was performed.

The amount of the isophthalic acid residues and the amount of the CHDM residues were described below. The terephthalic acid content (mol %) was obtained by 100 mol %−isophthalic acid content (mol %), and the EG content (mol %) was obtained by 100 (mol %)−CHDM content (mol %).

A part of the polyester was dried and then subjected to solid-phase polymerization at 210° C. for 24 hours under a nitrogen flow.

The IV and AV of the CHDM-based polyester were measured by the method and described below.

| (Produced CHDM-Based Polyester) | | | | |
|---|---|---|---|---|
| | Solid-phase polymerization | IPA (mol %) | CHDM (mol %) | IV (dl/g) | AV (eq/t) |
| CHDM1 | Not performed | 0 | 1 | 0.75 | 20 |
| CHDM2 | Not performed | 0 | 10 | 0.77 | 18 |
| CHDM3 | Performed | 0 | 10 | 0.83 | 12 |
| CHDM4 | Not performed | 0 | 20 | 0.80 | 15 |

(4) Film Formation by Melting
(4-1) Extrusion

The above-described resins were dried. Thereafter, by using a biaxial extruder, PET 1 was melted and kneaded at 280° C., and CHDM1 to CHDM4 were melted and kneaded at 285° C., in a vacuum.

The melted and kneaded resin was extruded onto a cast drum of 25° C. by using a feed block die, thereby producing a single-layered film composed as below. In the column of "type" of the raw material polyester of Tables 2 and 3, the type of raw material resin used and the physical properties of the respective resins are described.

| | Raw material resin |
|---|---|
| CHDM film 1 | CHDM1 |
| CHDM film 2 | CHDM2 |
| CHDM film 3 | CHDM3 |
| CHDM film 4 | CHDM4 |

Each of the obtained CHDM films was stretched by 3.5-fold in the vertical direction and by 4-fold in the horizontal direction. The stretching temperature was set to 90° C. for vertical stretching and 120° C. for horizontal stretching. Thereafter, the film was thermally fixed at 210° C., and relaxed at 205° C. in the vertical and horizontal directions by 5% respectively.

Each of the CHDM films, which had undergone the thermal process, trimming of both ends, and knurling, was wound up at a width of 2.5 m and a length of 1,500 m. The thickness of the CHDM film 1 to CHDM film 4 wound up was 250 µm.

Substrate films B8 to B11 were produced in the same manner as in Example 1, except that the stretched CHDM-based polyester films were used instead of the stretched films made of PET 1. Thereafter, layered bodies consisting of each of the obtained substrate films and a colored layer were produced. Subsequently, in the same manner as in Example 1, a weather-resistant layer was layered on the surface opposite to the surface on which the colored layer was layered.

Examples 24 to 27 and Comparative Examples 7 and 8

(1) Preparation of PET-Based Polyester

PET-based polyester was produced in the same manner as in the case of the CHDM-based polyester, except that CHDM and IPA were not added thereto.

(2) Production of CHDM-Based Polyester

The following PET 1 and CHDM 5 to CHDM 8 were produced in the same manner as in the case of CHDM 1 to CHDM 4.

| | Solid-phase polymerization | IPA (mol %) | CHDM (mol %) | IV (dl/g) | AV (eq/t) |
|---|---|---|---|---|---|
| PET1 | Performed | 0 | 0 | 0.77 | 12 |
| CHDM-5 | Not performed | 5 | 80 | 0.82 | 12 |
| CHDM-6 | Not performed | 5 | 90 | 0.88 | 10 |
| CHDM-7 | Performed | 5 | 90 | 1.02 | 8 |
| CHDM-8 | Not performed | 5 | 100 | 0.95 | 8 |

The PET 1 and CHDM 5 to CHDM 8 were melted and formed into films in the same manner as in the case of CHDM 1 to CHDM 4.

For extrusion, the resin was dried. Thereafter, by using a biaxial extruder, PET-1 was melted and kneaded at 280° C., and CHDM 5 to CHDM 8 were melted and kneaded at 305° C., in a vacuum.

The melted and kneaded resin was extruded onto a cast drum of 25° C. by using a feed block die, thereby producing layered films composed as below. In the column of "type" of the raw material polyester of Tables 2 and 3, the type of raw material resin used for forming each layer of the layered film having a three-layered structure and the physical properties of each resin are described.

TABLE 1

| | Raw material resin | Number of layers | Thickness ratio among respective layers |
|---|---|---|---|
| CHDM film 5 | CHDM5/PET1/CHDM5 | 3 | 1.5/7/1.5 |
| CHDM film 6 | CHDM6/PET1/CHDM6 | 3 | 1.5/7/1.5 |
| CHDM film 7 | CHDM7/PET1/CHDM7 | 3 | 1.5/7/1.5 |
| CHDM film 8 | CHDM8/PET1/CHDM8 | 3 | 1.5/7/1.5 |

The films were stretched by 3.5-fold in the vertical direction and by 4-fold in the horizontal direction. Herein, CHDM film 5 to CHDM film 8 were vertically stretched at 100° C. and horizontally stretched at 130° C. Thereafter, the films were thermally fixed at 210° C., and relaxed in the vertical and horizontal directions at 205° C. by 5% respectively.

After the thermal process, both ends of the films were trimmed, and the films were subjected to knurling process. Thereafter, the films were wound up at a width of 2.5 m and a length of 1,500 m. The total thickness of all of the layers of the CHDM film 5 to CHDM film 8 wound up that had a three-layered structure was 250 µm.

Substrate films B12 to B15 and B103 were produced in the same manner as in Example 1, except that the substrate films having a three-layered structure including the stretched CHDM-based polyester film layer were used instead of the stretched film made of PET 1. By using the substrate films, a layered body consisting of each of the substrate films and a colored layer was produced. As shown in Table 5, the polyester-based 5104 was used as a coating liquid for forming a polymer layer for forming B103. Thereafter, in the same manner as in Example 1, a weather-resistant layer was layered on the surface opposite to the surface on which the colored layer was layered.

Examples 28 to 30

Unstretched polyester films of Examples 28 to 30 were obtained in the same manner as in producing the unstretched polyester film 1 of Example 1, except that the temperature of melting/extrusion in the film formation step was changed to 298° C. (Example 28), 301° C. (Example 29), or 303° C. (Example 30) from 300° C.

Subsequently, polyester substrates 16 to 18 of Examples 28 to 30 were obtained in the same manner as in producing the polyester substrate 1 of Example 1, except that the obtained unstretched polyester films of Examples 28 to 30 were used instead of the unstretched polyester film 1.

Moreover, white substrate PET films of Examples 28 to 30 were produced in the same manner as in producing the white substrate PET film 1 of Example 1, except that the obtained polyester substrates 16 to 18 were used instead of the polyester substrate 1.

<Physical Properties of Layered Portion>

The elastic modulus and thickness of the layered portion included in the respective polyester films of Examples 1 to 30 and Comparative Examples 1 to 8 were measured by the following method.

For measuring the elastic modulus of the layered portion, coating or lamination was performed (the film thickness was adjusted to 20 µm to 100 µm) on CERAPEEL® HP2 (manufactured by Toray Advanced Film Co., Ltd.) to form the layered portion, and only the dried coating film or laminate film was separated carefully so as not to be stretched. The obtained film was cut in 5 mm×50 mm, and by using a tensilon (trade name: RTM-50, manufactured by Orientec Co., Ltd), a tensile test was performed in an environment of 25° C. and 50% RH, under the conditions of an inter-chuck distance of 20 mm and a crosshead speed of 50 mm/min. The obtained data was analyzed using test data processing software for general purpose, thereby calculating the elastic modulus from a stress-strain curve.

The thickness of the layered portion was observed and measured using a scanning electron microscope (manufactured by Hitachi, Ltd., trade name: SEM TYPE H).

The results are described in the columns of "elastic modulus" and "thickness" of "polymer layer (layered portion)" in Tables 4 and 5.

<Haze Measurement>

For each of the polyester films of Examples 1 to 30 and Comparative Examples 1 to 8, the haze of the entire polyester film (haze of the entire polyester film in the thickness direction) and the haze of 10 μm of the surface layer of the polyester substrate were measured using HZ-1 manufactured by Suga Test Instruments Co., Ltd. Moreover, the haze of the layered portion was measured after sampling 10 μm of the layered portion by using a microtome RM2165 manufactured by Leica Mycrosystems. The measurement results are shown in Tables 1 to 4.

Evaluation

Each of the obtained polyester films of examples and comparative examples was evaluated as below. The results are shown in Tables 4 and 5.

1. Measurement of Surface Separating/Breaking Strength

By using the layered body for measurement that was obtained by sticking each of the polyester films obtained in examples and comparative examples to an EVA encapsulant and a PEN film, the surface separating/breaking strength of the polyester film at the time when the EVA encapsulant was separated from the polyester film was measured. Specifically, the measurement was performed as below.

First, before the EVA encapsulant is layered on the polyester film, cuts were made on the polymer layer as the layered portion of the polyester film, such that the separation interface between the polyester film and the EVA encapsulant was formed on the surface layer portion of the polyester film.

Thereafter, on the surface of the layered portion in which cuts had been made, an EVA encapsulant (Mitsui Chemicals Tohcello, Inc., trade name: SC52B) of 400 μm and a PEN film (manufactured by Teijin DuPont Films Japan Limited) of 38 μm are layered in this order to perform lamination. Moreover, paper for peeling (manufactured by Toray Advanced Film Co., Ltd., CERAPEEL® BX) was inserted into the end between the polymer layer and the EVA encapsulant. The lamination conditions are as follows.

Instrument used: PVL0202S (trade name, manufactured by Nisshinbo Mechatronics Inc.)

Lamination conditions: after vacuuming was performed at 128° C. for 3 minutes, the films and the encapsulant were pressed for 2 minutes so as to be temporarily stuck to each other. After being temporarily stuck to each other, the films and encapsulant were permanently stuck to each other at 150° C. for 30 minutes by using a separately prepared dry oven.

Subsequently, the polyester substrate breaking strength at the time when the EVA encapsulant was separated from each polyester film was measured.

The measurement of surface separating/breaking strength is explained below with referring to FIGS. 3 and 4.

Figure 4:
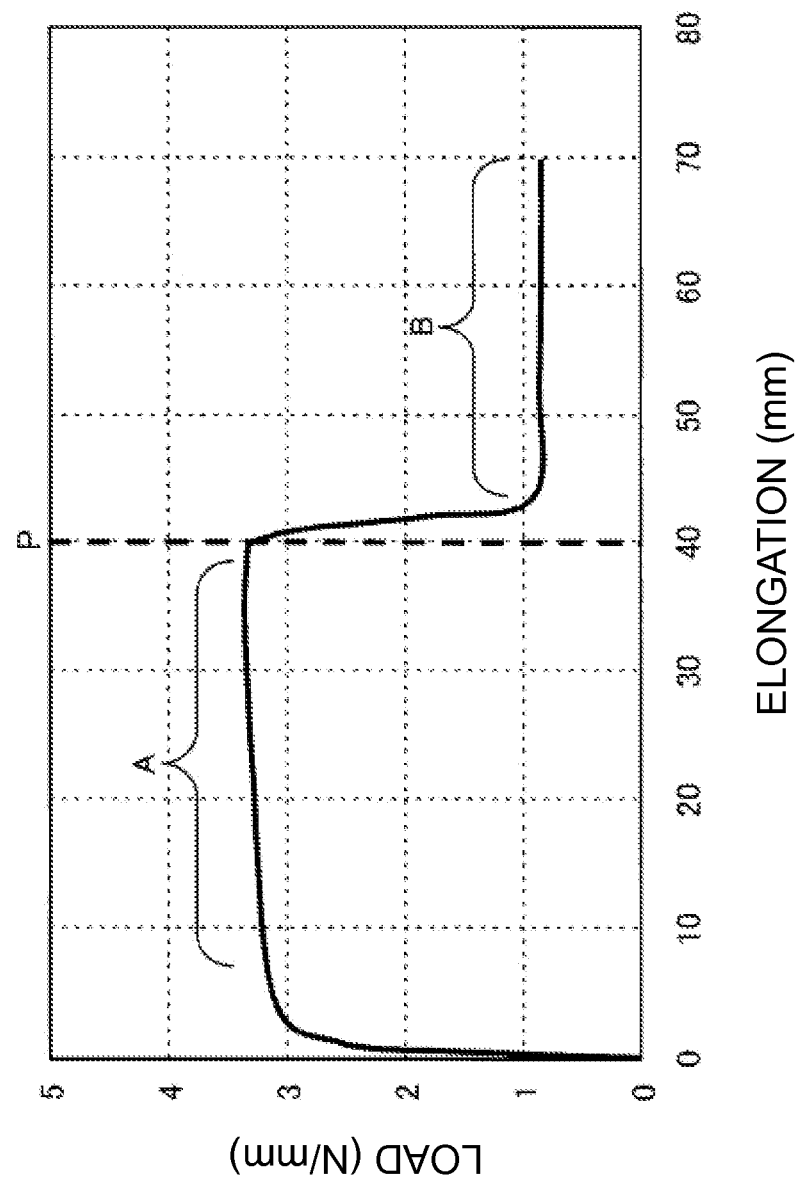
FIG. 4 is a graph showing the measured results of the surface separating/breaking strength of a polyester film of Example 1.

FIG. 4 shows the result obtained by measuring the polyester film of Example 1.

Figure 3:
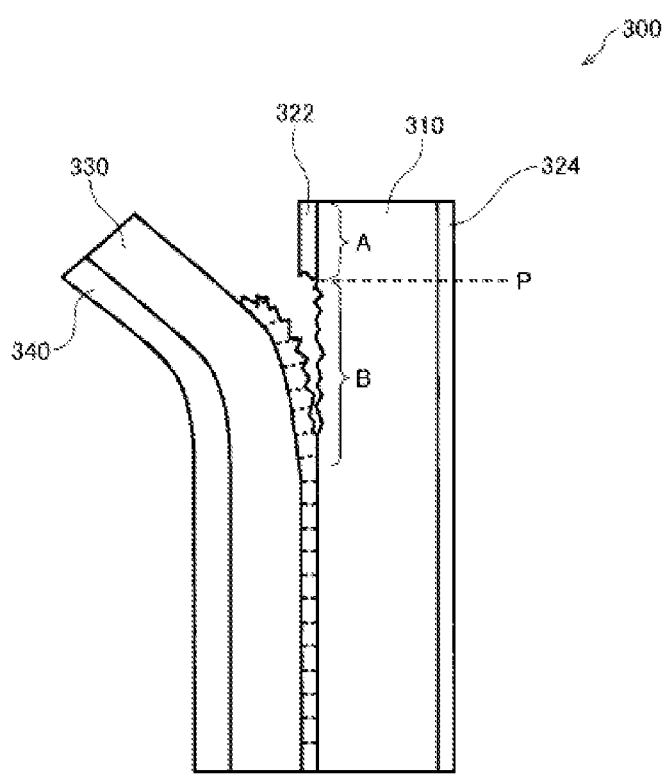
FIG. 3 is a view for schematically illustrating a method of measuring a surface separating/breaking strength in examples and comparative examples.

FIG. 3 schematically shows how the EVA encapsulant and the PEN film are separated from each of the polyester films of examples and comparative examples. The polyester film shown in FIG. 3 is the polyester film of each of the examples and comparative examples, and has a polyester substrate 310, a polymer layer 322 as a layered portion, and a weather-resistant layer (the first and second weather-resistant layers) 324.

As described above, cuts (dotted lines) are made in advance at a 5 mm pitch on the polymer layer 322 by using a cutter. The EVA encapsulant 330 is layered on the polymer layer 322, and a PEN film 340 is layered on the EVA encapsulant 330, thereby forming a layered body for measurement 300. Note that the paper for peeling layered (area indicated by A) between the polymer layer 322 and the EVA encapsulant 330 at an end portion of the polymer film is not shown in the stretching.

As shown in FIG. 3, the portion of the EVA encapsulant, in which the peeling paper is interposed between the EVA encapsulant 330 and the polymer layer 322, was bent, such that the EVA encapsulant 330 was separated from the polyester film. FIG. 4 shows the load required for separating the EVA encapsulant.

The area indicated by A in FIG. 3 is an area into which the peeling paper was inserted. Accordingly, separation could easily occur between the EVA encapsulant 330 and the polymer layer 322. In the point at which the peeling paper was absent (point P in FIGS. 3 and 4), the polymer layer 322 was broken, and separation occurred between the polymer layer 322 and the polyester substrate 310.

The breaking strength of the portion below the point P (area B shown in FIGS. 3 and 4) was measured as the breaking strength of the polyester substrate 310.

The results are shown in the column of "surface separating/breaking strength" of "physical properties of polyester substrate" in Table 3.

2. Evaluation of Solar Cell Module (Evaluation of Resistance to Separation Trouble)

The polyester films 1 to 38 of Examples 1 to 30 and Comparative Examples 1 to 8 were stuck to an EVA encapsulant, and a glass substrate was stuck to the EVA encapsulant. When these were stuck to each other, a peeling paper was interposed between the surface of the layered portion (polymer layer) of the polyester film and the EVA encapsulant, such that the polymer layer contacts with the EVA encapsulant, thereby obtaining a layered body for measurement.

Figure 5:
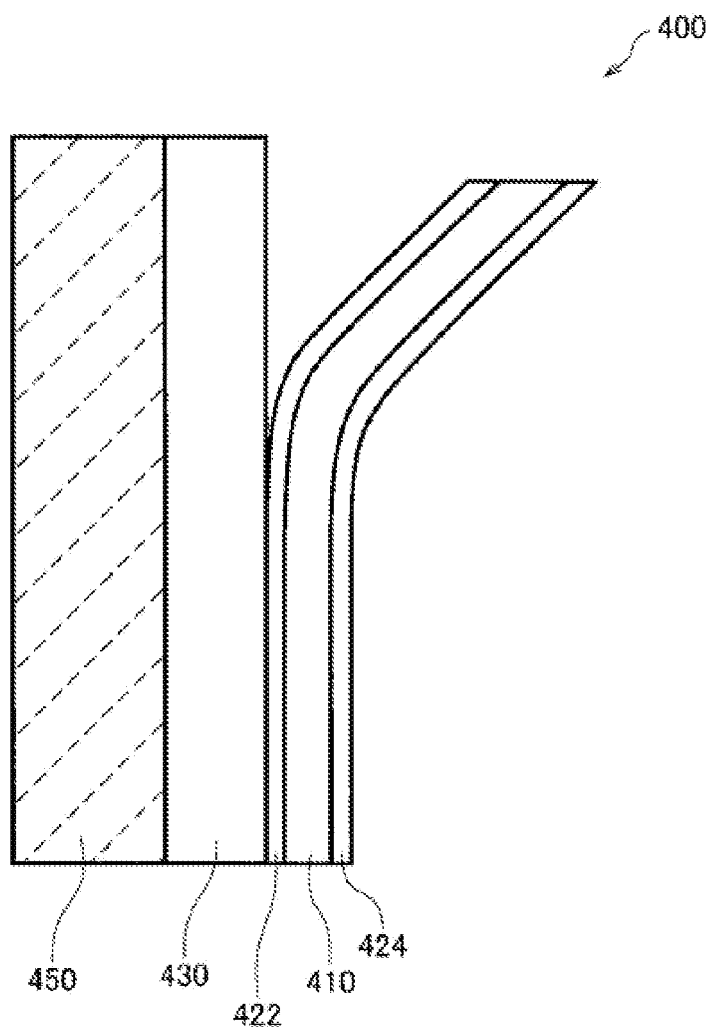
FIG. 5 is a view for schematically illustrating a method of evaluating solar cell modules (evaluating the resistance of the solar cell modules against separation trouble) in examples and comparative examples.

FIG. 5 schematically shows how separation occurs in a layered body for measurement 400 used for evaluating resistance to separation trouble.

FIG. 5 schematically shows how the polyester film of each of the examples and comparative examples is separated from the EVA encapsulant 430 layered on a glass substrate 450. The polyester film shown in FIG. 5 is the polyester film of each of examples and comparative examples as in FIG. 3, and has a polyester substrate 410, a polymer layer 422 as a layered portion, and a weather-resistant layer (first and second weather-resistant layers) 424.

As described above, cuts (dotted lines) are made in advance at a 5 mm pitch on the polymer layer 422 by using a cutter. The EVA encapsulant 430 is layered on the polymer layer 422, and the glass substrate 450 is layered on the EVA encapsulant 430, thereby forming a layered body for measurement 400.

Note that the peeling paper layered between the polymer layer 422 and the EVA encapsulant 430 at an end portion of the layered body is not shown in the stretching.

Thereafter, as shown in FIG. 5, the polyester film side was bent such that separation started between the EVA encapsulant 430 and the polymer layer 422, and the load required for separation that occurred from the point (P), at which the peeling paper was absent, was measured.

The results are shown in the column of "resistance to separation trouble" of "evaluation of solar cell module" in Tables 4 and 5.

With respect to the measurement, evaluation results obtained by leaving the layered body for measurement in an environment of 23° C. and 50% RH for 24 hours and then performing the measurement are provided in a "room temperature/normal humidity environment". Moreover, evaluation results obtained by leaving the layered body for measurement in an environment of 120° C. and 100% RH for 60 hours and then performing the measurement are provided in a "humid and hot environment".

The evaluation criteria are as follows.

—Evaluation Criteria—

AA: the resistance of the polyester film to separation trouble is extremely excellent.

(The incidence rate of interface separation is less than 10%)

A: the resistance of the polyester film to separation trouble is excellent.

(The incidence rate of interface separation is from 10% to less than 50%)

B: the resistance of the polyester film to separation trouble is unproblematic.

(The incidence rate of interface separation is from 50% to less than 70%)

C: the resistance of the polyester film to separation trouble is insufficient.

(The incidence rate of interface separation is 70% or higher)

The incidence rate of interface separation is a value calculated from the number of times of incidence of separation caused by breaking of the substrate film interface when ten layered bodies for measurement were evaluated as above.

The overall decision of the evaluation is also described in Tables 4 and 5.

In order to make the overall decision, the incidence rate of interface separation was calculated from interface separation test results obtained from twenty layered bodies for measurement in total, which includes ten layered bodies for measurement which were left in the room temperature/normal humidity environment and ten layered bodies for measurement which were left in the humid and hot environment, and the results were evaluated based on the evaluation criteria.

TABLE 2

| | | | | | Film formation condition for polyester substrate | | | | | |
|---|---|---|---|---|---|---|---|---|---|---|
| | | | | | | | | | Horizontal stretching step | |
| | | | | | Film formation step Thickness of | Vertical stretching step | | Stretching portion | | Thermal fixing portion |
| | | Raw material polyester | | | unstretched | Temper- | Stretch | Stretch | Temper- | Temper- |
| | Layer structure | Type | IV [dL/g] | Tg [° C.] | Additive | polyester film [mm] | ature [° C.] | ratio [fold] | ratio [fold] | ature [° C.] | ature [° C.] |
| Ex. 1 | Single layer | PET1 | 0.79 | 73 | None | 3.4 | 90 | 3.5 | 4.4 | 120 | 205 |
| Ex. 2 | Single layer | PET1 | 0.79 | 73 | None | 3.0 | 95 | 3.1 | 4.2 | 155 | 220 |
| Ex. 3 | Single layer | PET1 | 0.79 | 73 | None | 4.0 | 83 | 3.7 | 4.6 | 95 | 185 |
| Ex. 4 | Single layer | PET1 | 0.79 | 73 | None | 3.4 | 90 | 3.5 | 4.4 | 120 | 205 |
| Ex. 5 | Single layer | PET1 | 0.79 | 73 | None | 3.4 | 90 | 3.5 | 4.4 | 120 | 205 |
| Ex. 6 | Single layer | PET1 | 0.79 | 73 | None | 3.4 | 90 | 3.5 | 4.4 | 120 | 205 |
| Ex. 7 | Single layer | PET1 | 0.79 | 73 | None | 3.4 | 90 | 3.5 | 4.4 | 120 | 205 |
| Ex. 8 | Single layer | PET1 | 0.79 | 73 | None | 3.4 | 90 | 3.5 | 4.4 | 120 | 205 |
| Ex. 9 | Single layer | PET1 | 0.79 | 73 | None | 3.4 | 90 | 3.5 | 4.4 | 120 | 205 |
| Ex. 10 | Single layer | PET2 | 0.70 | 73 | None | 3.4 | 90 | 3.5 | 4.4 | 120 | 205 |
| Ex. 11 | Single layer | PET3 | 0.92 | 73 | None | 3.4 | 90 | 3.5 | 4.4 | 120 | 205 |
| Ex. 12 | Single layer | PET1 | 0.79 | 73 | None | 3.4 | 90 | 3.5 | 4.4 | 120 | 205 |
| Ex. 13 | Single layer | PET1 | 0.79 | 73 | None | 3.4 | 90 | 3.5 | 4.4 | 120 | 205 |
| Ex. 14 | Single layer | PET1 | 0.79 | 73 | None | 3.4 | 90 | 3.5 | 4.4 | 120 | 205 |
| Ex. 15 | Single layer | PET1 | 0.79 | 73 | None | 3.4 | 90 | 3.5 | 4.4 | 120 | 205 |
| Ex. 16 | Single layer | PET1 | 0.79 | 73 | None | 3.4 | 90 | 3.5 | 4.4 | 120 | 205 |
| Ex. 17 | Single layer | PET1 | 0.79 | 72 | Present | 3.4 | 88 | 3.5 | 4.4 | 120 | 205 |
| Ex. 18 | Single layer | PET1 | 0.79 | 72 | Present | 3.4 | 88 | 3.5 | 4.4 | 120 | 205 |
| Ex. 19 | Single layer | PET2 | 0.70 | 72 | Present | 3.4 | 88 | 3.5 | 4.4 | 120 | 205 |
| Ex. 20 | Single layer | CHDM1 | 0.75 | 74 | None | 3.4 | 90 | 3.5 | 4.4 | 120 | 210 |
| Ex. 21 | Single layer | CHDM1 | 0.77 | 75 | None | 3.4 | 90 | 3.5 | 4.4 | 120 | 210 |

| | Film formation condition for polyester substrate | | | Physical properties of polyester substrate | | | | | |
|---|---|---|---|---|---|---|---|---|---|
| | Horizontal stretching step Thermal relaxation portion | | | Product of Vertical stretch ratio and Horizontal stretch ratio [fold] | | | | Haze | |
| | | | | | | | | Haze of 10 μm of surface specific layer of substrate [%] | Haze of Entire thickness [%] | Specific IR intensity ratio |
| | Temper- ature [° C.] | Relaxation ratio MD [%] | TD [%] | | Type | Thickness [μm] | IV [dL/g] | | | |
| Ex. 1 | 200 | 3 | 8 | 15.4 | B1 | 250 | 0.72 | 0.4 | 2.7 | 0.022 |
| Ex. 2 | 217 | 5 | 12 | 13.0 | B2 | 250 | 0.72 | 0.6 | 2.5 | 0.038 |

TABLE 2-continued

|        |     |   |   |      |    |     |      |     |     |       |
|--------|-----|---|---|------|----|-----|------|-----|-----|-------|
| Ex. 3  | 180 | 1 | 5 | 17.0 | B3 | 250 | 0.72 | 0.6 | 1.3 | 0.012 |
| Ex. 4  | 200 | 3 | 8 | 15.4 | B1 | 250 | 0.72 | 0.4 | 2.7 | 0.022 |
| Ex. 5  | 200 | 3 | 8 | 15.4 | B1 | 250 | 0.72 | 0.4 | 2.7 | 0.022 |
| Ex. 6  | 200 | 3 | 8 | 15.4 | B1 | 250 | 0.72 | 0.4 | 2.7 | 0.022 |
| Ex. 7  | 200 | 3 | 8 | 15.4 | B1 | 250 | 0.72 | 0.4 | 2.7 | 0.022 |
| Ex. 8  | 200 | 3 | 8 | 15.4 | B1 | 250 | 0.72 | 0.4 | 2.7 | 0.022 |
| Ex. 9  | 200 | 3 | 8 | 15.4 | B1 | 250 | 0.72 | 0.4 | 2.7 | 0.022 |
| Ex. 10 | 200 | 3 | 8 | 15.4 | B4 | 250 | 0.62 | 0.7 | 3.2 | 0.025 |
| Ex. 11 | 200 | 3 | 8 | 15.4 | B5 | 250 | 0.86 | 0.2 | 1.8 | 0.019 |
| Ex. 12 | 200 | 3 | 8 | 15.4 | B1 | 250 | 0.72 | 0.4 | 2.7 | 0.022 |
| Ex. 13 | 200 | 3 | 8 | 15.4 | B1 | 250 | 0.72 | 0.4 | 2.7 | 0.022 |
| Ex. 14 | 200 | 3 | 8 | 15.4 | B1 | 250 | 0.72 | 0.4 | 2.7 | 0.022 |
| Ex. 15 | 200 | 3 | 8 | 15.4 | B1 | 250 | 0.72 | 0.4 | 2.7 | 0.022 |
| Ex. 16 | 200 | 3 | 8 | 15.4 | B1 | 250 | 0.72 | 0.4 | 2.7 | 0.022 |
| Ex. 17 | 200 | 3 | 8 | 15.4 | B6 | 250 | 0.78 | 0.3 | 3.2 | 0.021 |
| Ex. 18 | 200 | 3 | 8 | 15.4 | B7 | 250 | 0.77 | 0.3 | 3.2 | 0.021 |
| Ex. 19 | 200 | 3 | 8 | 15.4 | B8 | 250 | 0.60 | 0.3 | 3.2 | 0.024 |
| Ex. 20 | 205 | 5 | 5 | 15.4 | B8 | 250 | 0.71 | 0.5 | 2.8 | 0.02  |
| Ex. 21 | 205 | 5 | 5 | 15.4 | B9 | 250 | 0.74 | 0.5 | 2.8 | 0.02  |

TABLE 3

| | Layer structure (ratio among thickness of layers: outer layer/inner layer/outer layer) | Film formation condition for polyester substrate | | | | | | | | |
|---|---|---|---|---|---|---|---|---|---|---|
| | | Raw material polyester | | | | Film formation step Thickness of unstretched polyester film [mm] | Vertical stretching step | | Horizontal stretching step | |
| | | | | | | | | | Stretching portion | Thermal fixing portion |
| | | Type | IV [dL/g] | Tg [° C.] | Additive | | Temp. [° C.] | Stretch ratio [fold] | Stretch ratio [fold] / Temp. [° C.] | Temp. [° C.] |
| Ex. 22 | Single layer | CHDM3 | 0.83 | 76 | None | 3.4 | 90 | 3.5 | 4.4 / 120 | 210 |
| Ex. 23 | Single layer | CHDM4 | 0.80 | 75 | None | 3.4 | 90 | 3.5 | 4.4 / 120 | 210 |
| Ex. 24 | Three layers (1.5/7/1.5) | CHDM5/PET1/CHDM5 | 0.82/0.79/0.82 | 76/73/76 | None | 3.4 | 100 | 3.5 | 4.4 / 130 | 210 |
| Ex. 25 | Three layers (1.5/7/1.5) | CHDM6/PET1/CHDM6 | 0.88/0.79/0.88 | 76/73/76 | None | 3.4 | 100 | 3.5 | 4.4 / 130 | 210 |
| Ex. 26 | Three layers (1.5/7/1.5) | CHDM7/PET1/CHDM7 | 1.02/0.79/1.02 | 78/73/78 | None | 3.4 | 100 | 3.5 | 4.4 / 130 | 210 |
| Ex. 27 | Three layers (1.5/7/1.5) | CHDM8/PET1/CHDM8 | 0.95/0.79/0.95 | 77/73/77 | None | 3.4 | 100 | 3.5 | 4.4 / 130 | 210 |
| Ex. 28 | Single layer | PET1 | 0.79 | 73 | None | 3.4 | 90 | 3.5 | 4.4 / 120 | 205 |
| Ex. 29 | Single layer | PET1 | 0.79 | 73 | None | 3.4 | 90 | 3.5 | 4.4 / 120 | 205 |
| Ex. 30 | Single layer | PET1 | 0.79 | 73 | None | 3.4 | 90 | 3.5 | 4.4 / 120 | 205 |
| Comp. Ex. 1 | Single layer | PET1 | 0.79 | 73 | None | 4.5 | 77 | 4.1 | 4.7 / 91 | 158 |
| Comp. Ex. 2 | Single layer | PET1 | 0.79 | 73 | None | 2.7 | 104 | 2.9 | 4.0 / 165 | 233 |
| Comp. Ex. 3 | Single layer | PET1 | 0.79 | 73 | None | 3.4 | 90 | 3.5 | 4.4 / 120 | 205 |
| Comp. Ex. 4 | Single layer | PET1 | 0.79 | 73 | None | 3.4 | 90 | 3.5 | 4.4 / 120 | 205 |
| Comp. Ex. 5 | Single layer | PET1 | 0.79 | 73 | None | 3.4 | 90 | 3.5 | 4.4 / 120 | 205 |
| Comp. Ex. 6 | Single layer | PET1 | 0.79 | 73 | None | 3.4 | 90 | 3.5 | 4.4 / 120 | 205 |
| Comp. Ex. 7 | Three layers (1.5/7/1.5) | CHDM6/PET1/CHDM6 | 0.88/0.79/0.88 | 76/73/76 | None | 2.7 | 106 | 2.9 | 4.0 / 168 | 234 |
| Comp. Ex. 8 | Three layers (1.5/7/1.5) | CHDM6/PET1/CHDM6 | 0.88/0.79/0.88 | 76/73/76 | None | 3.4 | 100 | 3.5 | 4.4 / 130 | 210 |

TABLE 3-continued

| | Film formation condition for polyester substrate | | | | Physical properties of polyester substrate | | | | | |
|---|---|---|---|---|---|---|---|---|---|---|
| | Horizontal stretching step Thermal relaxation portion | | | Product of Vertical stretch ratio and Horizontal stretch ratio [fold] | | Thickness | IV | Haze | | Specific IR intensity ratio |
| | Temp. [° C.] | Relaxation ratio MD [%] | TD [%] | | Type | [μm] | [dL/g] | Haze of 10 μm of surface layer of substrate [%] | Haze of Entire thickness [%] | |
| Ex. 22 | 205 | 5 | 5 | 15.4 | B10 | 250 | 0.79 | 0.6 | 2.2 | 0.02 |
| Ex. 23 | 205 | 5 | 5 | 15.4 | B11 | 250 | 0.77 | 0.6 | 2.6 | 0.021 |
| Ex. 24 | 205 | 5 | 5 | 15.4 | B12 | 250 | 0.79/0.77/0.79 | 0.6 | 3.1 | 0.023 |
| Ex. 25 | 205 | 5 | 5 | 15.4 | B13 | 250 | 0.85/0.77/0.85 | 0.6 | 3.1 | 0.022 |
| Ex. 26 | 205 | 5 | 5 | 15.4 | B14 | 250 | 1.01/0.77/1.01 | 0.6 | 2.7 | 0.02 |
| Ex. 27 | 205 | 5 | 5 | 15.4 | B15 | 250 | 0.93/0.77/0.93 | 0.6 | 2.7 | 0.021 |
| Ex. 28 | 200 | 3 | 8 | 15.4 | B16 | 250 | 0.72 | 0.5 | 5.8 | 0.022 |
| Ex. 29 | 200 | 3 | 8 | 15.4 | B17 | 250 | 0.72 | 0.5 | 1.6 | 0.022 |
| Ex. 30 | 200 | 3 | 8 | 15.4 | B18 | 250 | 0.72 | 0.3 | 2.8 | 0.02 |
| Comp. Ex. 1 | 155 | 0 | 3 | 19.3 | B101 | 250 | 0.72 | 0.6 | 1.4 | 0007 |
| Comp. Ex. 2 | 228 | 5 | 12 | 11.6 | B102 | 250 | 0.72 | 0.6 | 1.4 | 0.044 |
| Comp. Ex. 3 | 200 | 3 | 8 | 15.4 | B1 | 250 | 0.72 | 0.6 | 1.4 | 0.022 |
| Comp. Ex. 4 | 200 | 3 | 8 | 15.4 | B1 | 250 | 0.72 | 0.6 | 1.4 | 0.022 |
| Comp. Ex. 5 | 200 | 3 | 8 | 15.4 | B1 | 250 | 0.72 | 0.6 | 1.4 | 0.022 |
| Comp. Ex. 6 | 200 | 3 | 8 | 15.4 | B1 | 250 | 0.72 | 0.6 | 1.4 | 0.022 |
| Comp. Ex. 7 | 229 | 5 | 12 | 11.3 | B103 | 250 | 0.85/0.77/0.85 | 0.6 | 1.4 | 0.047 |
| Comp. Ex. 8 | 205 | 5 | 5 | 15.4 | B13 | 250 | 0.85/0.77/0.85 | 0.6 | 1.4 | 0.022 |

TABLE 4

| | Physical properties of polyester substrate | | | | | | Polymer layer (layered portion) | | |
|---|---|---|---|---|---|---|---|---|---|
| | Type | IV (single layer or outer layer/inner layer/outer layer) [dL/g] | Haze 10 μm of surface layer of substrate [%] | Entire thickness [%] | Specific IR intensity ratio | Breaking strength at the time of surface separation [N/mm] | Formation method | Coating liquid | Elastic modulus [MPa] |
| Ex. 1 | B1 | 0.72 | 0.4 | 2.7 | 0.022 | 1.0 | Coating | S1 | 290 |
| Ex. 2 | B2 | 0.72 | 0.6 | 2.5 | 0.038 | 1.9 | Coating | S1 | 290 |
| Ex. 3 | B3 | 0.72 | 0.6 | 1.3 | 0.012 | 0.4 | Coating | S1 | 290 |
| Ex. 4 | B1 | 0.72 | 0.4 | 2.7 | 0.022 | 1.0 | Coating | S2 | 30 |
| Ex. 5 | B1 | 0.72 | 0.4 | 2.7 | 0.022 | 1.0 | Coating | S3 | 490 |
| Ex. 6 | B1 | 0.72 | 0.4 | 2.7 | 0.022 | 1.0 | Coating | S4 | 770 |
| Ex. 7 | B1 | 0.72 | 0.4 | 2.7 | 0.022 | 1.0 | Coating | S5 | 790 |
| Ex. 8 | B1 | 0.72 | 0.4 | 2.7 | 0.022 | 1.0 | Coating | S6 | 775 |
| Ex. 9 | B1 | 0.72 | 0.4 | 2.7 | 0.022 | 1.0 | Coating | S7 | 790 |
| Ex. 10 | B4 | 0.62 | 0.7 | 3.2 | 0.025 | 0.6 | Coating | S1 | 290 |
| Ex. 11 | B5 | 0.86 | 0.2 | 1.8 | 0.019 | 0.7 | Coating | S1 | 290 |
| Ex. 12 | B1 | 0.72 | 0.4 | 2.7 | 0.022 | 1.0 | Coating | S1 | 290 |
| Ex. 13 | B1 | 0.72 | 0.4 | 2.7 | 0.022 | 1.0 | Coating | S1 | 290 |
| Ex. 14 | B1 | 0.72 | 0.4 | 2.7 | 0.022 | 1.0 | Coating | S8 | 205 |
| Ex. 15 | B1 | 0.72 | 0.4 | 2.7 | 0.022 | 1.0 | Co-extrusion | — | 310 |
| Ex. 16 | B1 | 0.72 | 0.4 | 2.7 | 0.022 | 1.0 | Lamination | — | 260 |
| Ex. 17 | B6 | 0.78 | 0.3 | 3.2 | 0.021 | 1.1 | Coating | S1 | 290 |
| Ex. 18 | B7 | 0.77 | 0.3 | 3.2 | 0.021 | 1.1 | Coating | S1 | 290 |
| Ex. 19 | B8 | 0.60 | 0.3 | 3.2 | 0.024 | 0.8 | Coating | S1 | 290 |
| Ex. 20 | B8 | 0.71 | 0.5 | 2.8 | 0.02 | 0.9 | Coating | S1 | 290 |
| Ex. 21 | B9 | 0.74 | 0.5 | 2.8 | 0.02 | 0.9 | Coating | S1 | 290 |

TABLE 4-continued

| | Polymer layer (layered portion) | | | | Evaluation of solar cell module | | |
| | | | | | Resistance to separation trouble | | |
| | | Binder | | Coloring pigment | In room temperature/ | | |
| | Thickness [μm] | Type | Elastic modulus [MPa] | Type | Amount [% by volume] | normal humidity environment | In humid and hot environment | Overall decision |
|---|---|---|---|---|---|---|---|---|
| Ex. 1 | 7 | Olefin-based | 60 | TiO$_2$ | 20 | AA | AA | AA |
| Ex. 2 | 7 | Olefin-based | 60 | TiO$_2$ | 20 | AA | A | AA |
| Ex. 3 | 7 | Olefin-based | 60 | TiO$_2$ | 20 | A | A | A |
| Ex. 4 | 8 | Urethane-based | 10 | TiO$_2$ | 6 | A | B | B |
| Ex. 5 | 8 | Olefin-based | 140 | TiO$_2$ | 17 | A | A | A |
| Ex. 6 | 8 | Olefin-based | 315 | TiO$_2$ | 16 | B | A | A |
| Ex. 7 | 8 | Acryl-based | 335 | TiO$_2$ | 14 | B | B | B |
| Ex. 8 | 8 | Olefin-based | 60 | TiO$_2$ | 40 | A | A | A |
| Ex. 9 | 8 | Olefin-based | 30 | TiO$_2$ | 52 | B | B | B |
| Ex. 10 | 7 | Olefin-based | 60 | TiO$_2$ | 20 | A | A | A |
| Ex. 11 | 7 | Olefin-based | 60 | TiO$_2$ | 20 | A | A | A |
| Ex. 12 | 25 | Olefin-based | 60 | TiO$_2$ | 20 | A | B | A |
| Ex. 13 | 35 | Olefin-based | 60 | TiO$_2$ | 20 | B | B | B |
| Ex. 14 | 8 | Olefin-based | 60 | Carbon black | 10 | AA | AA | AA |
| Ex. 15 | 15 | Olefin-based | 60 | TiO$_2$ | 17 | A | A | A |
| Ex. 16 | 15 | Olefin-based | 60 | TiO$_2$ | 16 | A | A | A |
| Ex. 17 | 7 | Olefin-based | 60 | TiO$_2$ | 16 | A | AA | A |
| Ex. 18 | 7 | Olefin-based | 60 | TiO$_2$ | 16 | A | AA | A |
| Ex. 19 | 7 | Olefin-based | 60 | TiO$_2$ | 16 | A | AA | A |
| Ex. 20 | 7 | Olefin-based | 60 | TiO$_2$ | 16 | A | A | A |
| Ex. 21 | 7 | Olefin-based | 60 | TiO$_2$ | 16 | A | A | A |

TABLE 5

| | Physical properties of polyester substrate | | | | | | | |
| | | IV (single layer or outer layer/inner layer/outer layer) [dL/g] | Haze | | Specific IR intensity ratio | Breaking strength at the time of surface separation [N/mm] | Polymer layer (layered portion) | | |
| | Type | | 10 μm of surface layer of substrate [%] | Entire thickness [%] | | | Formation method | Coating liquid | Elastic modulus [MPa] |
|---|---|---|---|---|---|---|---|---|---|
| Ex. 22 | B10 | 0.79 | 0.6 | 2.2 | 0.02 | 1.1 | Coating | S1 | 290 |
| Ex. 23 | B11 | 0.77 | 0.6 | 2.6 | 0.021 | 1.1 | Coating | S1 | 290 |
| Ex. 24 | B12 | 0.79/0.77/0.79 | 0.6 | 3.1 | 0.023 | 1.3 | Coating | S1 | 290 |
| Ex. 25 | B13 | 0.85/0.77/0.85 | 0.6 | 3.1 | 0.022 | 1.1 | Coating | S1 | 290 |
| Ex. 26 | B14 | 1.01/0.77/1.01 | 0.6 | 2.7 | 0.02 | 1.0 | Coating | S1 | 290 |
| Ex. 27 | B15 | 0.93/0.77/0.93 | 0.6 | 2.7 | 0.021 | 0.9 | Coating | S1 | 290 |
| Ex. 28 | B16 | 0.72 | 0.5 | 5.8 | 0.022 | 1.2 | Coating | S1 | 290 |
| Ex. 29 | B17 | 0.72 | 0.5 | 1.6 | 0.022 | 1.2 | Coating | S1 | 290 |
| Ex. 30 | B18 | 0.72 | 0.3 | 2.8 | 0.022 | 1.3 | Coating | S1 | 290 |
| Comp. Ex. 1 | B101 | 0.72 | 0.6 | 1.4 | 0.007 | 0.2 | Coating | S1 | 290 |
| Comp. Ex. 2 | B102 | 0.72 | 0.6 | 1.4 | 0.044 | 2.2 | Coating | S1 | 290 |
| Comp. Ex. 3 | B1 | 0.72 | 0.6 | 1.4 | 0.022 | 1.0 | Coating | S101 | 820 |
| Comp. Ex. 4 | B1 | 0.72 | 0.6 | 1.4 | 0.022 | 1.0 | Coating | S102 | 860 |
| Comp. Ex. 5 | B1 | 0.72 | 0.6 | 1.4 | 0.022 | 1.0 | Coating | S103 | 2125 |
| Comp. Ex. 6 | B1 | 0.72 | 0.6 | 1.4 | 0.022 | 1.0 | Coating | S104 | 2580 |
| Comp. Ex. 7 | B103 | 0.85/0.77/0.85 | 0.6 | 1.4 | 0.047 | 2.3 | Coating | S1 | 290 |
| Comp. Ex. 8 | B13 | 0.85/0.77/0.85 | 0.6 | 1.4 | 0.022 | 1.0 | Coating | S104 | 2580 |

TABLE 5-continued

|  | Polymer layer (layered portion) | | | | | Evaluation of solar cell module | | |
|---|---|---|---|---|---|---|---|---|
|  | | Binder | | | | Resistance to separation trouble | | |
|  | Thickness [μm] | Type | Elastic modulus [MPa] | Coloring pigment Type | Amount | In room temperature/ normal humidity | In humid and hot environment | Overall decision |
| Ex. 22 | 7 | Olefin-based | 60 | TiO$_2$ | 16 | A | AA | A |
| Ex. 23 | 7 | Olefin-based | 60 | TiO$_2$ | 16 | A | A | A |
| Ex. 24 | 7 | Olefin-based | 60 | TiO$_2$ | 16 | A | A | A |
| Ex. 25 | 7 | Olefin-based | 60 | TiO$_2$ | 16 | A | AA | A |
| Ex. 26 | 7 | Olefin-based | 60 | TiO$_2$ | 16 | A | AA | A |
| Ex. 27 | 7 | Olefin-based | 60 | TiO$_2$ | 16 | A | AA | A |
| Ex. 28 | 7 | Olefin-based | 60 | TiO$_2$ | 20 | AA | AA | AA |
| Ex. 29 | 7 | Olefin-based | 60 | TiO$_2$ | 20 | AA | AA | AA |
| Ex. 30 | 7 | Olefin-based | 60 | TiO$_2$ | 20 | AA | AA | AA |
| Comp. Ex. 1 | 7 | Olefin-based | 60 | TiO$_2$ | 20 | C | C | C |
| Comp. Ex. 2 | 7 | Olefin-based | 60 | TiO$_2$ | 20 | AA | C | C |
| Comp. Ex. 3 | 8 | Olefin-based | 60 | TiO$_2$ | 56 | C | C | C |
| Comp. Ex. 4 | 20 | Olefin-based | 315 | TiO$_2$ | 25 | C | C | C |
| Comp. Ex. 5 | 20 | Vinyl chloride-based | 2125 | None | 0 | C | C | C |
| Comp. Ex. 6 | 20 | Polyester-based | 2580 | None | 0 | C | C | C |
| Comp. Ex. 7 | 7 | Olefin-based | 60 | TiO$_2$ | 20 | AA | C | C |
| Comp. Ex. 8 | 20 | Polyester-based | 2580 | None | 0 | C | C | C |

From Tables 4 and 5, it was understood that the polyester films produced in examples exhibit excellent weather resistance and are extremely suitable as a back sheet for a solar cell.

Examples 31 to 60

Production of Back Sheet for Solar Cell and Solar Cell Power Generation Module The biaxially stretched polyester films 1 to 30 of Examples 1 to 30 that were produced as above were used as back sheets 1 to 30, and stuck to a transparent filler (encapsulant) so as to form the structure described in FIG. 1 of JP-A No. 2009-158952, thereby producing solar cell power generation modules 1 to 30. At this time, the back sheet was stuck to the transparent filler such that the layered portion of the back sheet contacted the transparent filler that enclosed a solar cell element.

Since the back sheets 1 to 30 were produced using the polyester films of Examples 1 to 30 having excellent hydrolysis resistance and dimensional stability, the weather resistance of the back sheets was excellent. Moreover, since the solar cell power generation modules 1 to 30 of Examples 31 to 60 included the back sheets 1 to 30, stabilized power generation performance could be obtained over a long time.

The entire disclosure of Japanese Patent Application Nos. 2012-077648, 2012-209848, and 2013-062701 are incorporated in the present specification as reference.

All of the documents, patents, patent applications, and technical standards described in the present specification are incorporated herein as reference, as if each of the documents, patents, patent applications, and technical standards is specifically and independently described and incorporated herein as reference.

What is claimed is:

1. A polyester film comprising:
   a polyester substrate; and
   a layered portion that is disposed on at least one surface of the polyester substrate and has an elastic modulus of from 5 MPa to 800 MPa,
   a ratio of a peak intensity at 988 cm$^{-1}$ that is observed by subjecting a surface of the polyester substrate to infrared spectroscopy to a peak intensity at 1410 cm$^{-1}$ that is observed by subjecting a surface of the polyester substrate to infrared spectroscopy satisfying the following Inequality (I):

$$0.010 \leq \text{(peak intensity at 988 cm}^{-1})/\text{(peak intensity at 1410 cm}^{-1}) \leq 0.040 \quad (I).$$

2. The polyester film according to claim 1, wherein a haze of a region ranging from a surface of the polyester substrate to a point at a distance of 10 μm in the thickness direction of the polyester substrate is 0.5% or less, and a haze of an entire thickness of the polyester substrate is from 1.5% to 6%.

3. The polyester film according to claim 1, wherein an intrinsic viscosity of the polyester substrate is from 0.65 dL/g to 1.05 dL/g.

4. The polyester film according to claim 1, wherein an intrinsic viscosity of the polyester substrate is from 0.65 dL/g to 0.85 dL/g.

5. The polyester film according to claim 1, wherein the layered portion contains a binder that has an elastic modulus of from 5 MPa to 320 MPa.

6. The polyester film according to claim 1, wherein the layered portion includes a layer containing an olefin-based binder.

7. The polyester film according to claim 1, wherein the layered portion contains a colored layer containing a coloring pigment.

8. The polyester film according to claim 7, wherein a volume fraction of the coloring pigment relative to a total volume of the layered portion is 50% by volume or less.

9. The polyester film according to claim 7, wherein the coloring pigment is titanium oxide.

10. The polyester film according to claim 7, wherein the coloring pigment is a carbon black.

11. The polyester film according to claim 1, wherein the thickness of the layered portion is 30 µm or less.

12. The polyester film according to claim 1, wherein the layered portion is formed by coating the surface of the polyester substrate with a composition comprising components that form the layered portion.

13. The polyester film according to claim 1, wherein the polyester substrate is formed of a composition that comprises:
   a polyester raw material that has an intrinsic viscosity of from 0.50 dL/g to 0.90 dL/g; and
   a compound that comprises one carbodiimide group and has a cyclic structure in which a first nitrogen and a second nitrogen of the carbodiimide group are bonded to each other through a bonding group, in an amount of from 0.05% by mass to 20% by mass with respect to a mass of the polyester raw material.

14. The polyester film according to claim 1, wherein the polyester substrate has a layer comprising a cyclohexanedimethanol-based polyester that comprises a structure derived from 1,4-cyclohexanedimethanol, in an amount of from 0.1 mol % to 20 mol % or in an amount of from 80 mol % to 100 mol % with respect to a total amount of a diol component of the cyclohexanedimethanol-based polyester.

15. A back sheet for a solar cell, the back sheet comprising the polyester film according to claim 1.

16. A solar cell module, comprising:
   a front board that is transparent and at which sunlight is incident;
   a cell structure portion that is disposed at one side of the front board and comprises a solar cell element and an encapsulant that encapsulates the solar cell element; and
   the back sheet for a solar cell according to claim 15, which is disposed at a side of the cell structure portion opposite to the side at which the front board is positioned, and which contacts with the encapsulant.

* * * * *